(12) United States Patent
Okubo et al.

(10) Patent No.: US 9,882,072 B2
(45) Date of Patent: Jan. 30, 2018

(54) SOLAR CELL AND TRANSPARENT ELECTRODE

(71) Applicant: Konica Minolta, Inc., Chiyoda-ku, Tokyo (JP)

(72) Inventors: Yasushi Okubo, Hino (JP); Hiroaki Itoh, Hachioji (JP); Ayako Wachi, Hino (JP); Hidekane Ozeki, Hachioji (JP); Kazuhiro Yoshida, Tachikawa (JP); Takeshi Hakii, Sagamihara (JP)

(73) Assignee: KONICA MINOLTA, INC., Tokyo (JP)

( * ) Notice: Subject to any disclaimer, the term of this patent is extended or adjusted under 35 U.S.C. 154(b) by 138 days.

(21) Appl. No.: 14/426,577

(22) PCT Filed: Sep. 4, 2013

(86) PCT No.: PCT/JP2013/073745
§ 371 (c)(1),
(2) Date: Mar. 6, 2015

(87) PCT Pub. No.: WO2014/038567
PCT Pub. Date: Mar. 13, 2014

(65) Prior Publication Data
US 2015/0221793 A1    Aug. 6, 2015

(30) Foreign Application Priority Data
Sep. 7, 2012   (JP) .................................. 2012-197348

(51) Int. Cl.
*H01L 31/00*    (2006.01)
*H01L 31/0224*  (2006.01)
(Continued)

(52) U.S. Cl.
CPC ................ *H01L 31/022466* (2013.01); *H01L 31/02168* (2013.01); *H01L 31/022491* (2013.01);
(Continued)

(58) Field of Classification Search
None
See application file for complete search history.

(56) References Cited

U.S. PATENT DOCUMENTS

| 2009/0209693 A1 | 8/2009 | Suganuma et al. |
| 2010/0137538 A1 | 6/2010 | Ye et al. |

(Continued)

FOREIGN PATENT DOCUMENTS

| JP | 2004296749 A | 10/2004 |
| JP | 2004296749 A | 12/2004 |

(Continued)

OTHER PUBLICATIONS

Japanese Notice of Reason for Rejection corresponding to Patent Application No. 2014-534376; Date of Mailing Sep. 20, 2016, with English translation.

(Continued)

*Primary Examiner* — Eli Mekhlin
(74) *Attorney, Agent, or Firm* — Cantor Colburn LLP

(57) ABSTRACT

Provided is a solar cell including a pair of electrodes, and a photoelectric conversion layer of chalcopyrite structure sandwiched between the pair of electrodes. At least one of the pair of electrodes, adapted to serve as a transparent electrode, has a nitrogen-containing layer composed with the use of an organic compound containing a nitrogen atom, and an electrode layer containing a metal of the Group 11 of the periodic table, which is provided to be laminated on the nitrogen-containing layer, thereby improving the photoelectric conversion efficiency.

19 Claims, 5 Drawing Sheets

(51) Int. Cl.
    *H01L 31/0749*     (2012.01)
    *H01L 31/18*     (2006.01)
    *H01L 31/0216*     (2014.01)
    *H01L 31/0392*     (2006.01)
    *H01L 51/44*     (2006.01)
    *H01L 51/00*     (2006.01)

(52) U.S. Cl.
    CPC .... *H01L 31/03923* (2013.01); *H01L 31/0749* (2013.01); *H01L 31/1884* (2013.01); *H01L 51/442* (2013.01); *H01L 51/0067* (2013.01); *H01L 51/0072* (2013.01); *Y02E 10/541* (2013.01); *Y02E 10/549* (2013.01)

(56) References Cited

U.S. PATENT DOCUMENTS

2011/0057920 A1* 3/2011 Matsuura ............ H01L 27/3258 345/211
2011/0098284 A1 4/2011 Babul
2012/0168693 A1 7/2012 Iijima et al.

FOREIGN PATENT DOCUMENTS

| | | |
|---|---|---|
| JP | 4452841 B2 | 4/2010 |
| JP | 2010135708 A | 6/2010 |
| JP | 2010177497 A | 8/2010 |
| JP | 2011061124 A | 3/2011 |
| JP | 2011077028 A | 4/2011 |
| JP | 2011084814 A | 4/2011 |
| JP | 2012018959 A | 1/2012 |
| JP | 2012510541 A | 5/2012 |
| WO | 2006116626 A2 | 11/2006 |
| WO | 2010090123 A1 | 8/2010 |
| WO | WO 2010090123 A1 * | 8/2010 ........... C08G 61/126 |

OTHER PUBLICATIONS

International Search Report corresponding to Application No. PCT/JP2013/073745; Date of Mailing: Oct. 22, 2013, with English translation.
Written Opinion of the International Searching Authority corresponding to International Application No. PCT/JP2013/073745; Date of Mailing: Oct. 22, 2013, with English translation.
S. Brett Walker et al., "Reactive Silver Inks for Patterning High-Conductivity Features at Mild Temperatures," Journal of the American Chemical Society; Jan. 5, 2012, 134, pp. 1419-1421.
Japanese Notice of Reasons for Rejection corresponding to Application No. 2014-534376; Date of Mailing: Dec. 20, 2016, with English translation.
JP Notice of Reasons for Rejection corresponding to Application No. 2017-067151; date of Nov. 2, 2017.

* cited by examiner

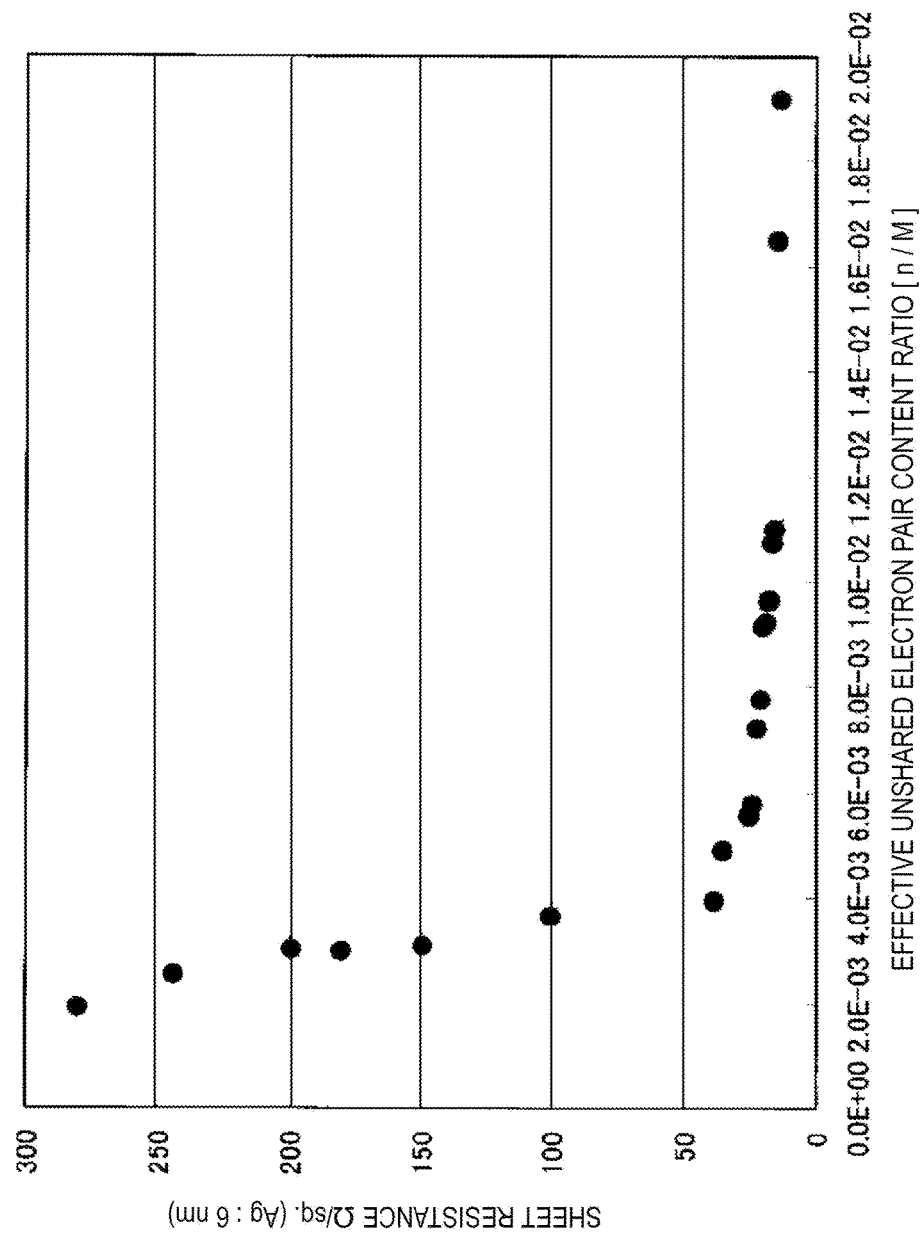

SOLAR CELL AND TRANSPARENT ELECTRODE

CROSS REFERENCE TO RELATED APPLICATIONS

This is the U.S. national stage of application No. PCT/JP2013/073745, filed on Sep. 4, 2013. Priority under 35 U.S.C. § 119 (a) and 35 U.S.C. § 365(b) is claimed from Japanese Application No. 2012-197348, filed Sep. 7, 2012, the disclosure of which is also incorporated herein by reference.

TECHNICAL FIELD

The present invention relates to a solar cell and a transparent electrode, and more particularly, to a solar cell that uses chalcopyrite for a photoelectric conversion layer, and a transparent electrode for use in the solar cell.

BACKGROUND ART

In recent years, building-integrated photovoltaics (Building-Integrated Photovoltaics: BIPV) systems have been attracting attention as inexpensive and convenient power generation systems which use renewable energy. For the achievement of such power generation systems, the development of light end flexible solar cell has been desired, and chalcopyrite-type solar cells have been attracting attention as one of the cells.

The chalcopyrite-type solar cells are adapted to use a compound semiconductor of chalcopyrite structure for photoelectric conversion layers, and transparent electrodes are placed on light-receiving surfaces of the photoelectric conversion layers for sunlight. As the transparent electrodes applied to the solar cells, ones composed mainly with the use of a metal oxide, for example, compositions are disclosed which use an indium tin oxide (Indium Tin Oxide: ITO) (for example, see Patent Literature 1 below). In addition, as another example of the transparent electrodes, compositions are disclosed which are obtained by laminating a discontinuous net-like metal silver network and a transparent oxide conductive thin film obtained with the use of a metal oxide such as zinc oxide ($ZnO_2$) (for example, see Patent Literature 2 below).

CITATION LIST

Patent Literatures

Patent Literature 1: WO 2006/116626
Patent Literature 2: JP 2010-135708 A

SUMMARY OF INVENTION

Technical Problem

However, the metal oxides used as the transparent electrodes of the solar cells as described above have light-transmitting properties, but insufficient conductivity. For this reason, it has been difficult to achieve a sufficient photoelectric conversion efficiency.

Therefore, an object of the present invention is to provide a solar cell which has a photoelectric conversion efficiency improved by applying a transparent electrode which has a combination of light-transmitting property and conductivity in a configuration including a photoelectric conversion layer of chalcopyrite structure, and provide a transparent electrode which is used for the solar cell in a preferred fashion because of having a combination of light-transmitting property and conductivity.

Solution to Problem

The solar cell according to the present invention for achieving this object is provided with a pair of electrodes and a photoelectric conversion layer of chalcopyrite structure sandwiched between the electrodes. Further, in particular, at least one of the pair of electrodes, which is adapted as a transparent electrode, has a nitrogen-containing layer composed with the use of an organic compound containing a nitrogen atom, and an electrode layer containing a metal of the Group 11 of the periodic table, which is provided to be laminated on the nitrogen-containing layer. The transparent electrode according to the present invention is also a transparent electrode preferably used as such solar cell.

In such a configuration, at least one of the pair of electrodes constituting the solar cell is adapted as a transparent electrode, and the nitrogen atoms in the nitrogen-containing layer constituting the transparent electrode have high coordination power to the metal element of the Group 11 of the periodic table in the electrode layer laminated on the nitrogen-containing layer. For this reason, the electrode layer is adapted as a film that is continuous while being a thin film. Thus, this electrode layer, which is adapted to have sufficient conductivity because of being a continuous film containing a metal, and to ensure a sufficient light transmission property because of being a thin film, constitutes the transparent electrode which has a combination of conductivity and light transmission property. Accordingly, the efficiency of receiving, through the transparent electrode, sunlight in the photoelectric conversion layer can be ensured, whereas the efficiency of extracting, through the transparent electrode, charges converted in the photoelectric conversion layer can be improved.

Advantageous Effects of Invention

As described above, the solar cell according to the present invention, which is configured to have the photoelectric conversion layer chalcopyrite structure, have the applicable transparent electrode which has a combination of light-transmitting property and conductivity, thereby improving the efficiency of extracting charges, while ensuring the efficiency of receiving sunlight in the photoelectric conversion layer through the transparent electrode, and as a result, making it possible to improve the photoelectric conversion efficiency in the solar cell. Furthermore, the transparent electrode according to the present invention makes it possible to improve the photoelectric conversion efficiency of the solar cell.

In addition, the transparent electrode according to the present invention is, because of functioning in an extremely thin film as compared with a transparent electrode composed of a metal oxide or the like, unlikely to cause cracking by folding or bending, can constitute a transparent electrode which bends in a flexible manner, and is also able to make a contribution to improved productivity.

BRIEF DESCRIPTION OF DRAWINGS

FIG. 7 is a graph showing the relationship between the effective unshared electron pair content ratio [n/M] of a nitrogen-containing layer constituting a transparent electrode and the sheet resistance.

DESCRIPTION OF EMBODIMENTS

Embodiments of the present invention will be described below in the following order with reference to the drawings.
1. Transparent Electrode according to First Embodiment of Present Invention
2. Modification Example 1 of Transparent Electrode according to First Embodiment of Present Invention
3. Modification Example 2 of Transparent Electrode according to First Embodiment of Present Invention
4. Modification Example 3 of Transparent Electrode according to First Embodiment of Present Invention
5. First Example of Solar Cell according to Second Embodiment of Present Invention
6. Second Example of Solar Cell according to Second Embodiment of Present Invention
7. Organic Compound containing Nitrogen Atom (N): Nitrogen-containing Compound
8. Molecular Wight of Nitrogen-Containing Compound and Relationship between Effective Unshared Electron Pair and Performance
9. Specific Example of Nitrogen-Containing Compound

1. Transparent Electrode According to First Embodiment of Present Invention

Figure 1:
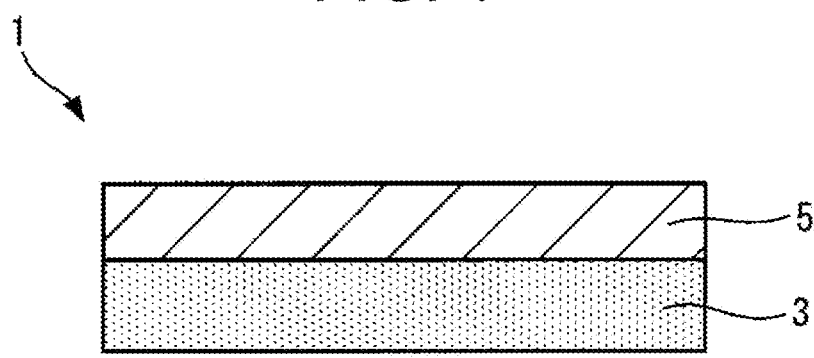
FIG. 1 is a schematic cross-sectional view of a transparent electrode according to a first embodiment of the present invention.

FIG. 1 is a schematic cross-sectional view illustrating the structure of a transparent electrode 1 according to a first embodiment of the present invention. The transparent electrode 1 shown in this figure, which is intended for use in a solar cell, has a two-layer structure of a nitrogen-containing layer 3 and an electrode layer 5 laminated, and the nitrogen-containing layer 3 and the electrode layer 5 are provided in this order, for example, on the top or bottom of layers constituting the solar cell, which are not shown in this figure. Of the layers, the electrode layer 5 constituting a substantial electrode part in the transparent electrode 1, which is a layer composed with the use of a metal, is laminated next to the nitrogen-containing layer 3 in this case. On the other hand, the nitrogen-containing layer 3 placed next to the electrode layer 5 is characterized by being composed with the use of an organic compound containing a nitrogen atom (N) stably bonded to a metal that is a main material constituting the electrode layer 5.

Details will be described below in the order of the electrode layer 5 and nitrogen-containing layer 3 constituting the transparent electrode 1, and a method for manufacturing the transparent electrode 1.

<Electrode Layer 5>

The electrode layer 5 is a layer deposited next to the nitrogen-containing layer 3, which is composed to contain, as a metal, a metal element of, in particular, the Group 11 of the periodic table. This electrode layer 5 is provided as a layer that takes a role as a substantial electrode material in the transparent electrode 1.

Examples of the metal element of the Group 11 of the periodic table, which constitutes the electrode layer 5, include specifically gold (Au), silver, (Ag), and copper (Cu). These metals are stable materials that are deep in work function, and able to improve the durability of the transparent electrode 1. These materials may be used as elemental substances, or used as alloys. The alloys include combinations of at least two of gold (Au), silver (Ag), and copper (Cu), and at least one of gold (Au), silver (Ag), and copper (Cu) as a main constituent, with one or more metals added thereto, such as aluminum (Al), palladium (Pd), platinum (Pt), neodium (Nd), and bismuth (Bi). Among these materials, as the material constituting the electrode layer 5, silver (Ag), copper (Cu), or an alloy thereof is preferred from the perspective of conductivity, more preferred is silver (Ag) or a silver alloy (for example, Ag—Au, Ag—Au—Cu, Ag—Au—Nd, Ag—Bi), particularly preferred is silver (Ag).

The metals mentioned above are typically opaque. For this reason, in order to ensure the light transmission property of the electrode layer 5 composed to contain these metals, there is a need for the electrode layer 5 to be an ultrathin film. On the other hand, this electrode layer 5 also is a layer that takes a role as a substantial electrode material, and thus required to have high conductivity. For this reason, it is important for this electrode layer 5 to be a continuous film by film growth of single-layer growth type (Frank-van der Merwe: FW type) as will be described later, while being an ultrathin film. The continuous film, but not a net-like film, can achieve a balance between high conductivity and high transparency.

Specifically, the electrode layer 5 is preferably 4 nm or more and 15 nm or less in film thickness. When the film thickness is less than 4 nm, the sheet resistance will be increased to make it difficult to serve as a conductive film. When the film thickness is greater than 15 nm, the light transmission will be decreased to make it impossible to ensure transparency. The further preferred film thickness of such an electrode layer 5 is 5 to 8 nm from the perspective of achieving a balance between transparency and conductivity.

Further, the electrode layer 5 may other materials besides the metal described above, without damaging the transparency and the conductivity. Specifically, for the purpose of adjusting the hardness of the layer, the layer may contain metal salts and chelators such as sodium carbonate and EDTA. In addition, for the purpose of adjusting the surface tension of the film, the layer may contain surfactants such as anionic, cationic, and nonionic surfactant. Furthermore, for the purpose of reducing the electrical resistance of the chalcopyrite structure against the photoelectric conversion layer, the layer may contain an electron-transporting material that is able to be co-deposited, like alkali metal compounds such as lithium fluoride. Moreover, In the case of depositing the electrode layer 5 by a die coating method, an ink-jet method, or the like as will be described later, the electrode layer 5 can contain therein a solvent and additives that are used for the deposition.

<Nitrogen-Containing Layer 3>

The nitrogen-containing layer 3 is a layer that functions as a base in the formation of the electrode layer 5, and provided herein to be laminated next to the electrode layer 5. This nitrogen-containing layer 3 is a nitrogen-containing organic compound layer composed with the use of an organic compound containing a nitrogen atom (N) (hereinafter, referred to as a nitrogen-containing compound). The nitrogen-containing compound is not particularly limited as long as the compound is an organic compound having a nitrogen atom-containing group in the molecule. In addition, the nitrogen-containing compound may be a low molecular weight compound or a high molecular weight compound, but preferably a structure in which the metal constituting the electrode layer 5 is likely to interact with the nitrogen atoms (N) in the nitrogen-containing compound constituting the nitrogen-containing layer 3 in the formation of the electrode layer 5. The nitrogen-containing layer 3 can interact as mentioned above with the metal atoms constituting the electrode layer 5, which are likely to agglomerate in region that is ultrathin in film thickness (to 10 nm), and keep the electrode layer 5 as an continuous film even in the extremely thin region, thereby achieving a balance between high transparency and conductivity.

It is to be noted that specific examples of the nitrogen-containing compounds for constituting the nitrogen-containing layer 3 will be described subsequently.

<Method for Manufacturing Transparent Electrode 1>

The method for manufacturing the transparent electrode 1 is not particularly limited, but in a method for manufacturing the transparent electrode 1 according to the present embodiment, the nitrogen-containing layer 3 is formed, and on the top thereof, the electrode layer 5 is formed. This procedure can, as described below, suppress metal agglomeration at the surface of the nitrogen-containing layer 3 to provide the electrode layer 5 as a continuous film, which is even an extremely thin film at the same time.

Examples of the method for forming the nitrogen-containing layer 3 can include vapor deposition methods and coating methods. While the coating methods are better in deposition rate, the vapor deposition methods are preferred from the perspective of continuous formation in a vacuum chamber, when the layer to serve as a base for the transparent electrode 1 is formed by vapor deposition in the manufacture of the chalcopyrite-type solar cell composed with the use of the transparent electrode 1.

Methods for forming the nitrogen-containing layer 3 by the coating methods include, for example, a method in which the nitrogen-containing compound described in detail later, and if necessary, other additives (for example, other electron-transporting materials) are dissolved in an appropriate solvent to prepare a coating solution, this coating solution is applied onto the base substrate, dried, and subjected to heat treatment.

The solvent is not particularly limited as long as the solvent can dissolve the nitrogen-containing compound, etc., but examples of the solvent include alcohols such as isopropanol and n-butanol; halogen-containing alcohols with halogen atoms substituted for hydrogen atoms of alcohols such as hexafluoroisopropanol and tetrafluoroisopropanol; dimethylsulfoxide and dimethylformamide. One of these solvents may be used alone, or two or more thereof may be used in mixture. Among these solvents, the alcohols, the halogen-containing alcohols, or mixed solvent thereof are preferred. These are excellent in terms of coatability due to the surface tensions, drying rate, etc., and because of their high polarity, capable of easily forming the nitrogen-containing layer 3 by a coating method on the photoelectric conversion layer which is not dissolved in highly polar solvents. In particular, solvents are preferably used which contain a fluorine-containing alcohol with fluorine atoms substituted for hydrogen atoms of the alcohols. In addition, some of the nitrogen-containing compounds described later are excellent in solubility in alcohols and fluoronated alcohols, and it is thus preferably to form films by coating with the use of these solvents. More specifically, the nitrogen-containing layer 3 is preferably formed by a manufacturing method including a coating step with the use of a solvent containing a fluorine-containing alcohol.

In this regard, the concentration (solid content concentration) of the nitrogen-containing compound and additives used, if necessary in the solvent is not particularly limited, but for example, the concentration in the solution is preferably 0.005 to 0.5 mass %.

There is no limit on the method for the application, but examples thereof include, for example, spin coating methods, casting methods from solutions, dip coating methods, blade coating methods, wire bar coating methods, gravure coating methods, and spray coating methods. Moreover, patterning can be performed by a printing method such as an ink-jet method, a screen printing method, a letterpress printing method, an intaglio printing method, an offset printing method, and a flexographic printing method. In addition, the heat treatment condition after the application may be, for example, any condition as long as the nitrogen-containing layer 3 can show an electron-transporting property. As this heating treatment condition, the heating temperature is preferably room temperature (25° C.) to 180° C., more preferably 60° C. to 120° C. In addition, the heating period is preferably 10 seconds to 10 minutes, more preferably 30 seconds to 5 minutes.

It is to be noted that in the case of using, among the subsequently described nitrogen-containing compounds, a compound that forms cross-linkage during or after the formation of a coating film to undergo an increase in molecular weight and increase the electron-transporting property through the use of a cross-linking agent in combination, the cross-linking agent may be used in combination with the nitrogen-containing compound. Examples of the cross-linking agent can include known cross-linking agents such as epoxy cross-linking agents, oxetane cross-linking agents, isocyanate cross-linking agents, alkoxysilane cross-linking agents, and vinyl cross-linking agents. In addition, in order to promote the reaction, it is preferable to use a polyol compound, a polyamine compound, a polythiol compound, or the like in combination.

Any of dry methods such as vacuum deposition methods and sputtering methods and wet methods such as coating methods that use metallic ink can be applied as the method for forming the electrode layer 5. In the coating methods, it is preferable to use nanosized metallic ink dispersed in a solvent, above all, metallic ink such that no organic material remains after being applied and dried without use of any binder. Examples of such metallic ink include, for example, TEC-PR-010, TEC-PR-010, and TEC-CO-010 from InkTec, and further, the silver complex ink described in Japanese Patent No. 4452841 or J. Am. Chem. Soc. 2012, 134, p 1419.

As the method for forming the electrode layer 5, more preferred are vacuum deposition methods. The conditions for the vapor deposition may be selected appropriately, in the range of, for example, the degree of vacuum: $10^{-6}$ to $10^{-3}$ Pa, vapor deposition rate: 0.01 to 50 nm/s, and substrate temperature: −50 to +150° C.

<Effect of Transparent Electrode 1>

The thus configured transparent electrode 1 is configured such that the electrode layer 5 containing the metal element of the Group 11 of the periodic table is provided to be laminated on the nitrogen-containing layer 3, and thus adapted to have a combination of conductivity and light transmission property as described below.

More specifically, in general, metallic thin films are likely to be deposited in island-shaped isolated forms by film growth of nucleus growth type (Volumer-Weber: VW Type). More specifically, in the deposition of the metallic thin films, commonly used base substrates have weak coordination power to metals. For this reason, metallic microparticles flying from vapor deposition sources can move (diffuse) for a while even after adherence to the base substrates, and the metallic microparticles thus collide and fuse with each other on the base substrates during the movement, thereby resulting in isolated metallic islands distributed, that is, agglomerated metallic particles present in spots. Such metallic thin films of island-shaped structure are also low in light transmission, and also high in sheet resistance, and thus unable to be used as electrode materials. On the other hand, when the film thickness is increased, the transparency is decreased while the sheet resistance can be reduced, thus resulting in failure to obtain any transparent electrode. As just described, through conventional methods, it has been difficult to obtain metallic thin films which are continuous while being ultra-thin films.

In contrast, in the transparent electrode 1 configured as described in the present embodiment, the nitrogen atoms (N) contained in the nitrogen-containing layer 3 produce strong coordination power to the metal element of the Group 11 of the periodic table, which constitutes the electrode layer 5. Thus, in the deposition of the electrode layer 5, the kinetic energy of the metallic particles attached to the surface of the nitrogen-containing layer 3 is reduced to decrease the diffusion distance of the metal on the surface of the nitrogen-containing layer 3. For this reason, the electrode layer 5 provided to be laminated on the nitrogen-containing layer 3 is a metallic thin film obtained by film growth of single-layer growth type (Frank-van der Merwe: FW type), and composed as a continuous metallic thin film with an extremely small, but uniform film thickness.

As a result, this electrode layer 5, which is adapted to have sufficient conductivity because of being a continuous film containing a metal element, and to ensure a sufficient light transmission property because of being a thin film, constitutes the transparent electrode 1 which has a combination of conductivity and light transmission property.

Furthermore, this transparent electrode 1 shows a favorable light transmission with respect to a wide range of light up to a wavelength on the order of 1100 nm, which is included in sunlight, and is thus preferred as the transparent electrode 1 for a solar cell.

Furthermore, this transparent electrode 1 is an ultrathin film as described above, and composed as a laminated structure of the nitrogen-containing layer 3 composed of an organic material and the electrode layer 5 containing a metal as its main constituent. Accordingly, as compared with transparent electrodes composed of metal oxides and the like, cracking by folding or bending is less likely to be caused, and the transparent electrode 1 can be composed which bends in a flexible manner.

Figure 2:
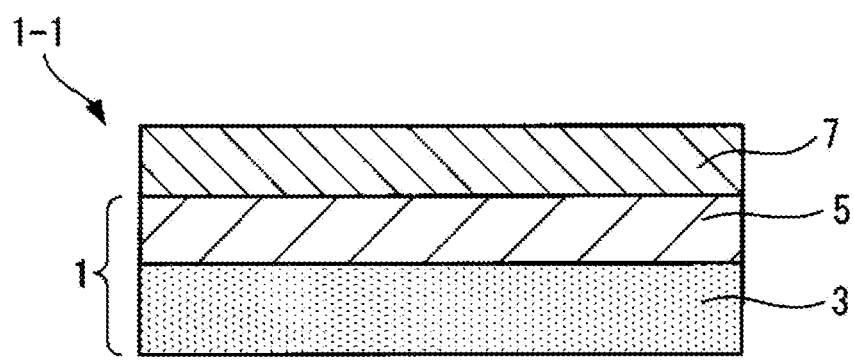
FIG. 2 is a schematic cross-sectional view of Modification Example 1 of the transparent electrode according to the first embodiment of the present invention.

2. Modification Example 1 of Transparent Electrode According to First Embodiment of Present Invention FIG. 2 is a schematic cross-sectional view illustrating Modification Example 1 of the transparent electrode according to the first embodiment of the present invention. As shown in this figure, a transparent electrode 1-1 according to Modification Example 1 is composed of the transparent electrode 1 described with reference to FIG. 1 with a high refractive index layer 7 added thereto, with the high refractive index layer 7 provided next to the electrode layer 5. For this reason, only the composition of the high refractive index layer 7 will be described herein.

<High Refractive Index Layer 7>

The high refractive index layer 7 is a layer composed of a light-transmitting material with a refractive index higher than the refractive index of the nitrogen-containing layer 3, and also serves as a protective film for the electrode layer 5 which functions as a substantial electrode. The electrode layer 5 composed with the use of a metal has an imaginary part as a refractive index, and the light transmission with respect to longer wavelengths is decreased due to the terms. The high refractive index layer 7 is a layer for keeping down this decrease in light transmission, and importantly, placed near the electrode layer 5. For example, the placement of the high refractive index layer 7 with a refractive index higher than 1.9 at a distance of 10 nm or less from the electrode layer 5 can achieve the transparent electrode 1-1 which has a sufficiently high light transmission to an extent up to on the order of 1000 to 1100 nm absorbed in the photoelectric conversion layer of chalcopyrite structure. It is to be noted that while the refractive indexes of common transparent high refractive index materials have an upper limit of approximately 2.5, the high refractive index layer 7 used herein has no particular upper limit on the refractive index. However, when the refractive index substantially varies between the high refractive index layer 7 and each layer constituting the solar cell, the power generation efficiency may be decreased by optical interface, the refractive index of the high refractive index layer 7 preferably has an upper limit on the order of 2.4.

Examples of the material constituting the high refractive index layer 7 as described above can include, for example, metal oxides, metal nitrides, and metal sulfides. Specifically, the examples include various types of metal oxides such as titanium oxide ($TiO_2$: n=2.3 to 2.4), zirconium oxide (ZrO: n=2.4), cadmium oxide (CdO: n=2.49), indium tin oxide (ITO: n=2.1 to 2.2), hafnium oxide ($HfO_2$: n=1.9 to 2.1), tantalum pentoxide ($Ta_2O_5$: n=2.16) and, in addition to zinc oxide (ZnO: n=1.9 to 2.0) for use in chalcopyrite-type solar cells. Furthermore, the examples include metal sulfides such as strontium sulfide ($Sr_2S$: n=2.0 to 2.2), barium sulfide (BaS: n=2.1 to 2.2), zinc sulfide (ZnS: n=2.3 to 2.4), and cadmium sulfide (CdS: n=2.4 to 2.5), and further, metal selenides and tellurides, while in order to improve the light transmission with respect to an infrared region up to 1000 to 1100 nm, it is preferable to use a material with a refractive index of 2.0 to 2.5, more preferably 2.1 to 2.4. Such compounds can include titanium oxide.

In addition, the film thickness of high refractive index layer 7 is not particularly limited, but preferably 150 nm or less in that the decrease in transmission by optical interference is kept down, more preferably 10 nm or more in terms of gas barrier property (chalcopyrite-type solar cells are relatively likely to be affected by moisture, and thus required to have a gas barrier property on the order of 10E-4 g/m2/d). More preferably, the film thickness has a range of 20 to 50 nm.

This high refractive index layer 7 can be deposited by appropriate selection from known film formation methods such as dry methods, e.g., vacuum vapor deposition methods, sputtering method, or wet methods, e.g., a method of applying nanosized metal oxide ink dispersed in a solvent.

<Effect of Transparent Electrode 1-1>

This transparent electrode 1-1 according to Modification Example 1 is, because the high refractive index layer 7 is provided, able to improve the light transmission property with respect to a wide range of light up to a wavelength on the order of 1100 nm, which is included in sunlight, as compared with the transparent electrode 1 configured as described with reference to FIG. 1, as described in subsequent examples. Further, this improvement is able to further improve the photoelectric conversion efficiency of the solar cell, as compared with a case of using the transparent electrode 1 composed as described with reference to FIG. 1, as described in subsequent examples.

Figure 3:
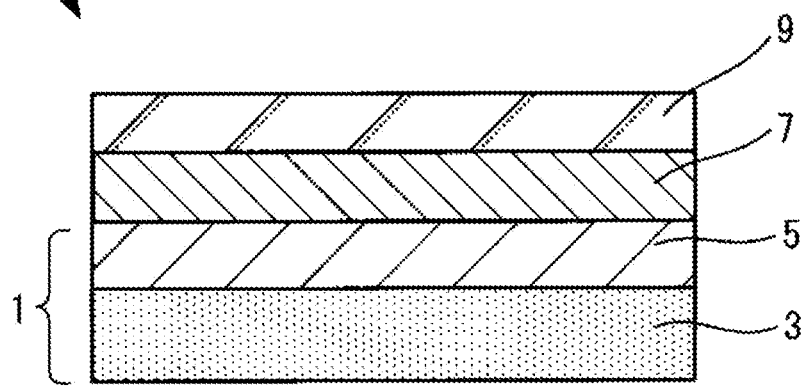
FIG. 3 is a schematic cross-sectional view of Modification Example 2 of the transparent electrode according to the first embodiment of the present invention.

3. Modification Example 2 of Transparent Electrode According to First Embodiment of Present Invention FIG. 3 is a schematic cross-sectional view illustrating Modification Example 2 of the transparent electrode according to the first embodiment of the present invention. As shown in this figure, a transparent electrode 1-2 according to Modification Example 2 is composed of the transparent electrode 1 configured in FIG. 1 with a high refractive index layer 7 and an antireflective layer 9 added thereto, with the high refractive index layer 7 and antireflective layer 9 provided in this order next to the electrode layer 5. The high refractive index layer 7 has the same composition as the high refractive index layer 7 described in Modification Example 1 in FIG. 2. For this reason, only the composition of the antireflective layer 9 will be described herein.

<Antireflective Layer 9>

The antireflective layer 9 is a layer composed with the use of a low refractive index material with a refractive index of 1.5 or less, and a layer for preventing the reflection of incident light from the antireflective layer 9 to the transparent electrode 1-2, and ensuring light incidence to the transparent electrode 1-2. More specifically, when the outermost layer on the light incidence side of the transparent electrode is composed of the high refractive index layer 7, reflections are more likely to be caused at the interface between the outermost layer and the air, and the photoelectric conversion efficiency is decreased. For this reason, the antireflective layer 9 is provided on the outside of the high refractive index layer 7. In addition, this antireflective layer 9 also serves as a protective film for the electrode layer 5 which functions as a substantial electrode.

Further, the antireflective layer 9 can, because of being composed with the use of the low refractive index material of with a refractive index of 1.5 or less, further decreases the reflectivity to increase the light incidence efficiency with respect to the transparent electrode 1-2. This antireflective layer 9 is composed of, for example, silicon oxide ($SiO_2$: n=1.45) or magnesium fluoride ($MgF_2$: n=1.38). Fluorinated organic polymers and the like are also preferred such as fluorinated polymers, e.g., polytetrafluoroethylene (PTFE: n−1.35). Above all, it is preferable to use a material with a refractive index of 1.30 to 1.50, more preferably, a compound with a refractive index of 1.30 to 1.40. Specifically, it is preferable to use magnesium fluoride ($MgF_2$: n=1.38).

In addition, the film thickness of the antireflective layer 9 is not particularly limited, but preferably 150 nm or less in that the decrease in transmission by optical interference is kept down, and more preferably 10 nm or more in terms of gas barrier property. More preferably, the film thickness has a range of 20 to 50 nm. These values may be considered to be combined with values for the high refractive index layer 7 constituting a protective film along with the antireflective layer 9.

This antireflective layer 9 can be deposited by appropriate selection from known film formation methods such as dry methods, e.g., vacuum vapor deposition methods, sputtering method, or wet methods, e.g., a method of applying nanosized metal oxide ink dispersed in a solvent.

<Effect of Transparent Electrode 1-2>

This transparent electrode 1-2 composed according to Modification Example 2 makes it possible to improve the light transmission with respect to a wide range of light up to a wavelength on the order of 1100 nm, which is included in sunlight, as compared with the transparent electrode 1-1 with no antireflective layer 9 provided configured in FIG. 2, as described in subsequent examples. Further, this improvement is able to further improve the photoelectric conversion efficiency of the solar cell, as compared with a case of using the transparent electrode 1-1 composed as described with reference to FIG. 2, as described in subsequent examples.

Figure 4:
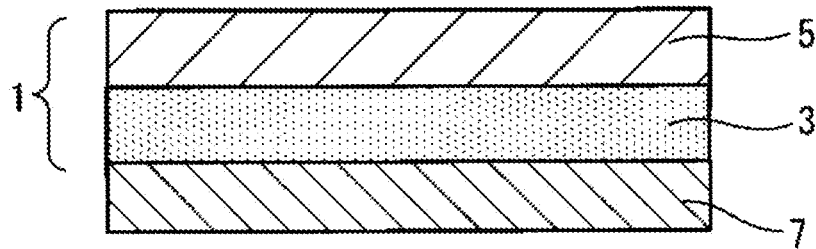
FIG. 4 is a schematic cross-sectional view of Modification Example 3 of the transparent electrode according to the first embodiment of the present invention.

4. Modification Example 3 of Transparent Electrode According to First Embodiment of Present Invention FIG. 4 is a schematic cross-sectional view illustrating Modification Example 3 of the transparent electrode according to the first embodiment of the present invention. As shown in this figure, a transparent electrode 1-3 according to Modification Example 3 is composed to have a high refractive index layer 7 provided next to the nitrogen-containing layer 3, and composed in the same fashion as the transparent electrode 1 in FIG. 1, except for the high refractive index layer 7. In addition, the high refractive index layer 7 is composed in the same fashion as the high refractive index layer 7 described in Modification Example 1 in FIG. 2. The semi-insulating layer (also referred to as high-resistance n layer) 21 typically formed from zinc oxide or the like may double as the high refractive index layer 7 herein.

As described in previous Modification Example 1, the high refractive index layer 7 is a layer for keeping down the decrease in light transmission with respect to longer wavelength, due to the imaginary part of the refractive index of the electrode layer 5 composed with the use of a metal, and importantly, placed near the electrode layer 5, and the placement of the high refractive index layer 7 at a distance of 10 nm or less from the electrode layer 5 can achieve the transparent electrode 1-3 which has a high light transmission with respect to a wide range of light up to on the order of 1000 to 1100 nm absorbed in the photoelectric conversion layer of chalcopyrite structure. Accordingly, in the case of the composition according to Modification Example 3, the film thickness of the nitrogen-containing layer 3 is preferably adjusted to 10 nm or less such that the distance between the electrode layer 5 and the high refractive index layer 7 is adjusted to 10 nm or less.

The thus composed transparent electrode 1-3 even makes it possible to improve the light transmission, as compared with the transparent electrode 1 in FIG. 1 with no high refractive index layer 7 provided.

It is to be noted that the transparent electrode for use in a solar cell according to the present embodiment may be composed to have a combination of Modification Example 1 (FIG. 2) and Modification Example 3 (FIG. 4) described above such that the structure of the transparent electrode 1 of the nitrogen-containing layer 3 and electrode layer 5 laminated is sandwiched between the two high refractive index layers 7. Alternatively, the transparent electrode for use in a solar cell according to the present embodiment may be composed to have a combination of Modification Example 2 (FIG. 3) and Modification Example 3 (FIG. 4) described above. In this case, the transparent electrode 1 of the nitrogen-containing layer 3 and electrode layer 5 laminated is adapted such that the high refractive index layer 7 is placed on the nitrogen-containing layer 3, whereas the high refractive index layer 7 and the antireflective layer 9 are placed in this order on the electrode layer 5.

Figure 5:
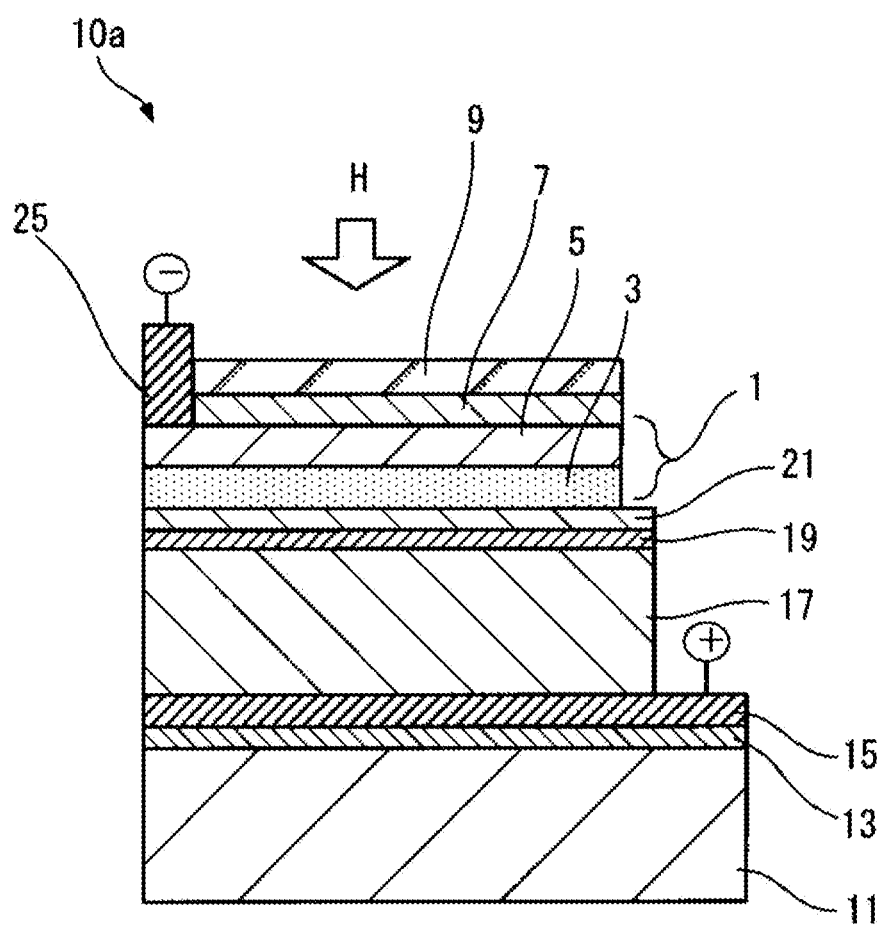
FIG. 5 is a schematic cross-sectional view illustrating a structure according to a first example of a solar cell according to a second embodiment of the present invention.

5. First Example of Solar Cell According to Second Embodiment of Present Invention FIG. 5 is a schematic cross-sectional view illustrating a first example of a solar cell according to a second embodiment of the present invention. The solar cell 10a shown in this figure is adapted to use a compound semiconductor material of chalcopyrite structure as a photoelectric conversion material, and configured with the use of the transparent electrode 1 described with reference to FIG. 1. This solar cell 10a is configured to have a silicate layer 13, a rear electrode 15, a photoelectric conversion layer 17 of chalcopyrite structure, a buffer layer 19, a semi-insulating layer 21, the transparent electrode 1, a high refractive index layer 7, and an antireflective layer 9 placed in this order on a substrate 11. In such a solar cell 10a, the transparent electrode 1 on the opposite side of the photoelectric conversion layer 17 from the substrate 11 serves as a light-receiving surface for sunlight H.

In such a configuration, the solar cell 10a is characteristic in that the transparent electrode 1 has a laminated structure of the nitrogen-containing layer 3 and electrode layer 5.

It is to be noted that the solar cell 10a according to the present embodiment has a substantial cell part from the rear electrode 15 to the transparent electrode 1. For this reason, for example, after the preparation of the solar cell 10a, this cell part may be separated either at the interface between the substrate 11 and the silicate layer 13 or at the interface between the silicate layer 13 and the rear electrode 15.

Next, with reference to FIG. 5, the compositions of the respective layers constituting the solar cell 10a according to the present embodiment will be described in order from the substrate 11.

<Substrate 11>

The substrate 11 is a base material on which the solar cell 10a is formed. In the solar cell 10a according to the present embodiment, the opposite side from the substrate 11 serves as a light-receiving surface for sunlight H. For this reason, the substrate 11 is not to be considered limited to light-transmitting substrates. In addition, the substrate 11 is used in the form selected appropriately depending on the intended use and properties, such as in the form of a plate, a sheet, or a film.

As the material constituting the substrate 11 described above, alkali-free glass, low-alkali glass, ultrathin film glass, ceramic, metal foil such as titanium (Ti) and stainless steel, plastic such as heat-resistant polyimide, and inorganic materials such as carbon fibers can be used. However, because a heat treatment step on the order of 500° C. is included in the formation of the photoelectric conversion layer 17 as described subsequently, materials are preferred which can withstand the heating temperature in the heat treatment step.

Furthermore, the substrate 11 is preferably composed of a light material without any weight load applied when the solar cell 10a is installed.

In addition, the substrate is preferably composed of a flexible material that allows a roll-to-roll process to be applied to the manufacture of the solar cell 10a. For this reason, examples of preferred materials for the substrate 11 include metal foil such as aluminum, titanium, and stainless steel, and heat-resistance polyimide.

<Silicate Layer 13>

The silicate layer 13 is intended to enhance the performance of the solar cell 10a, and is a layer for adding alkali metals (including alkaline-earth metals) such as sodium (Na) to the photoelectric conversion layer 17. Although the details are unknown, in general, a chalcopyrite-type solar cell has a power generation efficiency improved when sodium (Na) is partially diffused to a power generation layer of chalcopyrite. This type of silicate layer 13 is composed of a structure stabilized by partial incorporation of an alkali metal (Li, Na, K, Rb, Cs, Fr) or an alkaline-earth metal (Be, Mg, Ca, Sr, Ba, Ra), which is referred to as a network modifier or a network modifying ion, into the net-like structure of silicon oxide ($SiO_2$). The silicate layer 13 composed of such a structure is stable even when the layer is deposited as a thin film, and then left in the atmosphere for a while, and thus unlikely to be altered, and after the deposition, there is also no need for special heating treatment or the like for prevention of diffusion, etc.

The silicate layer 13 as described above preferably contains, as its main constituent, a compound represented by $aX_2O\text{-}bYO\text{-}cSiO_2$ (a, b, and c represent positive integers, X represents an alkali metal element of Group Ia, and Y represents an alkaline-earth metal element of Group IIa). Specific examples of the thus represented compound include [$Na_2O$—$CaO$-$5SiO_2$] and [$Na_2O$-$2MgO$-$6SiO_2$]. Among these compounds, soda lime glass is preferred which contains [$Na_2O$—$CaO$-$5SiO_2$] as its main constituent. This silicate layer 13 has a film thickness on the order of 20 nm to 500 nm.

Typically, in the case of using soda lime glass or the like containing soda lime ($Na_2O$—$CaO$-$5SiO_2$) as its main constituent herein for the substrate 11, the alkali metal contained in the substrate 11 diffuses into the CIS-type metal of the photoelectric conversion layer 17. For this reason, there is no need to provide, on the substrate 11, the silicate layer 13 for intentionally adding the alkali metal to the photoelectric conversion layer 17.

In contrast, in the case of intending to use alkali-free glass or low-alkali glass for the substrate 11, or in the case of intending to use a plastic material such as polyimide for the substrate 11 for the purpose of preparing a flexible solar cell, the alkali metal is not able to be expected to diffuse from the substrate 11. For this reason, it is effective provide the silicate layer 13 described above on the substrate 11.

Further, as another composition for adding an alkali metal to the photoelectric conversion layer 17, there is a composition achieved by using an alkali precursor containing an alkali metal, such as sodium fluoride (NaF). In an example thereof, the alkali precursor is vapor-deposited on the top of the rear electrode 15, and the alkali metal is diffused into the photoelectric conversion layer 17 by heating in the deposition of the photoelectric conversion layer 17 on the top of the precursor. In another example, the alkali precursor is vapor-deposited on the photoelectric conversion layer 17, and thereafter, the alkali precursor is diffused into the photoelectric conversion layer 17 by heating. However, in any of the compositions, because the foreign substance of the alkali precursor is sandwiched in contact with the interface of the photoelectric conversion layer 17, there is concern about characteristic degradation of the solar cell due to the foreign substance.

However, in the configuration of the silicate layer 13 placed between the substrate 11 and the rear electrode 15, an alkali metal is able to be supplied to the photoelectric conversion layer 17 without providing the foreign substance of the alkali precursor in contact with the interface of the photoelectric conversion layer 17. As a result, characteristic degradation of the solar cell due to the foreign substance can be prevented.

<Rear Electrode 15>

The rear electrode 15 is one electrode of a pair of electrodes in the solar cell 10a, and used as, for example, an anode. This rear electrode 15 is composed of a high melting point metal that has resistance heating in the deposition of the photoelectric conversion layer 17. In addition, the rear electrode 15 is composed of a conductive material that has corrosion resistance to selenium (Se) constituting the photoelectric conversion layer 17. Examples of the material constituting this rear electrode 15 include, for example, molybdenum (Mo), titanium (Ti), and chromium (Cr).

It is to be noted that this rear electrode 15 may be provided with a separate grid electrode (omitted in the figure) for power collection, if necessary.

<Photoelectric Conversion Layer 17>

The photoelectric conversion layer 17 is a so-called CIS-based photoelectric conversion layer which may be a semiconductor thin film composed of a compound semiconductor material of chalcopyrite structure (chalcopyrite-based material). The chalcopyrite-based material is composed to contain an element of Group Ib (Cu, Ag, Au), an element of Group IIIb (B, Al, Ga, In, Tl), and an element of Group VIb (S, Se, Te, Po), and contains, for example, $Cu(In_{1-x}Ga_x)(Se_yS_{1-y})_2$ [$0 \leq x \leq 1$, $0 \leq y \leq 1$] as its main constituent. In a case where gallium (Ga) or sulfur (S) is not present as a solid solution (x=y=0), the photoelectric conversion layer 17 is a semiconductor thin film composed of $CuInSe_2$.

This photoelectric conversion layer 17 is preferably 0.5 to 5 μm, more preferably 1 to 2 μm in film thickness.

<Buffer Layer 19>

The buffer layer 19 is a layer for providing an electrical junction with the photoelectric conversion layer 17. This buffer layer 19 is composed with the use of a Group II-VI compound semiconductor such as CdS, ZnS, and ZnO, a mixed crystal thereof, or an In-based compound semiconductor such as $In_2O_3$, $In_2S_3$, or $In(OH)$. This buffer layer 19 has a film thickness on the order of 20 nm to 150 nm, preferably 50 nm. It is to be noted that while this buffer layer 19 may be provided, if necessary, the formation of such a buffer layer 19 allows for an improvement in open voltage and the photoelectric conversion efficiency, and there is thus a tendency to achieve a high-efficiency solar cell more easily when the buffer layer 19 is provided.

<Semi-insulating Layer 21>

The semi-insulating layer 21 is an n-type high-resistance layer, which is also referred to as a high-resistance n-type layer. The layer is a layer for reducing the leakage current between the photoelectric conversion layer 17 and the transparent electrode 1. This semi-insulating layer 21 is composed with the use of ZnO:B containing ZnO and boron (B), ZnO:Al containing aluminum (Al). It is to be noted that while this semi-insulating layer 21 may be provided with the buffer layer 19, if necessary, any one of the buffer layer 19 and semi-insulating layer 21 may be provided. There is no need to provide the layers when it is not necessary to provide any of the layers. The formation of such a buffer layer 19 and a semi-insulating layer 21 as an n-type high-resistance layer allows for an improvement in open voltage and the photoelectric conversion efficiency, and there is thus a tendency to achieve a high-efficiency solar cell more easily when the buffer layer 19 and the semi-insulating layer 21 are provided.

<Transparent Electrode 1>

The transparent electrode 1 is composed of the laminated nitrogen-containing layer 3 and electrode layer 5 described with reference to FIG. 1, and used as the other electrode of the pair of electrodes in the solar cell 10a. This transparent electrode 1 is used as, for example, a cathode. In this solar cell 10a, the transparent electrode 1 is provided in the order of the nitrogen-containing layer 3 and the electrode layer 5 from the semi-insulating layer 21. In this case, the nitrogen-containing layer 3 constituting the transparent electrode 1 preferably functions as an electron transporting layer between the electrode layer 5 and the photoelectric conversion layer 17. This nitrogen-containing layer 3 may be composed with the use of a nitrogen-containing compound that has a favorable electron-transporting property among the subsequently described nitrogen-containing compounds.

It is to be noted that the transparent electrode 1 may be replaced by the transparent electrode 1-3 according to Modification Example 3, which has been described with reference to FIG. 4. In this case, on the top of the semi-insulating layer 21 in FIG. 5, the high refractive index layer is placed which is omitted in the figure herein, and on the top of the high refractive index layer, the nitrogen-containing layer 3 and the electrode layer 5 are placed in this order. In this case, the material constituting the high refractive index layer has an insulation property as previously described. For this reason, the film thickness of the high refractive index layer is supposed to be set without interfering with charge transfer from the photoelectric conversion layer 17 to the electrode layer 5.

<Grid Electrode 25>

The electrode layer 5 of the transparent electrode 1 is provided with the grid electrode 25, if necessary. This grid electrode 25 is an electrode as a terminal for receiving a current or a voltage from the transparent electrode 1 for low-resistance extraction to an external electrode, which is supposed to be placed in a position that never interfere with incident sunlight H from the transparent electrode 1 to the photoelectric conversion layer 17. This grid electrode 25 is supposed to be composed of a favorably conductive material such as, for example, aluminum.

<High Refractive Index Layer 7>

The high refractive index layer 7 is a layer as described previously with reference to FIG. 2, which is composed of a light-transmitting material with a refractive index higher than the refractive index of the nitrogen-containing layer 3. This high refractive index layer 7 also serves as a protective film for the electrode layer 5 which functions as a substantial electrode, and may be composed as a part of the transparent electrode. When the grid electrode 25 is placed in contact with the electrode layer 5, the high refractive index layer 7 is supposed to be provided so as to ensure the connection between the electrode layer 5 and the grid electrode 25 and keep the connection of an external terminal to the grid electrode 25 from being blocked.

<Antireflective Layer 9>

The antireflective layer 9 is a layer as described previously with reference to FIG. 3, which is composed with the use of a low refractive index material with a refractive index of 1.5 or less. This antireflective layer 9 is a layer for preventing the reflection of incident sunlight from this antireflective layer 9 to the transparent electrode 1, and ensuring the light incidence efficiency to the transparent electrode 1. This antireflective layer 9 also serves as a protective film for the electrode layer 5 which functions as a substantial electrode, and may be composed as a part of the transparent electrode. When the grid electrode 25 is placed in contact with the electrode layer 5, the antireflective layer 9 is supposed to be provided so as to ensure the connection between the electrode layer 5 and the grid electrode 25 and keep the connection of an external terminal to the grid electrode 25 from being blocked.

<Other Layers>

Besides the respective layers described above, the solar cell 10a according to the present embodiment may be further provided with other members (other layers) for improvement in photoelectric conversion efficiency and improvement in device lifetime. The other members include, for example, a hole injecting layer, an electron injecting layer, an exciton blocking layer, a UV absorbing layer, a light reflection layer, and a wavelength conversion layer. The hole injecting layer is, if any, placed between the photoelectric conversion layer 17 and the rear electrode 15. The electron injecting layer is, if any, placed between the photoelectric conversion layer 17 and the transparent electrode 1. The exciton blocking layer is, if any, placed between the photoelectric conversion layer 17 and the rear electrode 15 or the photoelectric conversion layer 17 and the transparent electrode 1. The UV absorbing layer is, if any, placed for the outermost layer outside the substrate 11, in order to suppress degradation of the flexible substrate due to sunlight. The wavelength conversion layer is also placed for the outermost layer outside the substrate 11 in the same way. Furthermore, a layer of metal oxide may be laminated next to the cathode (for example, the transparent electrode 1 herein) on the photoelectric conversion layer 17 side.

In addition, the solar cell 10a according to the present embodiment may have various types of optically functional layers above the antireflective layer 9 as a side of receiving sunlight H, for the purpose of more efficiently receiving of sunlight H. For example, light collection layers such as a microlens arrays, such light diffusion layers that can scatter light reflected by the transparent electrode 1, and again make the light incident onto the photoelectric conversion layer 17, etc. are used as the optically functional layers.

When microlens arrays are provided as light collection layers, the microlens array can be further combined with a light collection sheet to increase the amount of sunlight H received from a specific direction, or contrawise, reduce the incidence angle dependence of sunlight H.

Examples of the microlens arrays include a configuration of two-dimensionally arranged four-sided pyramids of 30 μm on a side for a vertex angle of 90 degrees. The side is preferably 10 to 100 μm. Unfavorably, the side shorter than this range produces a diffraction effect, thereby resulting in coloring, whereas the excessively long side increases the thickness.

In addition, the light collection layers can include various types of anti-glare layers, and layers with nanoparticles or nanowires of metals or various types of inorganic oxides dispersed in clear and colorless polymers.

Moreover, the solar cell 10a is preferably sealed with a configuration known in organic photoelectronic conversion elements, organic electroluminescence elements, etc., in order to keep from being degraded due to oxygen, moisture, etc. in the environment. For example, there is a configuration in which a cap composed of a light-transmitting material such as glass is placed to cover the solar cell 10a and bonded with an adhesive. In addition, there is a configuration in which the solar cell 10a is covered with a light-transmitting plastic film with a gas barrier layer such as silicon oxide or aluminum oxide formed, and bonded with an adhesive. Furthermore, a highly gas-barrier organic polymer material (e.g., polyvinyl alcohol) may be adapted for spin coating in a manner that coats the solar cell 10a. In addition, a highly gas-barrier inorganic film (e.g., silicon oxide, aluminum oxide) or an organic film (e.g., parylene) may be adapted for deposition under vacuum in a manner that coats the solar cell 10a. Moreover, these configurations may be adapted for composite application. However, as the sealing structure for the solar cell 10a, an appropriate configuration that never interferes with sunlight H incident onto the solar cell 10a is supposed to be selected from among the configurations as described above.

<Method for Manufacturing Solar Cell 10a>

A method for manufacturing the solar cell 10a configured as described above will be described.

First, the silicate layer 13 is deposited on the substrate 11 so as to have a film thickness on the order of 20 nm to 500 nm. In this regard, magnetron sputtering, preferably, radio-frequency (RF) magnetron sputtering is carried out which uses a sputtering target composed of a silicate to serve as a starting raw material for the silicate layer 13.

Next, the rear electrode 15 composed of molybdenum (Mo) is deposited on the silicate layer 13, so as to have a film thickness on the order of 100 nm to 2000 nm, preferably 800 nm. In this regard, sputtering is carried out which uses molybdenum (Mo) as a sputtering target.

Then, the photoelectric conversion layer 17 which has a chalcopyrite structure is deposited on the rear electrode 15 so as to have a film thickness on the order of 1 μm to 3 μm, preferably 2 μm. In this regard, a multi-vapor deposition method is applied which uses a Group Ib element (Cu, Ag, Au), a Group IIIb element (B, Al, Ga, In, Tl), and a Group VIb element (S, Se, Te, Po) respectively as independent vapor deposition sources. It is to be noted that a selenide method, an electrodeposition method, a coating method, etc. may be applied to the deposition of the photoelectric conversion layer 17.

Then, the buffer layer 19 composed of CdS is deposited on the photoelectric conversion layer 17 so as to have a film thickness on the order of 20 nm to 150 nm, preferably 50 nm. In this regard, it is preferable to carry out the deposition through the application of a chemical deposition method (CBD method) as a known approach.

Then, the semi-insulating layer 21 composed of, for example, zinc oxide (ZnO) is deposited on the buffer layer 19 so as to have a film thickness on the order of 20 nm to 200 nm, preferably 70 nm.

Thereafter, the nitrogen-containing layer 3 is formed on the semi-insulating layer 21 in accordance with the procedure described previously for the composition of the transparent electrode, and the electrode layer 5 is formed on the top of the nitrogen-containing layer 3.

Then, if necessary, the grid electrode 25 is formed in a pattern in contact with a part of the electrode layer 5. In this regard, the grid electrode 25 can be formed in a pattern by a mask vapor deposition method with aluminum as a vapor deposition source.

Thereafter, the high refractive index layer 7 and the antireflective layer 9 are formed in this order on the transparent electrode 1. For the formation of the high refractive index layer 7 and the antireflective layer 9, the deposition can be carried out by appropriate selection from known film formation methods such as dry methods, e.g., vacuum vapor deposition methods, sputtering method, or wet methods, e.g., a method of applying nanosized metal oxide ink dispersed in a solvent.

Thus, the chalcopyrite-type solar cell 10a can be achieved.

<Effect of Solar Cell 10a>

The solar cell 10a described above includes the transparent electrode 1 which has a combination of conductivity and light-transmitting property as described with reference to FIGS. 1 to 4, and thus can improve the efficiency of extracting, through the transparent electrode 1, charges converted in the photoelectric conversion layer 17, while ensuring the efficiency of receiving, through the transparent electrode 1, sunlight H in the photoelectric conversion layer 17. This result makes it possible to improve the photoelectric conversion efficiency in the solar cell 10a which has the photoelectric conversion layer 17 of chalcopyrite structure.

Moreover, this transparent electrode 1 also has a light transmission with respect to wavelength in an infrared region around 1000 to 1100 nm, which is an absorption wavelength range in the photoelectric conversion layer 17 of chalcopyrite structure. For this reason, the chalcopyrite-type solar cell 10a which uses the transparent electrode 1 allows the photoelectric conversion layer 17 to absorb sunlight H in a broad wavelength range with zero waste, thereby also making it possible to improve the photoelectric conversion efficiency.

Furthermore, the configuration of the high refractive index layer 7 or antireflective layer 9 placed on the transparent electrode 1 improves the light transmission in a range including, in particular, an infrared region, thereby also making it possible to improve the photoelectric conversion efficiency in the solar cell 10a.

Moreover, the transparent electrode 1 provided with the electrode layer 5 containing a metal allows the grid electrode 25 composed of a metal to be connected successfully to the electrode layer 5. Thus, charges obtained in the photoelectric conversion layer 17 are extracted efficiently, thereby also making it possible to improve the photoelectric conversion efficiency. In addition, peeling is prevented which is caused by expansion and contraction between the transparent electrode 1 and the grid electrode 25 in banding or folding the cell, or repeating a cooling and heating cycle, and improved reliability is expected.

Furthermore, the nitrogen-containing layer 3 constituting the transparent electrode 1 can be composed with the use of a nitrogen-containing compound that is excellent in electron transporting property. In this case, it is also possible to allow the nitrogen-containing layer 3 placed between the electrode layer 5 and the photoelectric conversion layer 17 to function as an electron transporting layer, thereby improving the fill factor in combination with the semi-insulating layer 21 that is an n-type high-resistance layer.

In addition, in this solar cell 10a, damage caused by the deposition of the electrode layer 5 to the photoelectric conversion layer 17 can be prevented because the electrode layer 5 is formed above the photoelectric conversion layer 17 with the nitrogen-containing layer 3 interposed therebetween.

Furthermore, because the transparent electrode 1 configured as described above has high resistance to bending, the application of the transparent electrode 1 to the chalcopyrite-type solar cell 10a can provide the solar cell 10a with flexible flexibility. This result makes it possible achieve building-integrated photovoltaics systems.

It is to be noted that this solar cell 10a serves as a bifacial solar cell 10a through the selection of a substrate of light-transmitting material as the substrate 11 and the use of, as the rear electrode 15, a transparent conductive film such as an ITO. The bifacial solar cell can generate by receiving light from both of the faces, and thus, when the cell is installed in a section such as, for example, a fence on stairs, it becomes possible to generate power both in the morning and in the afternoon, and as a result, it is also possible to increase the power generation in total. In addition, such a bifacial solar cell is able to be see-through, and thus, when a daylighting window partially has such as see-through solar cell, it is also possible to achieve a balance between daylighting and power generation, and the solar cell has various types of conceivable uses.

Figure 6:
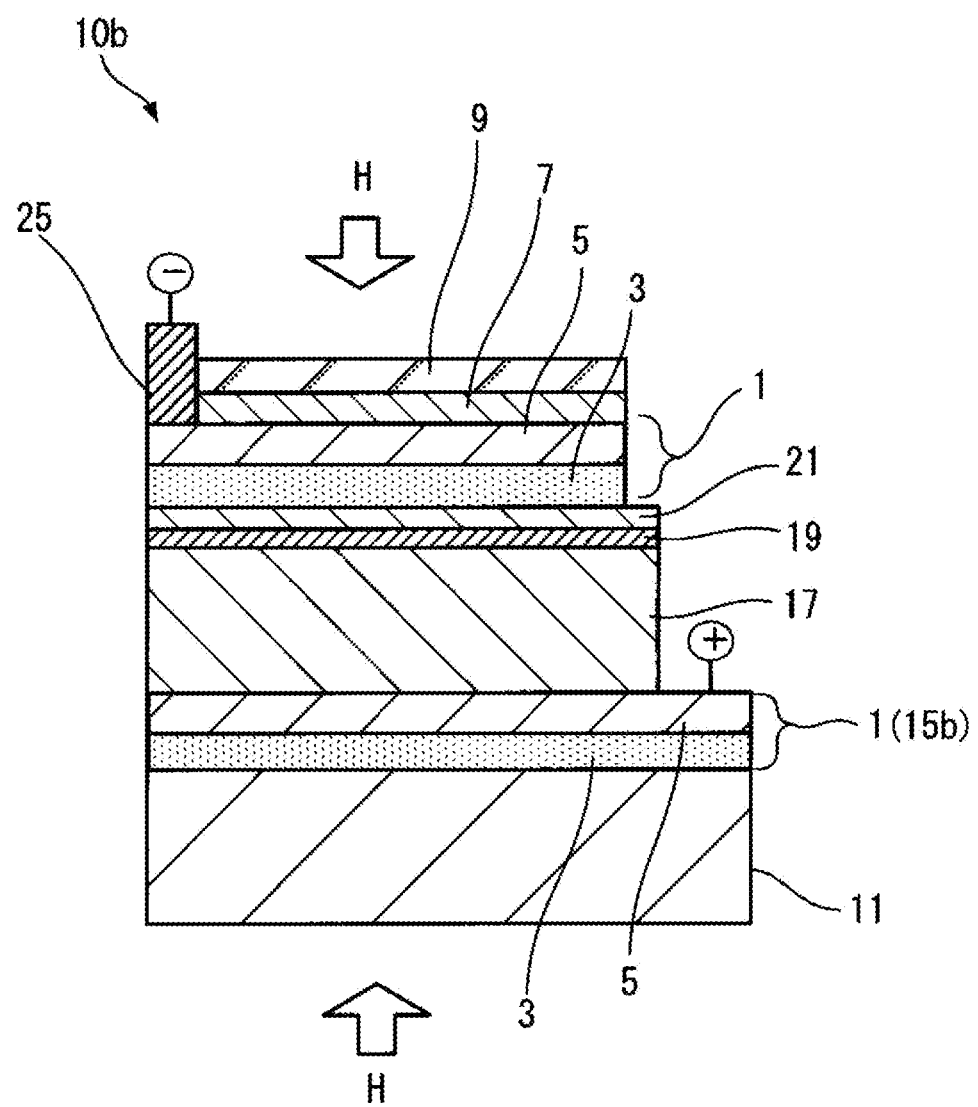
FIG. 6 is a schematic cross-sectional view illustrating a structure according to a second example of the solar cell according to the second embodiment of the present invention.

6. Second Example of Solar Cell According to Second Embodiment of Present Invention FIG. 6 is a schematic cross-sectional view illustrating a second example of the solar cell according to the second embodiment of the present invention. The solar cell 10b shown in this figure differs from the solar cell according to the first example as described with reference to FIG. 5 in that the rear electrode 15 is also composed of the transparent electrode 1, and the other configuration is the same as the solar cell according to the first example as shown in FIG. 5. For this reason, the same constituent elements as those in the first example are provided with the same reference signs, and repeated descriptions will be omitted.

In this solar cell 10b, the transparent electrode 1 (rear electrode 15) on the substrate 11 side is composed of the nitrogen-containing layer 3 and electrode layer 5 laminated in order from the substrate 11 side. The nitrogen-containing layer 3 and the electrode layer 5 are the same as described in the first example.

It is to be noted that the transparent electrode 1 (rear electrode 15) on the substrate 11 side may be replaced by the transparent electrode 1-3 according to Modification Example 3, which has been described with reference to FIG. 4. In this case, the high refractive index layer omitted in the figure herein is placed on the top of the substrate 11 in FIG. 6, and on the top of the layer, the nitrogen-containing layer 3 and the electrode layer 5 are placed in this order.

In addition, when the substrate 11 is composed of, not soda lime glass, but a material that has no function in doping the photoelectric conversion layer 17 of chalcopyrite structure with sodium (Na), the same silicate layer may be provided as illustrated with the first example. In that case, the high refractive index layer may be located at a distance (approximately 50 nm) capable of plasmon resonance with respect to the electrode layer 5. For this reason, while a layer configuration may be adopted, such as substrate 11/high refractive index layer/silicate layer/nitrogen-containing layer 3/electrode layer 5, the layer configuration of substrate 11/silicate layer/high refractive index layer/nitrogen-containing layer 3/electrode layer 5 is rather preferred because the plasmon resonance is drastically decreased with distance from the metal layer.

Further, the electrode layer 5 constituting the transparent electrode 1 (rear electrode 15) on the substrate 11 side is also provided with the grid electrode, if necessary. This grid electrode is an electrode as a terminal for extracting a current or a voltage from the transparent electrode 1, and supposed to be placed in a position that never interfere with incident sunlight H from the transparent electrode 1 onto the photoelectric conversion layer 17. This type of grid electrode is supposed to be composed of a favorably conductive material such as, for example, aluminum.

The solar cell 10*b* as described above, which has the pair of electrodes both composed of the transparent electrode 1, is composed as a bifacial chalcopyrite-type solar cell that receives sunlight H from both of the faces (Reference: Technical Digest of the International PVSEC-17 Fukuoka Japan, 2007, 5P-P3-17, p. 806).

<Method for Manufacturing Solar Cell 10*b*>

For the method for manufacturing the solar cell 10*b* configured as described above, in the formation of the rear electrode 15 in the method for manufacturing the solar cell according to the first example, in accordance with the procedure described previously for the composition of the transparent electrode, the nitrogen-containing layer 3 may be formed on the substrate 11, and on the top of the layer, the electrode layer 5 may be formed.

<Effect of Solar Cell 10*b*>

The solar cell 10*b* described above includes, on the both sides of the photoelectric conversion layer 17, the transparent electrode 1 which has a combination of conductivity and light-transmitting property as described with reference to FIGS. 1 to 4, and thus can improve the efficiency of extracting, through the transparent electrodes 1, charges converted in the photoelectric conversion layer 17, while ensuring the efficiency of receiving, through the transparent electrodes 1, sunlight H in the photoelectric conversion layer 17. This result makes it possible to improve the photoelectric conversion efficiency in the solar cell 10*b* which has the photoelectric conversion layer 17 of chalcopyrite structure.

It is to be noted that this solar cell 10*b* may have the transparent electrode 1 on the opposite from the substrate 11, which is replaced by a transparent conductive film such as an ITO, and even in this case, serves as a bifacial solar cell. Alternatively, this solar cell 10*b* may have the transparent electrode 1 on the opposite from the substrate 11, which is replaced by a non-transparent electrode composed of a conductive martial which has no light-transmitting property. In this case, the solar cell is adapted to receive sunlight H only from the substrate 11 side. The non-transparent electrode in this case is preferably composed of a favorably conductive light-reflective material, thereby improving light-receiving characteristics in the photoelectric conversion layer 17, and improving the efficiency of extracting charges converted in the photoelectric conversion layer 17.

7. Organic Compound Containing Nitrogen Atom (N): Nitrogen-Containing Compound Next, the details of the organic compound containing a nitrogen atom (N) (nitrogen-containing compound) will be described. The nitrogen-containing compound described herein is intended to constitute the nitrogen-containing layer 3 of the transparent electrode 1 as shown in FIGS. 1 to 6.

The nitrogen-containing compound for use in the present invention preferably contains, for example, an organic compound represented by the following general formula (1), or a high molecular weight compound having a structural unit represented by the following general formula (2), or a high molecular weight compound having a structural unit represented by the following formula (3).

[Chemical Formula 1]

$(A^1)_{n1}\text{-}Y^1$  General Formula (1)

$A^1$ in the general formula (1) represents a monovalent nitrogen atom-containing group. n1 represents an integer of 2 or more. Further, n1 is preferably an integer of 2 to 4, from the perspective of sufficient interaction between a metal element of the Group 11 of the periodic table, which constitutes the electrode layer 5 of the transparent electrode 1, and the nitrogen atom constituting the nitrogen atom-containing group. More specifically, when the value of n1 is excessively large, the steric hindrance of the nitrogen-containing compound buries the nitrogen-containing group in the molecule, and makes it difficult for the nitrogen atom to produce the effect of interaction with the metal atom. Furthermore, n1 is preferably 2 or 3 from the perspective of ease in the synthesis of the nitrogen-containing compound. n1 pieces of $A^1$ in the general formula (1) may be identical to each other, or may be different from each other.

In the general formula (1), $Y^1$ represents an n1-valent organic group or a single bond (—) as just a linking group. It is to be noted that when $Y^1$ represents a single bond (—), n1 is 2, and the nitrogen containing compound of the general formula (1) has a structure of $A^1\text{-}A^2$. Even in this case, the two pieces of $A^1$ may be identical to each other, or different from each other.

[Chemical Formula 2]

$\text{---}A^2\text{-}Y^2\text{---}$  General Formula (2)

In the general formula (2), $A^2$ represents a divalent nitrogen atom-containing group. In addition, $Y^2$ represents a divalent organic group or a single bond (—).

[Chemical Formula 3]

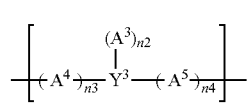

General Formula (3)

In the general formula (3), $A^3$ represents a monovalent nitrogen atom-containing group. n2 represents an integer of 1 or more. In addition, n2 is preferably an integer of 1 to 3, from the perspective of sufficient interaction between a Group 11 metal constituting the electrode layer 5 of the transparent electrode 1 and the nitrogen atom constituting the nitrogen atom-containing group of $A^3$. Furthermore, n2 is preferably 1 or 2 from the perspective of ease in the synthesis of the nitrogen-containing compound. When n2 is an integer of 2 or more, a plurality of pieces $A^3$ may be identical to each other, or may be different from each other. In addition, when the high molecular weight compound contains therein a plurality of pieces $A^3$, the pieces $A^3$ may be identical to each other, or may be different from each other.

In the general formula (3), $A^4$ and $A^5$ represent a divalent nitrogen atom-containing group. $A^4$ and $A^5$ may be identical or different. n3 and n4 each independently represents an integer of 0 or 1. Therefore, in the general formula (3), $Y^3$ represents an (n2+2)-valent organic group.

A preferred form of the nitrogen-containing compound represented above is a compound in which the nitrogen atom-containing group is located not in a central part of the compound, but at the periphery thereof, which is an organic low molecular weight compound represented by the general formula (1) or a high molecular weight compound having a structural unit represented by the general formula (3). With this structure, the nitrogen-containing layer 3 configured with the use of the nitrogen-containing compound will have, on the surface thereof, a high density of nitrogen atom-containing groups, and increasingly interact (contact) with the metal atom constituting the electrode layer 5.

Another preferred form of the nitrogen-containing compound is a high molecular weight compound, that is, a high molecular weight compound having a structural unit represented by the general formula (2) or the general formula (3). This is because in the case of forming a film of the nitrogen-containing layer 3 composed with the use of the nitrogen-containing compound by a coating method, the nitrogen-containing layer 3 with highly uniform film quality is obtained when the nitrogen-containing compound is a polymer compound, and as a result, a solar cell is achieved which is excellent in photoelectric conversion efficiency and durability.

The high molecular weight compound as the nitrogen-containing compound, which has a structural unit represented by the general formula (2) or the general formula (3) may be a homopolymer (homopolymer) composed of only a single structural unit derived from the general formula (2) or the general formula (3), or may be a copolymer (copolymer) composed of only two or more structural units derived from at least one of the general formula (2) and general formula (3).

Alternatively, a copolymer (copolymer) may be formed which further has another structural unit having no nitrogen atom-containing group (hereinafter, also referred to simply as "another structural unit") in addition to the structural unit represented by the general formula (2) or the general formula (3). The content of another structural unit in the case of the nitrogen-containing compound having the structural unit is not particularly limited to the extent that the effect of the nitrogen-containing compound according to the invention of the present application is not undermined, but the content of a monomer derived from another structural unit is preferably 10 to 75 mol %, more preferably 20 to 50 mol % in the monomers derived from all of the structural units.

The terminal of the high molecular weight compound as the nitrogen-containing compound, which has a structural unit represented by the general formula (2) or general formula (3), is not particularly limited, but typically a hydrogen atom although the term is appropriately specified depending on the type of a raw material (monomer) used.

Detailed descriptions of the respective moieties constituting the general formula (1) through the general formula (3) will be given below.

$<A^1$ and $A^3>$ (No. 1)

The monovalent nitrogen atom-containing group represented by $A^1$ or $A^3$ in the general formula (1) or the general formula (3). Examples of the group include an amino group, a dithiocarbamate group, a thioamide group, a cyano group (—CN), an isonitrile group (—N$^+$≡C$^-$), an isocyanate group (—N═C═O), a thioisocyanate group (—N═C═S), or a group containing a nitrogen-containing aromatic ring. The nitrogen-containing aromatic ring may have a substituent or no substituent.

Examples of the nitrogen-containing aromatic ring constituting $A^1$ or $A^3$ include an aziridine ring, an azirine ring, an azetidine ring, an azete ring, an azolidine ring, an azole (pyrrole) ring, an azinane ring, a pyridine ring, an azepane ring, an azepine ring, an imidazole ring, a pyrazole ring, a triazole ring, an oxazole ring, an oxadiazole ring, a triazole ring, an imidazoline ring, a pyrazine ring, a morpholine ring, a thiazine ring, an indole ring, an isoindole ring, a benzimidazole ring, a purine ring, a quinoline ring, an isoquinoline group, a quinoxaline ring, a cinnoline ring, a pteridin ring, an acridine ring, a carbazole ring, a carboline ring, a diaza carbazole ring (also referred to as mono-azacarboline, which refers to a ring form in which one of carbon atoms constituting the carboline is replaced by a nitrogen atom), a phenanthridine ring, an acridine ring, a phenanthroline ring, a phenazine ring, a benzo-C-cinnoline ring, a porphyrin ring, a chlorine ring, and a corrin ring.

The group containing the nitrogen-containing aromatic ring may be used in combination. In this regard, the plurality of nitrogen-containing aromatic rings may be directed bonded, or may be bonded through a divalent linking group. Alternatively, the plurality of nitrogen-containing aromatic rings may be condensed.

When the nitrogen-containing aromatic ring has a substituent herein, the substitute is not particularly limited. As for this substituent, examples thereof include alkyl groups (for example, a methyl group, an ethyl group, a propyl group, an isopropyl group, an n-butyl group, a sec-butyl group, a tert-butyl group, a pentyl group, a hexyl group, an oxtyl group, a dodecyl group, a tridecyl group, a tetradecyl group, a pentadecyl group), cycloalkyl groups (for example, a cyclopentyl group, a cyclohexyl group), alkenyl groups (for example, a vinyl group, an allyl group, a 1-propenyl group, a 2-butenyl group, a 1,3-butadienyl group, a 2-pentenyl group, an isopropenyl group), alkynyl groups (for example, an ethynyl group, a propargyl group), aromatic hydrocarbon groups (also referred to as aromatic hydrocarbon ring groups, aromatic carbon ring groups, or aryl groups, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group), aromatic heterocyclic groups [for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diaza carbazolyl group (which refers to a carbolinyl group in which one of any carbon atoms constituting the carboline ring is replaced by a nitrogen atom), a phthalazinyl group], heterocyclic groups (for example, a pyrrolidyl group, an imidazolidinyl group, a morpholyl group, an oxazolyl group), alkoxy groups (for example, a methoxy group, an ethoxy group, a propyloxy group, a pentyloxy group, a hexyloxy group, an octyloxy group, a dodecyloxy group), cycloalkoxy groups (for example, a cyclopentyloxy group, a cyclohexyloxy group), aryloxy groups (for example, a phenoxy group, a naphthyloxy group), alkylthio groups (for example, a methylthio group, an ethylthio group, a propylthio group, a pentylthio group, a hexylthio group, an octylthio group, a dodecylthio group), cycloalkylthio groups (for example, a cyclopentylthio group, a cyclohexylthio group), arylthio groups (for example, a phenylthio group, a naphthylthio group), alkoxycarbonyl groups (for example, a methyloxycarbonyl group, an ethyloxycarbonyl group, a butyloxycarbonyl group, an octyloxycarbonyl group, a dodecyloxycarbonyl group), aryloxycarbonyl groups (for example, a phenyloxycarbonyl group, a naphthyloxycarbonyl group), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octyllaminosulfonyl group, a dodecylaminosulfonyl group, a phenylaminosulfonyl group, a naphthylaminosulfonyl group, a 2-pyridylaminosulfonyl group,), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenyl-carbonyl group, a naphthylcarbonyl group, a pyridylcarbonyl group), acyloxy groups, (for example, an acetyloxy group, an ethylcarbonyloxy group, a butylcarbonyloxy group, an octylcarbonyloxy group, a dodecylcarbonyloxy group, a phenyl carbonyloxy group), amide groups (for example, a methylcarbonylamino group, an ethylcarbonylamino group, a dimethylcarbonylamino group, a propylcarbonylamino group, a pentylcarbonylamino group, a cyclohecylcarbonylamino group, a 2-ethylhexylcarbonylamino group, an octylcarbonylamino group, a dodecylcarbonylamino group, a phenylcarbonylamino group, a naphthylcarbonylamino group), carbamoyl groups (for example, an amonocarbonyl group, a methylamonocarbonyl group, a dimethylamonocarbonyl group, a propylamonocarbonyl group, a pentylaminocarbonyl group, a cyclohexylaminocarbonyl group, an octylaminocarbonyl group, a 2-ethylhexylamonocarbonyl group, a dodecylaminocarbonyl group, a phenylaminocarbonyl group, a naphthylamonocarbonyl group, 2-pyridylaminocarbonyl group), ureido groups, (for example, a methylureido group, an ethylureido group, a pentylureido group, a cyclohexylureido group, an oxtylureido group, a dodecylureido group, a phenylureido group, a naphthylureido group, a 2-pyridylureido group), sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphtylsulfinyl group, a 2-pyridylsulfinyl group), alkylsulfonyl groups (for example, a methylsulfonyl group, an ethylsulfonyl group, a butylsulfonyl group, a cyclohexylsulfonyl group, a 2-ethylhexylsulfonyl group, a dodecylsulfonyl group), arylsulfonyl groups or heteroarylsulfonyl groups (for example, a phenylsulfonyl group, a naphthylsulfonyl group, a 2-pyridylsufonyl group), amino groups (for example, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group), halogen atoms (for example, a fluorine atom, a chlorine atom, an a bromine atom), fluorohydrocarbon groups (for example, a fluoromethyl group, a trifluoromethyl group, a pentafluoroethyl group, pentafluorophenyl group), cyano groups, nitro groups, hydroxy groups, mercapto groups, silyl groups (a trimethylsilyl group, a triisopropylsilyl group, a triphenylsilyl group, a phenylduethylsilyl group), phosphono groups, and polymerizable groups (for example, an acryloyl group, a methacryloyl group, an epoxy group, an oxetane group, an isocyanate group, an alkoxy silane group).

The substituent of the nitrogen-containing aromatic ring is, among these groups, preferably an alkyl group (for example, a methyl group, an ethyl group, a propyl group), or an amino group, and more preferably a methyl group, an amino group, or a dimethylamino group. These substituents may be further substituted by the substituents mentioned above. However, the substituents are not further substituted by the same substituents. More specifically, the substituent alkyl group (alkylene group) is never further substituted by the alkyl group. More specifically, a moiety of the substituent alkyl group (alkylene group) is never substituted by the alkyl group. In addition, these substituents may be bonded to each other to form rings.

In addition, one or more of the hydrogen atoms in the nitrogen-containing aromatic ring may be substituted by an amino group, a dithiocarbamate group, a thioamide group, a cyano group, an isonitrile group, an isocyanate group, or a thioisocyanate group.

Furthermore, the nitrogen-containing aromatic ring may be bonded, through a divalent linking group, to an amino group, a dithiocarbamate group, a thioamide group, a cyano group, an isonitrile group, an isocyanate group, or a thioisocyanate group.

This divalent linking group constituting $A^1$ or $A^3$ is not particularly limited, but examples thereof include (A) alkylene groups having 1 to 20 carbon atoms, (B) cycloalkylene groups having 3 to 20 carbon atoms, (C) arylene groups having 6 to 30 carbon atoms, (D) heteroarylene groups having 1 to 30 carbon atoms, and (E) alkyleneoxy groups having 1 to 20 carbon atoms, or imino groups. The divalent linking groups (A) to (E) mentioned above may have a substituent or no substituent.

The (A) alkylene groups having 1 to 20 carbon atoms are not particularly limited, but straight-chain or branched-chain alkylene groups having 1 to 20 carbon atoms. The alkylene groups include, for example, a methylene group, an ethylene group, a trimethylene group, a tetramethylene group, a propylene group, an ethylethylene group, a pentaethylene group, a hexamethylene group, a heptamethylene group, and an octamethylene group. Among these groups, the straight-chain or branched-chain alkylene groups having 1 to 15 carbon atoms are preferred, and the straight-chain or branched-chain alkylene groups having 1 to 12 carbon atoms are more preferred.

The (B) cycloalkylene groups having 3 to 20 carbon atoms are not particularly limited, but include, for example, a cyclopentylene group, a cyclohexylene group, and a cycloheptylene group.

The (C) arylene groups having 6 to 30 carbon atoms are not particularly limited, but include, for example, an o-phenylene group, a m-phenylene group, a p-phenylene group, a fluorene diyl group, a naphthalene diyl group, an anthracene diyl group, a naphthacene diyl group, a pyrene diyl group, a naphthylnaphthalene diyl group, a biphenyl diyl (for example, a [1,1'-biphenyl]-4,4'-diyl group, a 3,3'-biphenyl diyl group, a 3,6-biphenyl diyl group), a terphenyl diyl group, a quaterphenyl diyl group, a quinquephenyl diyl group, a sexiphenyl diyl group, a septiphenyl diyl group, an octiphenyl diyl group, a noviphenyl diyl group, and a deciphenyl diyl group.

The (D) heteroarylene groups having 1 to 30 carbon atoms are not particularly limited, but include heterocyclic groups containing no nitrogen atom, such as furan, thiophene, benzofuran, dibenzofuran, benzothiophene, dibenzothiophene, benzodithiphene, dithienopyrrole, silafluorene, dithienosilacyclopentadiene, dithienocyclopentadiene, chromone, and intandione. Moreover, the groups include divalent groups derived from the group consisting of heterocyclic aromatic rings (nitrogen-containing aromatic rings) containing a nitrogen atom, such as pyridine, pyrimidine, pyrazine, triazine, carbazole, carboline, diazeacarbazole, pyrrole, quinoline, isoquinoline, quinolone, isoquinolone, piperidine, coumarin, benzimidazole, benzimidazolone, benzoxazole, benzisoxazole, benzoxazolone, benzothiazole, benzothiazolethione, benzothiazolone, benzoisothiazolone, indole, carbazole, pyrazole, imidazole, oxazole, isoxazole, thiazole, isothiazole, indazole, pyridazine, cinnoline, quinazoline, quinazolone, quinoxaline, quinoxalone, phthalazine, acridine, acridone, benzoxazinedione, benzoxazinone, naphthalidine, naphtholactam, quinazolinedione, quinoxalinedion, phthalazinedione, pyridone, phthalazinone, phthalimidine, naphthalimidine, and dioxopyrimidine.

The (E) alkyleneoxy groups having 1 to 20 carbon atoms means "—O-alkylene-" or "-alkylene-O—", and the alkylene group in this case refers to an alkylene group having 1 to 20 carbon atoms. The alkylene group herein having 1 to 20 carbon atoms is not particularly limited, but examples thereof include, for example, alkylene groups as in the case of (1) described above. Above all, straight-chain or branched-chain alkylene groups having 1 to 15 carbon atoms are preferred, and straight-chain or branched-chain alkylene groups having 1 to 12 carbon atoms are more preferred. More specifically, the groups include divalent groups of alkyloxy groups with one hydrogen atom removed therefrom, such as a methoxy group, an ethoxy group, a propyloxy group, an isopropyloxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group, and a 2-methoxyethyloxy group.

When the divalent linking groups (A) to (E) mentioned above have a substituent herein, the substituent is the same as the substituent in the nitrogen-containing aromatic ring mentioned above. However, the substituent in this case is never identical to the divalent linking groups (A) to (E). For example, a moiety of the alkylene group is never substituted by the alkyl group.

The divalent linking group selected from the groups (A) to (E) and imino groups mentioned above is preferably a substituted or unsubstituted arylene group having 6 to 18 carbon atoms, a heteroarylene group having 6 to 18 carbon atoms, or an imino group. More preferably, the linking group is a substituted or unsubstituted phenylene group, or pyridylene group, imino group, or a substituted or unsubstituted divalent group derived from a structure represented by the following general formula (4).

[Chemical Formula 4]

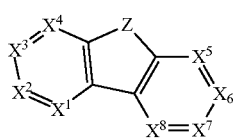

General Formula (4)

In the general formula (4), Z represents —$CR^1R^2$—, —$NR^3$—, —O—, —S—, or —$SiR^4R^5$—. In addition, in the general formula (4), $X^1$ to $X^8$ each independently represent —$CR^6$═ or —N═.

The $R^1$ to $R^6$ each independently represent a single bond (—), a hydrogen atom, (A') an alkyl group having 1 to 20 carbon atoms, (B') a cycloalkyl group having 3 to 20 carbon atoms, (C') an aryl group having 6 to 30 carbon atoms, (D') a heteroaryl group having 1 to 30 carbon atoms, or (E') an alkyloxy group having 1 to 20 carbon atoms. The groups (A') to (E') may have a substituent or no substituent.

The (A') alkyl group having 1 to 20 carbon atoms is not particularly limited, but a straight-chain or a branched-chain alkyl group having 1 to 20 carbon atoms. Examples of the alkyl group include, for example, a methyl group, an ethyl group, an n-propyl group, an isopropyl group, an n-butyl group, an iso-butyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-t-butyl-2-methylpropyl group, an n-nonyl group, a 3,5,5-trimerhylhexyl group, an n-decyl group, an isodecyl group, an n-undecyl group, a 1-methyldecyl group, an n-dodecyl group, an n-hexadecyl group, and a 2-hexyldecyl group. Among these groups, from the perspective of improving the solubility, the alkyl group having 1 to 12 carbon atoms is preferred, and the alkyl group having 1 to 8 carbon atoms is more preferred.

The (B') cycloalkyl group having 3 to 20 carbon atoms is not particularly limited, but examples of the cycloalkyl group include a cyclopropyl group, a cyclopentyl group, a cyclohexyl group, a norbornyl group, and an adamantyl group. Among these groups, from the perspective of improving the solubility, the cycloalkyl group having 4 to 8 carbon atoms is preferred.

The (C') aryl group having 6 to 30 carbon atoms is not particularly limited, but example of the aryl group include, for example, non-condensed hydrocarbon groups such as a phenyl group, a biphenyl group, and a terphenyl group. Further examples thereof include condensed polycyclic hydrocarbon groups such as a pentalenyl group, an indenyl group, a naphthyl group, an azulenyl group, a heptalenyl group, a biphenylenyl group, a fluorenyl group, an acenaphthylenyl group, a pleiadenyl group, an acenaphthenyl group, a phenalenyl group, a phenanthryl group, an anthryl group, a fluoranthenyl group, an acephenanthrylenyl group, an aceanthrylenyl group, a triphenylenyl group, a pyrenyl group, a chrysenyl group, and a naphthacenyl group. Among these groups, from the perspective of improving the solubility, the monocyclic aryl groups are preferred.

The (D') heteroaryl group having 1 to 30 carbon atoms is not particularly limited, but examples of the heteroaryl group include, for example, groups derived from heterocyclic rings containing no nitrogen atom, such as a furanyl group (furyl group), a thiophenyl group (thienyl group), a Sila fluorenyl group, a benzofuranyl group, a dibenzofuranyl group, a benzothiophenyl group, a dibenzothiophenyl group, a dithienopyrrolyl group, a benzodithiophenyl group, a dithieno Sila cyclopentadienyl group, a dithienocyclopentadienyl group, a chromonyl group, and an indadinylonyl group. Further examples thereof include groups derived from heterocyclic aromatic rings containing a nitrogen atom (nitrogen-containing aromatic rings), such as a pyridyl group, a pyrimidyl group, a pyrazinyl group, a triazinyl group, a pyrrolyl group, a quinolyl group, a piperidyl group, a coumarinyl group, a benzimidazolyl group, a benzoxazolyl group, a benzthiazolyl group, an indolyl group, a carbazolyl group, a pyrazolyl group, an imidazolyl group, an oxazolyl group, an isoxazolyl group, a thiazolyl group, an isothiazolyl group, an indazolyl group, a benzothiazolyl group, a pyridazinyl group, a cinnolyl group, a quinazolyl group, a quinazolonyl group, a quinoxalyl group, a quinoxalonyl group, a quinazolinedionyl group, a quinoxalinedionyl group, a dionyl group, a phthalazinyl group, a phthalazinedionyl group, a phthalazonyl group, a phthalamizyl group, a quinolonyl group, an isoquinolonyl group, an isoquinolinyl group, a benzimidazolonyl group, a benzoxazolonyl group, a benzisoxazolyl group, a benzothiazolonyl group, a benzothiazothionyl group, a benzisothiazolyl group, a naphthalimizyl group, a dioxopyrimidinyl group, an acridinyl group, an acridonyl group, a benzoxadinedionyl group, a benzoxadinonyl group, a pyridonyl group, a naphthalidinyl group, and a naphtholactamyl group. Among these groups, from the perspective of improving the solubility, the monocyclic heteroaryl groups are preferred.

The (E') alkyloxy group having 1 to 20 carbon atoms is not particularly limited, but examples of the alkyloxy group include, for example, the alkyl groups mentioned above as examples, which have a root bonded to an oxygen atom. Specific example thereof include a methoxy group, an ethoxy group, a propyloxy group, an isopropyloxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group, and a 2-methoxyethyloxy group. Among these groups, from the perspective of improving the solubility, the alkyloxy groups that have a branched structure are preferred.

In addition, when the groups (A') to (E') have a substituent, the substituent is the same as the substituent in the nitrogen-containing aromatic ring mentioned above. However, the substituent in this case is never identical to the groups (A') to (E'). For example, a moiety of the alkylene group is never substituted by the alkyl group.

The condensed ring structure represented by the general formula (4) has high carrier transport performance, and thus, even when the nitrogen-containing layer 3 composed to include the structure is brought into contact with the semi-insulating layer 21, buffer layer 19, or photoelectric conversion layer 17 of the solar cell 10a, carriers can be sufficiently transported, and the decrease in power generation efficiency can be reduced.

Specific examples of these divalent groups derived from the structure represented by the general formula (4) can include the following groups represented by C-1 to C-8 and groups represented by N-12 to N-36.

[Chemical Formula 5]

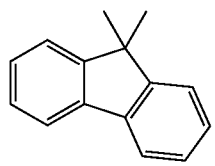
C-1

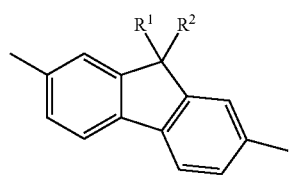
C-2

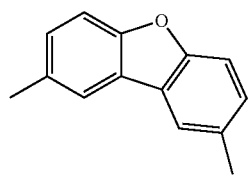
C-3

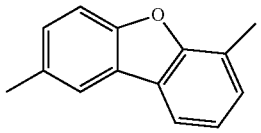
C-4

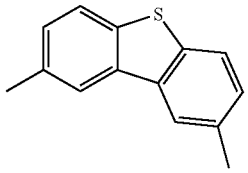
C-5

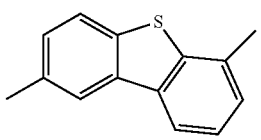
C-6

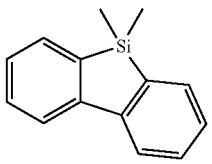
C-7

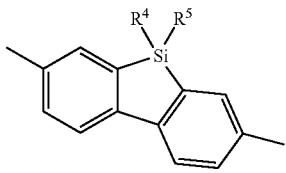
C-8

In the formulas, $R^1$, $R^2$, $R^4$, and $R^5$ are defined as in the general formula (4).

[Chemical Formula 6]

N-12

N-13

N-14

N-15 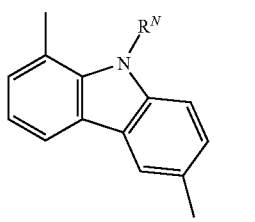
N-16 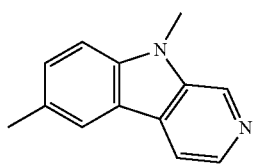
N-17 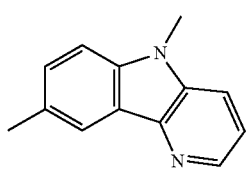
N-18 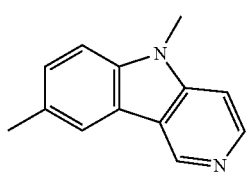
N-19 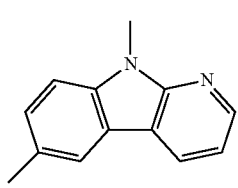
N-20 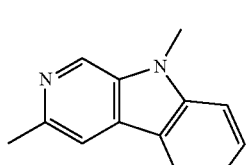
N-21 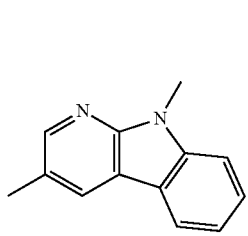
N-22 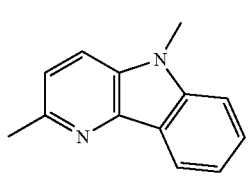
N-23 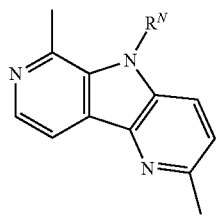
N-24 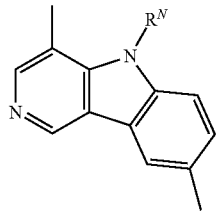
N-25 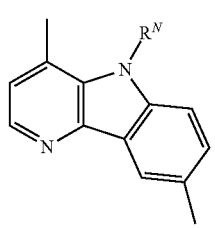
N-26 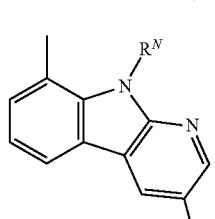
N-27 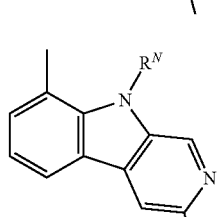
N-28 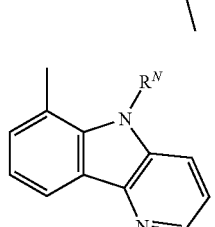
N-29 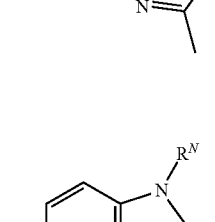
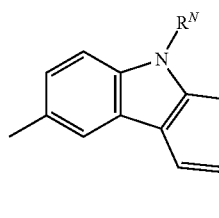

-continued

N-30

N-31

N-32

N-33

N-34

N-35

N-36

In the formulas, $R^N$ is not particularly limited, but examples of which include a hydrogen atom, or the groups exemplified as the substituent in the nitrogen-containing aromatic ring.

Among the structures mentioned above, more preferred structures as the divalent linking group constituting $A^1$ or $A^3$ are the groups (C-1, C-2) having a fluorene mother nucleus that has high electron transport performance, the groups (N-12 to N-15) having a carbazole mother nucleus, and the groups (N-16 to N-34) having an azacarbazole mother nucleus.

<$A^1$ and $A^3$> (No. 2)

The monovalent nitrogen atom-containing group represented by $A^1$ or $A^3$ described above preferably contains, above all, a basic group that which is highly coordinated to the metals of the Group 11. Specifically, the basic group is (a) a group containing a pyridine ring or a pyrimidine ring, (b) an amino group, (c) a dithiocarbamate group or a thioamide group.

(a) Group Containing Pyridine Ring or Pyrimidine Ring

The pyridine ring or pyrimidine ring is a π electron-deficient heterocyclic aromatic ring without any unpaired electrons incorporated in the π conjugated system, and the group containing the ring is highly coordinated to the metals of the Group 11. The (a) group containing a pyridine ring or pyrimidine ring for use herein is specifically, derived from the pyridine ring, the pyrimidine ring, or a condensed ring containing the ring. In this regard, $A^1$ or $A^3$ may be a monovalent group obtained by removing one hydrogen atom from the pyridine ring, the pyrimidine ring, or the condensed ring containing the pyridine or pyrimidine rings. Examples of this group include, for example, groups represented by the following N-1 to N-11.

[Chemical Formula 7]

N-1

N-2

N-3

N-4

N-5

N-6

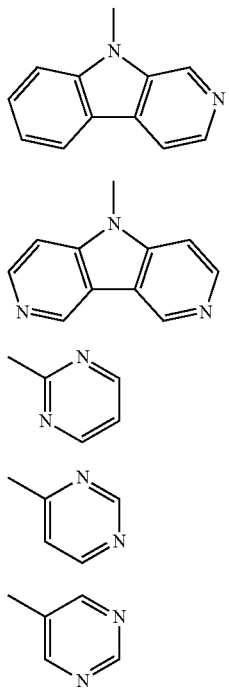

N-7

N-8

N-9

N-10

N-11

Furthermore, $A^1$ or $A^3$ may be a monovalent group obtained by bonding two or more pyridine rings, pyrimidine rings, or condensed rings containing the pyridine or pyrimidine rings directly or through the divalent linking group described above. Alternatively, $A^1$ or $A^3$ may be a monovalent group obtained by bonding one or more pyridine rings, pyrimidine rings, or condensed rings containing the pyridine or pyrimidine rings to other one or more nitrogen-containing aromatic rings other than the rings mentioned above, directly or through the divalent linking group described above. Preferably, $A^1$ or $A^3$ contains a group (pyridine ring-containing group) derived from a group (pyridine ring-containing group) containing a pyridine group. More specifically, $A^1$ or $A^3$ preferably contains the group represented by N-1 to N-8.

In addition, another preferred $A^1$ or $A^3$ is structured to have the monovalent pyridine ring-containing group mentioned above at a terminal of a nitrogen-containing aromatic ring that has a condensed-ring structure such as a carbazole mother nucleus or an azacarbazole mother nucleus with high electron transport performance. This condensed ring structure has high carrier transport performance, and thus, even when the nitrogen-containing layer 3 composed to include the structure is brought into contact with the semi-insulating layer 21, buffer layer 19, or photoelectric conversion layer 17 of the solar cell 10a, carriers can be sufficiently transported, and the decrease in power generation efficiency can be reduced.

The N-12 to N-36 mentioned above and the following N-37 and N-38 are exemplified respectively as the divalent group and trivalent group with the monovalent pyridine ring-containing group linked to terminals thereof, which are derived from the nitrogen-containing aromatic ring which has the condensed-ring structure such as a carbazole mother nucleus or an azacarbazole mother nucleus with high electron transport performance as described above.

[Chemical Formula 8]

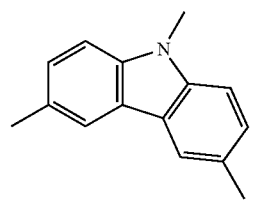

N-37

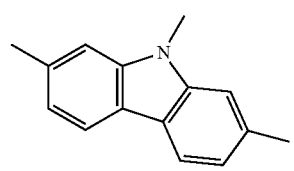

N-38

Examples of $A^1$ or $A^3$ include the monovalent groups represented by the N-1 to N-7 mentioned above, which are bonded, directly or the divalent linking group mentioned above, to one binding site of the divalent group (N-12 to N-36) or two binding sites of the trivalent group (N-37, N-38).

Above all, preferred examples of $A^1$ or $A^3$ include, from the aspect of improving the coordinate to the metals of the Group 11, groups having the pyridyl group (N-1 to N-3) at the periphery of the compound, that is, at the terminal of $A^1$ or the terminal of $A^3$.

The pyridyl group has three types of isomers: a 2-pyridyl group (N-1); 3-pyridyl group (N-2); and 4-pyridyl group (N-3) depending on the position of the nitrogen atom, any of the isomers can be used in a preferred manner, and the 2-pyridyl group (N-1) is highly oriented to, in particular, the metals of the Group 11. Accordingly, more preferably, the groups have the 2-pyridyl group (N-1) at the terminal of $A^1$ or the terminal of $A^3$. In such cases, there is a tendency to provide favorable transparent conductive films. Particularly preferred are groups having a pyridyl group at a terminal of the nitrogen-containing aromatic ring which has the condensed-ring structure such as a carbazole mother nucleus or an azacarbazole mother nucleus.

In particular, in the case of the compounds represented by the general formula (1), $A^1$ preferably has a structure represented by the following formulas N-39 to N-45.

[Chemical Formula 9]

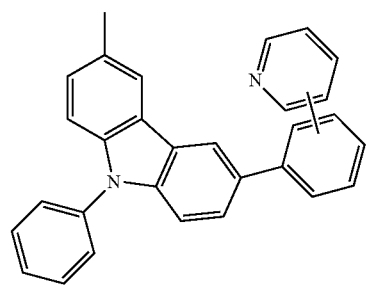

N-39

-continued

N-40
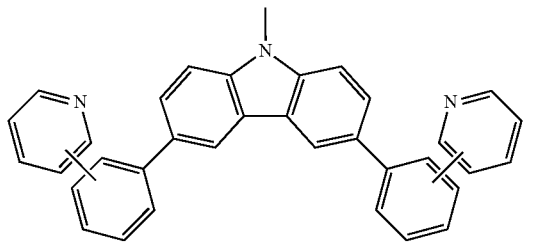

N-41
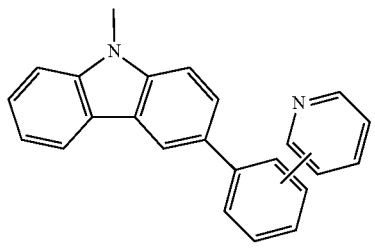

N-42
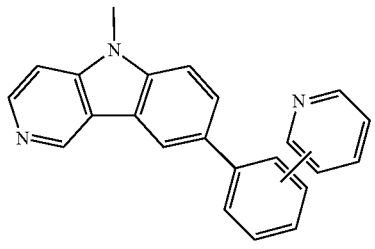

N-43
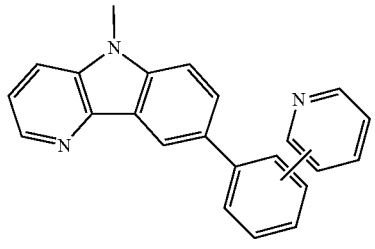

N-44
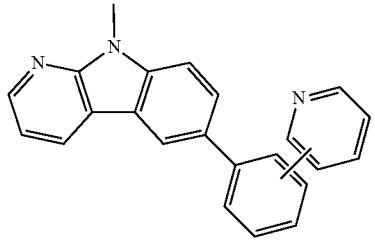

N-45

Furthermore, yet another preferred $A^1$ or $A^3$ is a pyridine ring-containing with one or more of hydrogen atoms therein substituted by an alkyl group having 1 to 4 carbon atoms, which is further partially substituted by an amino group or a dithiocarbamate group. This group is exemplified as, for example, an exemplary compound 225 and an exemplary compound 226 as will be described later. It is to be noted that the alkyl group having 1 to 4 carbon atoms is a methyl group, an ethyl group, a propyl group, an isopropyl group, an n-butyl group, a sec-butyl group, or tert-butyl group.

(b) Amino Group

As for the amino group, a molecule having the amino group preferably has no electron withdrawing group in a position near the amino group. The amino group is highly coordinated to the metals of the Group 11. The amino group may be any of primary amino groups, secondary amino groups, tertiary amino groups, and quaternary amino groups (ammonium groups). However, the neutral primary amino groups, secondary amino groups, and tertiary amino groups are preferred because the groups are favorably coordinated to metal atoms. Furthermore, the tertiary amino groups are preferred from the perspective of solubility and coatability. In addition, because the tertiary amino groups have no highly polar NH groups, polar solvents such as moisture are unlikely to remain in films, and there is a tendency to improve the durability of transparent electrodes and solar cells obtained.

It is to be noted that the fact that the amino group is a quaternary amino group (ammonium group) means that the amino group has the form of a salt, as indicated by, for example, the following exemplary compound 220. More specifically, the nitrogen-containing compound according to the invention of the present application also encompasses cases where the amino group as a nitrogen atom-containing group has the form of a salt. Examples of the anion forming a salt with the quaternary amino group (ammonium group) herein include, but not limited to, halogen atoms (fluorine atoms, chlorine atoms, and bromine atoms), sulfate ions, nitrate ions, tetrafluoroborate ions, and hexafluorophosphate. Among these anions, the halogen atoms are preferred, and above all, bromine atoms are preferred.

$R^A$ to $R^C$ in the secondary amino groups ($-NHR^A$), tertiary amino groups ($-NR^AR^B$), and quaternary amino groups ($-N^+R^AR^BR^C$) represents a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms. These groups, including their substituents, are defined in the same manner as the (A') to (D') in the general formula (4).

The $R^A$ and $R^B$ in the tertiary amino groups may, and the $R^A$, $R^B$, and $R^C$ in the quaternary amino groups may be identical to, or different from each other. In addition, when the nitrogen-containing compound has a plurality of amino groups, the respective pieces of $R^A$, $R^B$, and $R^C$ may be identical to each other or different from each other.

Furthermore, the $R^A$, $R^B$, and $R^C$ are preferably as sterically small as possible from the perspective of metal atom coordination. Specifically, the $R^A$, $R^B$, and $R^C$ are preferably a substituted or unsubstituted alkyl group having 1 to 12 carbon atoms, a substituted or unsubstituted cycloalkyl group having 3 to 12 carbon atoms, a substituted or an unsubstituted aryl groups having 6 to 12 carbon atoms, or a substituted or unsubstituted heteroaryl group having 4 to 12 carbon atoms. Above all, substituted or unsubstituted alkyl groups having 1 to 8 carbon atoms and substituted or unsubstituted heteroaryl groups having 4 to 6 carbon atoms are more preferred. Further preferably, the groups are a substituted or unsubstituted alkyl group having 1 to 4 carbon atoms (particularly preferably, a methyl group, an ethyl group, a propyl group, a tert-butyl group), or a group derived from a substituted or unsubstituted nitrogen-containing aromatic ring having 4 to 6 carbon atoms (particularly preferably, a pyridyl group).

In addition, a form is also preferred in which at least one of the $R^A$, $R^B$, and $R^C$ is an alkyl group, a cycloalkyl group, an aryl group, or a heteroaryl group. This is because the coordination interaction with metal atoms can be increased, as long as the nitrogen-containing compound has a high density of amino groups. Further, in this case, the form is also preferred in that the solubility of the nitrogen-containing compound in solvents and the coatability of a solution with the nitrogen-containing compound dissolved therein can be improved, and further, the durability of the nitrogen-containing layer 3 composed with the use of the nitrogen-containing compound can be improved.

It is effective to apply or form the nitrogen-containing layer 3 under nitrogen without moisture or oxygen in order to provide the nitrogen-containing layer 3 with high durability, while the application under nitrogen has the problem of being likely to generate cissing. However, the increased number (density) of amino groups in the nitrogen-containing compound can suppress the generation of cissing even in the application or formation under nitrogen. Moreover, the nitrogen-containing compounds containing the amino groups are dissolved in highly polar organic solvents such as alcohols and fluorinated alcohols, and can be thus applied directly onto the photoelectric conversion layer 17 which is not dissolved in highly polar solvents to easily form the nitrogen-containing layer 3.

For example, at least one of the $R^A$, $R^B$, and $R^C$ is preferably a group represented by the following general formula (5). In the case of using this type of nitrogen-containing compound having an amino group with second-generation branches or more, a high density of amino groups can be made present uniformly at the surface of the nitrogen-containing layer 3 composed of the nitrogen-containing compound, and the coordination interaction with metal atoms of the electrode layer 5 laminated on the surface can be further enhanced.

[Chemical Formula 10]

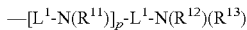
$$—[L^1-N(R^{11})]_p-L^1-N(R^{12})(R^{13})$$ General Formula (5)

In the general formula (5), $L^1$ represents a divalent linking group selected from substituted or unsubstituted alkylene groups having 1 to 20 carbon atoms, substituted or unsubstituted cycloalkylene groups having 3 to 20 carbon atoms, substituted or unsubstituted arylene groups having 6 to 30 carbon atoms, substituted or unsubstituted heteroarylene groups having 1 to 30 carbon atoms, and substituted or unsubstituted alkyleneoxy groups having 1 to 20 carbon atoms. These groups mentioned above, including their substitutes, are defined in the same manner as the (A) to (E) in the divalent linking group.

Above all, $L^1$ is preferably a substituted or unsubstituted alkylene group having 1 to 8 carbon atoms, and more preferably a methylene group, an ethylene group, a trimethylene group, or a tetramethylene group. It is to be noted that in the general formula (5), p is an integer of 0 or more, and when p is 1 or more, the plurality of pieces $L^1$ may be identical to each other, or different from each other.

Further, in the general formula (5), $R^{11}$ to $R^{13}$ represents a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 1 to 30 carbon atoms, or a group represented by the general formula (5). $R^{11}$ to $R^{13}$ may be identical to, or different from each other. The alkyl group, cycloalkyl group, aryl group, and heteroaryl group mentioned above, including their substituents, are defined in the same manner as the (A') to (D') in the general formula (4), and descriptions of the groups will be thus omitted.

Above all, the $R^{11}$ to $R^{13}$ mentioned above are preferably a hydrogen atom, an alkyl group having 1 to 8 carbon atoms, or a group represented by the general formula (5). Moreover, the $R^{11}$ to $R^{13}$ mentioned above are more preferably a hydrogen atom, an alkyl group having 1 to 3 carbon atoms (a methyl group, an ethyl group, a propyl group, an isopropyl group), or a group represented by the general formula (5). Particularly preferably, from the perspective of further improving the coordination interaction with metal atoms, $R^{12}$ or $R^{13}$ at the end is preferably a hydrogen atom or a methyl group.

In the general formula (5), p is an integer of 0 or more, which indicates the number of repetitions $[L^1-N(R^{11})]$ in the general formula (5), and can be selected appropriately depending on a desired number of amino groups. For example, p is preferably an integer of 0 to 5, more preferably an integer of 0 to 3, and particularly preferably 0 or 1.

Moreover, the amino group as $A^1$ or $A^3$ may have a structure (including the form of a salt) represented by the following general formula (6).

[Chemical Formula 11]

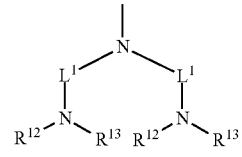

General Formula (6)

In addition, a form is also preferred in which as another preferred $A^1$ or $A^3$, at least one of the $R^A$, $R^B$, and $R^C$ in the secondary amino group (—NHR$^A$), tertiary amino group (—NR$^A$R$^B$), and quaternary amino group (—N$^+$R$^A$R$^B$R$^C$) is an alkyl group, a cycloalkyl group, an aryl group, or a heteroaryl group, which is substituted by a dithiocarbanate group as will be described later. This is because the coordination interaction with metal atoms can be increased when there is a high density of amino groups and dithiocarbamate groups. More preferably, at least one of the $R^A$, $R^B$, and $R^C$ is an alkyl group having 1 to 8 carbon atoms, which is substituted by a dithiocarbanate group as will be described later. This group is exemplified as, for example, an exemplary compound 232 as will be described later.

(c) Dithiocarbanate Group or Thioamide Group

The dithiocarbamate group or thioamide group is a monovalent group derived from a dithiocarbamate or a thioamide, which has a sulfur atom highly coordinated specifically to the metals of the Group 11. The dithiocarbamate group or the thioamide group each has two types of isomers depending on the substitution position.

In the case of the dithiocarbamate group, one of the isomers has the form of [—N(R$^D$)—C(=S)—S—R$^E$] with a nitrogen atom linked to other group, where the other thereof has the form of [—S—C(=S)—NR$^E$R$^C$] with a sulfur atom linked to other group.

In addition, in the case of the thioamide group, one of the isomers has the form of [—N($R^H$)—C(=S)—S—$R^I$] with a nitrogen atom linked to other group, where the other thereof has the form of [—C(=S)—N$R^JR^K$] with a carbon atom linked to other group.

In the present invention, any form of the four mentioned above can be used in a preferred fashion as the monovalent nitrogen atom-containing group represented by $A^1$ or $A^3$ in the general formula (1) or general formula (3). Preferably, the group is a dithiocarbanate group having more than one sulfur atom, more preferably, a dithiocarbamate group in the form with a sulfur atom linked to other group. The form has a tendency to achieve favorable durability, with polar solvents such as moisture less likely to remain in films.

$R^D$ and $R^F$ to $R^K$ in the dithiocarbamate group or the thioamide group represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

In addition, $R^E$ represents a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 1 to 30 carbon atoms, or an alkyl metal atom (e.g., Li, Na, K).

The $R^D$ and $R^E$ as well as $R^F$ and $R^G$ in the dithiocarbamate group may be, and further, the $R^H$ and $R^I$ as well as $R^H$ and $R^K$ in the thioamide group may be identical to, or different from each other. In addition, when the nitrogen-containing organic compound has more than one dithiocarbamate group or thioamide group, the respective pieces of $R^D$ to $R^K$ may be identical to, or different from each other. The alkyl group, cycloalkyl group, aryl group, and heteroaryl group, including their substituents, are defined in the same manner as the (A') to (D') in the general formula (4).

Among these groups, $R^D$ to $R^K$ are preferably as sterically small as possible from the perspective of metal atom coordination. Specifically, $R^D$ and $R^F$ to $R^K$ are preferably a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms, or a substituted or unsubstituted heteroaryl group having 4 to 12 carbon atoms. Furthermore, $R^D$ and $R^F$ to $R^K$ are more preferably a hydrogen atom, a substituted or unsubstituted alkyl group having 1 to 8 carbon atoms, or a substituted or unsubstituted heteroaryl group having 4 to 6 carbon atoms. Further preferably, $R^D$ and $R^F$ to $R^K$ are a hydrogen atom, a substituted or unsubstituted alkyl group having 1 to 4 carbon atoms (particularly preferably, a methyl group, an ethyl group, a propyl group, a tert-butyl group), or a group (particularly preferably, a pyridyl group) derived from a substituted or unsubstituted nitrogen-containing aromatic ring having 4 to 6 carbon atoms.

In addition, $R^E$ is preferably a hydrogen atom, a substituted or unsubstituted alkyl group having 1 to 12 carbon atoms, a substituted or unsubstituted heteroaryl group having 4 to 12 carbon atoms, or an alkali metal atom. Moreover, $R^E$ is more preferably a hydrogen atom, a substituted or unsubstituted alkyl group having 1 to 8 carbon atoms, a substituted or unsubstituted heteroaryl group having 4 to 6 carbon atoms, or an alkali metal atom. Further preferably, $R^E$ is a hydrogen atom, a substituted or unsubstituted alkyl group having 1 to 4 carbon atoms (particularly preferably, a methyl group, an ethyl group, a tert-butyl group), a group (particularly preferably, pyridyl group) derived from a substituted or unsubstituted nitrogen-containing aromatic ring having 4 to 6 carbon atoms, or an alkali metal atom (in particular, a sodium atom (Na)).

In addition, a form is also preferred in which at least one of the $R^D$ to $R^G$ of the dithiocarbamate group ([—N($R^D$)—C(=S)—S—$R^E$] or [—S—C(=S)—N$R^FR^G$]) is an alkyl group, a cycloalkyl group, an aryl group, or a heteroaryl group, which is substituted by a dithiocarbamate group.

This is because the coordination interaction with metal atoms per unit area can be increased, as long as the nitrogen-containing compound has a high density of dithiocarbamate groups coordinated to a metal of the Group 11.

Furthermore, the nitrogen-containing compound constituting the nitrogen-containing layer 3 preferably has a form such as hyperbranched polymer (a form with second-generation branches or more). With such a perspective, in a dithiocarbamate group preferred as the monovalent nitrogen atom-containing group represented by $A^1$ or $A^3$, at least one of the $R^D$, $R^F$, and $R^G$ is an alkyl group, a cycloalkyl group, an aryl group, or a heteroaryl group which is substituted by a dithiocarbamate group.

For example, at least one of the $R^D$, $R^F$, and $R^G$ is preferably a group represented by the following general formula (7) or a group represented by the following general formula (8).

[Chemical Formula 12]

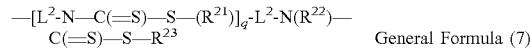

General Formula (7)

[Chemical Formula 13]

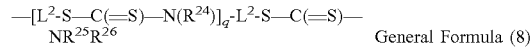

General Formula (8)

In the case of using the nitrogen-containing compound having a thiocarbamate group with second-generation branches or more as described above, a high density of thiocarbamate groups can be made present uniformly at the surface of the nitrogen-containing layer 3 composed with the use of the nitrogen-containing compound, and the coordination interaction with metal atoms constituting the electrode layer 5 laminated on the surface can be further enhanced.

In the general formula (7) and the general formula (8), $L^2$ represents a divalent linking group selected from substituted or unsubstituted alkylene groups having 1 to 20 carbon atoms, substituted or unsubstituted cycloalkylene groups having 3 to 20 carbon atoms, substituted or unsubstituted arylene groups having 6 to 30 carbon atoms, substituted or unsubstituted heteroarylene groups having 1 to 30 carbon atoms, and substituted or unsubstituted alkyleneoxy groups having 1 to 20 carbon atoms. These groups, including their substituents, are defined in the same manner as the (A) to (E) in the divalent linking group mentioned above.

Above all, the $L^2$ is preferably a substituted or unsubstituted alkylene group having 1 to 8 carbon atoms, and more preferably a methylene group, an ethylene group, a trimethylene group, or a tetramethylene group.

In addition, in the general formula (7), $R^{21}$ and $R^{23}$ each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 1 to 30 carbon atoms, an alkali metal atom, or a group represented by the general formula (7) or the general formula (8).

In addition, $R^{22}$ in the general formula (7) and $R^{24}$ to $R^{26}$ in the general formula (8) each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms, or a group represented by the general formula (7) or the general formula (8).

The $R^{21}$ to $R^{26}$ may be identical to, or different from each other.

In addition, the alkyl group, cycloalkyl group, aryl group, and heteroaryl group constituting the $L^2$ and $R^{21}$ to $R^{26}$ mentioned above, including their substituents, are defined in the same manner as the (A') to (D') in the general formula (4). The alkali metal atoms constituting the $R^{21}$ and $R^{23}$ are defined in the same manner as in the $R^E$ constituting the dithiocarbamate group or the thioamide group.

Above all, the $R^{21}$ and $R^{23}$ are each independently a hydrogen atom, an alkali metal atom, an alkyl group having 1 to 8 carbon atoms, or a group represented by the general formula (7) or the general formula (8). More preferably, the $R^{21}$ and $R^{23}$ are an alkali metal atom (Na, K), an alkyl group having 1 to 3 carbon atoms (a methyl group, an ethyl group, a propyl group, an isopropyl group), or a group represented by the general formula (7) or the general formula (8).

In addition, the $R^{22}$ and $R^{24}$ to $R^{26}$ are each independently a hydrogen atom, an alkyl group having 1 to 8 carbon atoms, or a group represented by the general formula (7) or the general formula (8). More preferably, the $R^{22}$ and $R^{24}$ to $R^{26}$ are a hydrogen atom, an alkyl group having 1 to 3 carbon atoms (a methyl group, an ethyl group, a propyl group, an isopropyl group), or a group represented by the general formula (7) or the general formula (8). Particularly preferably, from the perspective of further improving the coordination interaction with metal atoms, $R^{25}$ or $R^{26}$ at the end is preferably a hydrogen atom or a methyl group.

In the general formula (7) and the general formula (8), q is an integer of 0 or more, which indicates the number of repetitions [$L^2$-N—C(=S)—S—($R^{21}$)] in the general formula (7) or the number of repetitions [$L^2$-S—C(=S)—S—N($R^{24}$)] in the general formula (8). This q can be selected appropriately depending on a desired number of dithiocarbamate groups. For example, q is preferably an integer of 0 to 5, more preferably an integer of 0 to 3, and particularly preferably 0 or 1.

More specifically, the dithiocarbamate group as preferred $A^1$ or $A^3$ has the following structures S-1 to S-4.

[Chemical Formula 14]

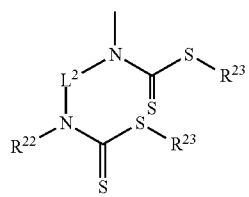

S-1

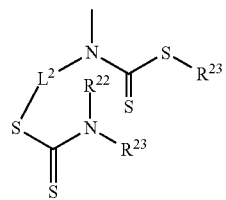

S-2

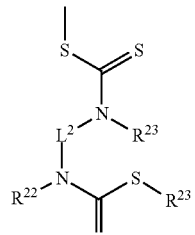

S-3

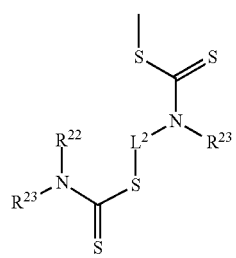

S-4

Above all, the dithiocarbamate group preferred as $A^1$ or $A^3$ has excellent interaction with metal atoms, and has the form with a sulfur atom linked to other group, from the perspective of promoting VM-type film growth in the film formation for the electrode layer 5, a group represented by S-3 or S-4 is preferred for the dithiocarbamate group.

On the other hand, from the perspective of synthesizing the nitrogen-containing compound, a group represented by S-1 or S-2 is preferred which is a compound derived from an amino group.

Among the above-described groups applied as $A^1$ and $A^3$, the (a) group containing a pyridine group or a pyrimidine group is preferred as $A^1$ in the general formula (1), in terms of coordination bond force with the metals of the Group 11.

On the other hand, the $A^3$ in the general formula (3) is preferably the (b) amino group, or (c) dithiocarbamate group or thioamide group, in terms of the increased density of substituents that can be coordinated to a metal of the Group 11. Moreover, the $A^3$ is preferably a pyridine ring-containing ring group partially substituted by an alkyl group having 1 to 4 carbon atoms, with the alkyl group further partially substituted by a pyridineamino group, a dithiocarbamate group, or a thioamide group.

More specifically, there is a tendency for undelocalized lone pair electrons of a nitrogen-containing heterocyclic aromatic ring to have a higher coordination bond force, while there is a limit on high-density integration in a molecule because of having the ring structure. On the other hand, the amino group and the dithiocarbamate group are relatively small substituents, and presumed to have a tendency to be capable of placement of substituents capable of high-density coordination to a metal of the Group 11 at a molecular surface layer, like a dendrimer or a hyperbranched polymer. As a result, any of the structures can similarly produce a film growth effect of single-layer growth type (Frank-van der Merwe: FW type) due to the coordination to a metal of the Group 11.

<A², A⁴, or A⁵>

In the general formula (2) or (3), the divalent nitrogen atom-containing group represented by A², A⁴, or A⁵ is used without any particular limitation, as long as the group is an organic group containing a nitrogen atom. Examples of the group include, for example, groups containing an imino group (—NR—), an amide group (—CO—NR—), an imide group (—CO—NR—CO—), a sulfoneamide group (—SO₂—NR—), an oxime group (>C=N—OH), or a nitrogen-containing aromatic ring. The nitrogen-containing aromatic ring may have a substituent or no substituent.

In this regard, the nitrogen-containing aromatic rings and substituents exemplified for the A¹ or A³ are applied as the nitrogen-containing aromatic ring constituting A², A⁴, or A⁵, and the substituent thereof. In addition, one or more of hydrogen atoms in the nitrogen-containing aromatic ring may be substituted by an amino group, a dithiocarbamate group, a thioamide group, a cyano group, an isonitrile group, an isocyanate group, or a thioisocyanate group. Furthermore, the nitrogen-containing aromatic ring may be bonded through a divalent linking group to an amino group, a dithiocarbamate group, a thioamide group, a cyano group, an isonitrile group, an isocyanate group, or a thioisocyanate group.

The group containing the nitrogen-containing aromatic ring may have the plurality of nitrogen-containing aromatic rings used in combination. In this regard, the plurality of nitrogen-containing aromatic rings may be bonded directly, or bonded through a divalent linking group.

The respective divalent linking groups for bonding the nitrogen-containing aromatic rings are defined in the same manner as the divalent linking group constituting the A¹ or A³.

A preferred divalent nitrogen atom-containing group represented by A², A⁴, or A⁵ contains a basic group which is highly coordinated to the metals of the Group 11. Specifically, (a') a group containing a pyridine group or a pyrimidine group, (b') a group containing an amino group, or (c') a group containing a dithiocarbamate group or a thioamide group is preferred.

(a') Group Containing Pyridine Group or Pyrimidine Group

Specific forms are common except that one hydrogen atom is further removed from the groups exemplified as the (a) monovalent group containing a pyridine group or a pyrimidine group in A¹ or A³ to provide divalent groups, and descriptions of the forms will be thus omitted.

The (a') group containing a pyridine group or a pyrimidine group, which is more preferred as A², A⁴, or A⁵, contains a group (pyridine ring-containing ring) derived from a pyridine ring-containing ring, further preferably contains a group derived from a pyridine group. Examples of the group derived from a pyridine group include, for example, the following divalent groups derived from pyridine rings (pyridinylene groups: N-46 to N-48), in addition to the divalent groups represented by the N-16 to N-36.

[Chemical Formula 15]

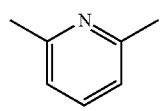

N-46

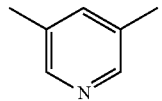

N-47

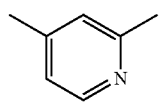

N-48

Another preferred divalent nitrogen atom-containing group represented by A², A⁴, or A⁵ contains a divalent group derived from a nitrogen-containing aromatic ring which has an electron-transporting condensed ring structure such as a carbazole mother nucleus or an azacarbazole mother nucleus. Specifically, the nitrogen atom-containing group preferably contains a divalent group represented by the N-12 to N-36.

Because of high carrier transport performance when the group has this condensed ring structure, even when the nitrogen-containing layer 3 is brought into contact with the photoelectric conversion layer 17, the buffer layer 19, or the semi-insulating layer 21, carriers can be sufficiently transported, and as a result, the decrease in power generation efficiency can be reduced. Above all, preferably, from the perspective of improving the coordination to the metals of the Group 11, it is preferable to contain a divalent group represented by the N-16 to N-36, which has an azacarbazole mother nucleus.

The main chain structure of yet another preferred A², A⁴, or A⁵ preferably has a nitrogen-containing aromatic ring which has a condensed ring structure such as highly electron-transporting carbazole mother nucleus or azacarbazole mother nucleus, and the side chain part thereof preferably has a monovalent group derived from a pyridine ring, that is, a pyridyl group (N-1 to N-3). When the main chain structure has this condensed ring structure, the coordination to the metals of the Group 11 and the carrier transport performance are improved, and the decrease in power generation efficiency can be reduced. For example, it is preferable to contain a structure represented by the following formulas N-49 to N-56.

[Chemical Formula 16]

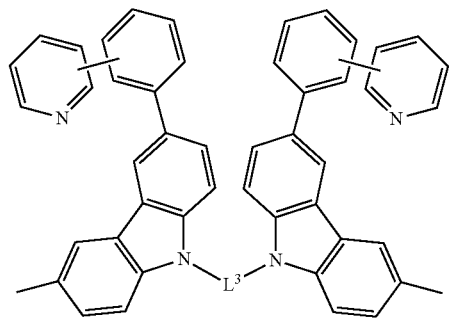

N-49

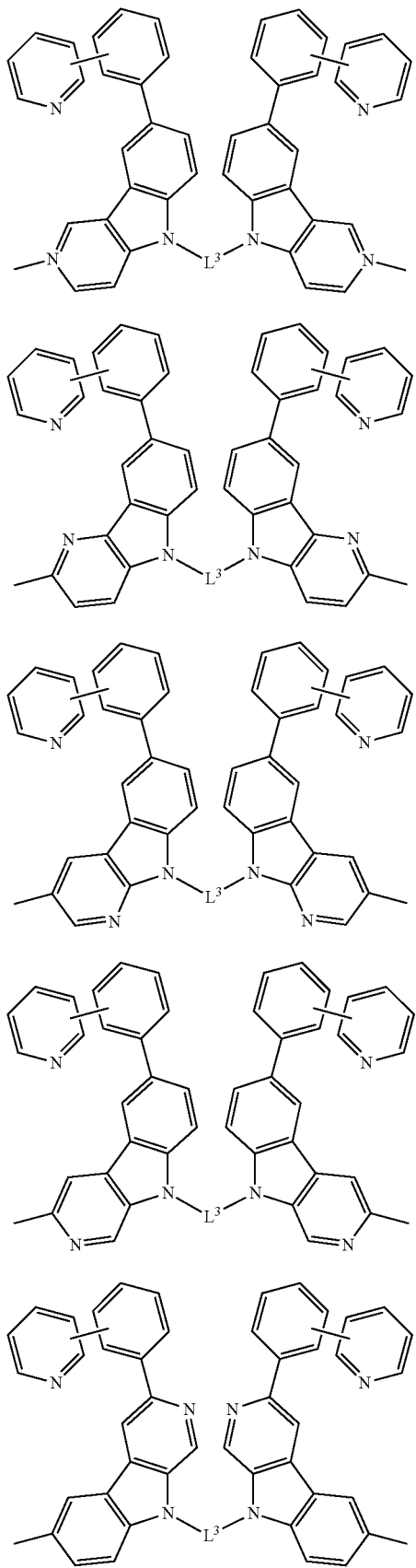

N-50

N-51

N-52

N-53

N-54

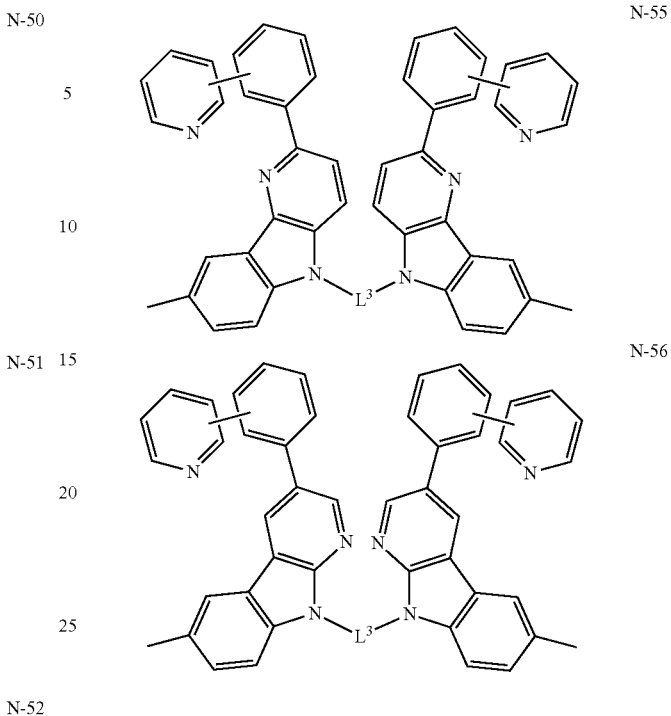

N-55

N-56

In the N-49 to N-56, $L^3$ represents a divalent linking group selected from substituted or unsubstituted alkylene groups having 1 to 20 carbon atoms, substituted or unsubstituted cycloalkylene groups having 3 to 20 carbon atoms, substituted or unsubstituted arylene groups having 6 to 30 carbon atoms, substituted or unsubstituted heteroarylene groups having 1 to 30 carbon atoms, and substituted or unsubstituted alkyleneoxy groups having 1 to 20 carbon atoms.

Among these groups, the alkylene groups, the cycloalkylene groups, the arylene groups, and the alkyleneoxy groups, including their substituents, are defined in the same manner as the (A) to (E) in the divalent linking group constituting $A^1$ of $A^3$. In particular, the heteroarylane groups are preferably substituted or unsubstituted arylene groups having 6 to 12 carbon atoms, and substituted or unsubstituted heteroarylene groups having 1 to 12 carbon atoms, and more preferably phenylene groups and pyridinylene groups.

(b') Group Containing Amino Group or (c') Group Containing Dithiocarbamate Group or Thioamide Group These groups include groups in which one or more of hydrogen atoms of a divalent group derived from a nitrogen-containing aromatic ring are substituted by an alkyl group having 1 to 4 carbon atoms, with the alkyl group further partially substituted by an amino group, a dithiocarbamate group, or a thioamide group. As the alkyl group in this case, a methyl group, an ethyl group, a propyl group, an isopropyl group, an n-butyl group, a sec-butyl group or a tert-butyl group is used.

Above all, the main chain structure of $A^2$, $A^4$, or $A^5$ has a nitrogen-containing aromatic ring (the N-12 to N-36 mentioned above) which has a condensed ring structure such as a highly electron-transporting carbazole mother nucleus or azacarbazole mother nucleus. Further, a group is preferred in which one or more of hydrogen atoms of the nitrogen-containing aromatic ring are substituted by an alkyl group having 1 to 4 carbon atoms, with the alkyl group further partially substituted by an amino group or a dithiocarbamate group.

It is to be noted that a methyl group, an ethyl group, a propyl group, an n-butyl group, or a tert-butyl group is used as the alkyl group in this case.

Groups represented by the following N-57 and N-58 are exemplified as such $A^2$, $A^4$, or $A^5$.

[Chemical Formula 17]

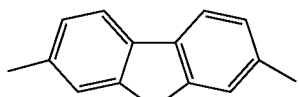
N-57

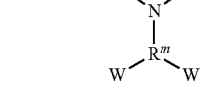

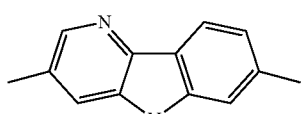
N-58

In the formulas, $R^m$ is a trivalent group derived from an alkyl chain having 1 to 12 carbon atoms. Specifically, examples of $R^m$ include an ethanetriyl group, a propanetriyl group, a butanetriyl group, a pentanetriyl group, a hexanetriyl group, a heptanetriyl group, an octanetriyl group, a nonanetriyl group, a decanetriyl group, an undecanetriyl group, and a dodecanetriyl group.

In the formulas, W is an amino group, a dithiocarbamate group, an alkyl group having 1 to 4 carbon atoms, which is substituted by an amino group or a dithiocarbamate group. The alkyl group in this case is a methyl group, an ethyl group, a propyl group, an isopropyl group, an n-butyl group, a sec-butyl group, or a tert-butyl group. In addition, the amino group and the dithiocarbamate group have the same forms as the amino group and dithiocarbamate group in $A^1$ and $A^3$.

In addition, a group which has a polyalkyleneimine structure is exemplified as another preferred form when the divalent nitrogen atom-containing group represented by $A^2$, $A^4$, or $A^5$ is the (b') group containing an amino group.

In the present invention, the polyalkyleneimine means a straight-chain or polymer having an aminoalkylene group as a repeating unit. t is to be noted that the polyalkyleneimine is considered to also encompass therein oligomers such as dimers and trimers in this specification.

The structure of a polyethyleneimine that is a branched-chain polymer with an aminoethylene group as a repeating unit is shown below as an example of the polyalkyleneimine for use in the present form.

[Chemical Formula 18]

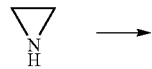 →

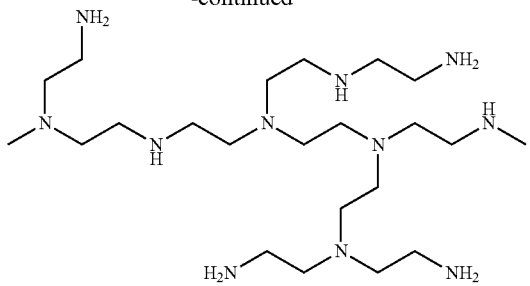

The polyethyleneimide shown above contains a primary amino group [$NH_2$—$CH_2CH_2$—], a secondary amino group [NH—($CH_2CH_2$—)$_2$], and a tertiary amino group [N—($CH_2CH_2$—)$_3$]. Among these groups, the primary amino group constitutes a terminal of the chain, and the tertiary amino group constitutes a bifurcation of the chain.

The polyalkyleneimine in the present form is not particularly limited as long as the polyalkyleneimine is a polymer having an aminoalkylene group as a repeating unit as described above. Examples of the alkylene group contained in the aminoalkylene group include, for example, amethylene group, an ethylene group, a trimethylene group, a propylene group, a tetramethylene group, and a 1,2-dimethylethylene group. Among these groups, the ethylene group, trimethylene group, and propylene group are preferred from the perspective of ease of synthesis and availability, or from the perspective of compatibility in application liquid.

It is to be noted that the terminal structure of the polyalkyleneimine in the present form can be typically a primary amino group (—$NH_2$) or an alkyl group (for example, a methyl group, an ethyl group, an n-propyl group, an isopropyl group, an n-butyl group).

In addition, the polyalkyleneimine in the present form is not to be considered limited to the branched-chain structure shown above, but may have a straight chain form containing no tertiary amino group, while a branched-chain polyalkyleneimine is preferred from the perspective of improvement in interaction with metal atoms in the formation of the electrode layer 5.

In addition, the branched structure in the case of the branched-chain polyalkylimine may be a net-like structure, or may be a dendritic structure like dendrimers and hyperbranched polymers. However, preferably, the dendritic structure is preferred for improving the coordination of the metals of the Group 11 to nitrogen atoms. In the case of the dendritic structure, there is a large number of amino groups at dendritic terminals (side chain parts), a high density of amino groups can be made present uniformly at the surface layer of the nitrogen-containing layer 3, and the coordination interaction with the metals of the Group 11 can be further enhanced.

In the case of the branched-chain polyalkyleneimine, there is no particular limit on the content rates for each of the primary amino group, secondary amino group, and tertiary amino group.

It is to be noted that when $A^2$ has a polyalkylene imine structure in a polymer having a structural unit represented by the general formula (2), the terminal of $A^2$ in the polymer is typically amino group. However, the terminal may be a group (for example, an alkyl group, an acyl group, a C(═S)S—R group: R is an alkyl group such as a methyl group or an ethyl group) other than as a matter of course.

This also applies to $A^4$ and $A^5$ in a polymer having a structural unit represented by the general formula (3).

<$Y^1$ in General Formula (1)>

As $Y^1$ in the general formula (1), an n1-valent organic group is applied without any particular limitation, and examples of the group include, for example, substituted or unsubstituted n1-valent aromatic residues or substituted or unsubstituted n1-valent aliphatic hydrocarbon groups. The "aromatic residue" herein means a group of an aromatic ring such as an aromatic hydrocarbon ring, a heterocyclic aromatic ring, or a condensed aromatic ring, with n1 hydrogen atoms removed therefrom. In addition, the "aliphatic hydrocarbon residue" means a group of an aliphatic hydrocarbon with n1 hydrogen atoms removed therefrom.

The n1-valent aromatic residue applies as $Y^1$ is not particularly limited. Above all, examples of the aromatic residue applied as $Y^1$ when n1 is 2 include, for example, substituted or unsubstituted arylene groups having carbon atoms 6 to 30, and substituted or unsubstituted heteroarylene groups having carbon atoms 1 to 30. These arylene groups and heteroarylene groups, including their substituents, are defined in the same manner as (C) and (D) in the divalent linking group constituting the $A^1$ or $A^3$.

Examples of the aromatic residue with n1 of 3 or more include the arylene groups or heteroarylene groups with one or more hydrogen atoms further removed therefrom.

The n1-valent aliphatic hydrocarbon residue applied as $Y^1$ is not particularly limited. Above all, examples of the aliphatic hydrocarbon residue applied as $Y^1$ when n1 is 2 include, for example, substituted or unsubstituted alkylene groups having 1 to 20 carbon atoms and substituted or unsubstituted cycloalkylene groups having 3 to 20 carbon atoms. These alkylene groups and cycloalkylene groups, including their substituents, are defined in the same manner as (A) and (B) in the divalent linking group constituting the $A^1$ or $A^3$.

Examples of the aliphatic hydrocarbon residue with n1 of 3 or more include the alkylene groups or cycloalkylene groups with one or more hydrogen atoms further removed therefrom.

When the aromatic residue or the aliphatic hydrocarbon residue has a substituent, the substituent is not particularly limited, but similarly preferred examples of the substituent include the substituents exemplified for the $A^1$ or $A^3$.

Preferred examples of $Y^1$ just described above include, when n1 is 1, substituted or unsubstituted aryl groups having 6 to 12 carbon atoms and substituted or unsubstituted heteroaryl groups having 1 to 12 carbon atoms. In addition, the examples include, when n1 is 2, substituted or unsubstituted arylene groups having 6 to 12 carbon atoms and substituted or unsubstituted heteroarylene groups having 1 to 12 carbon atoms.

Above all, $Y^1$ contains, from the perspective of achieving appropriate solubility, a group derived from a benzene (such as a phenyl group or a phenylene group), a heterocyclic ring with the benzene-derived group partially substituted by nitrogen (such as a pyridyl group or a pyradyl group), or a substituted or unsubstituted group derived from a structure represented by the general formula (4).

While the following formulas Y-1 to Y-15 are exemplified below as preferred structure for $Y^1$, $Y^1$ may be, besides, groups represented by the N-12 to N-38, N-46, and N-47.

[Chemical Formula 19]

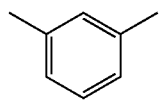 Y-1

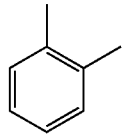 Y-2

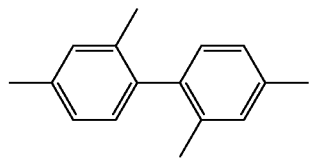 Y-3

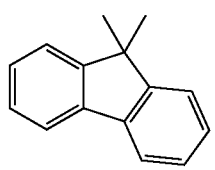 Y-4

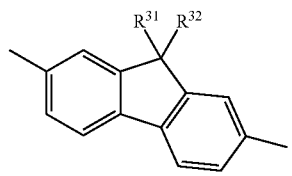 Y-5

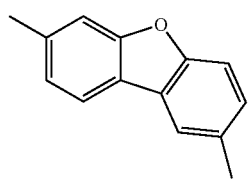 Y-6

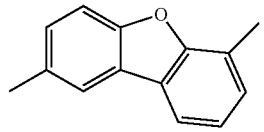 Y-7

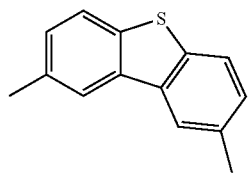 Y-8

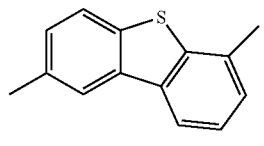 Y-9

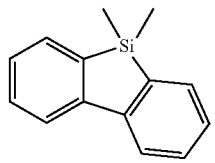 Y-10

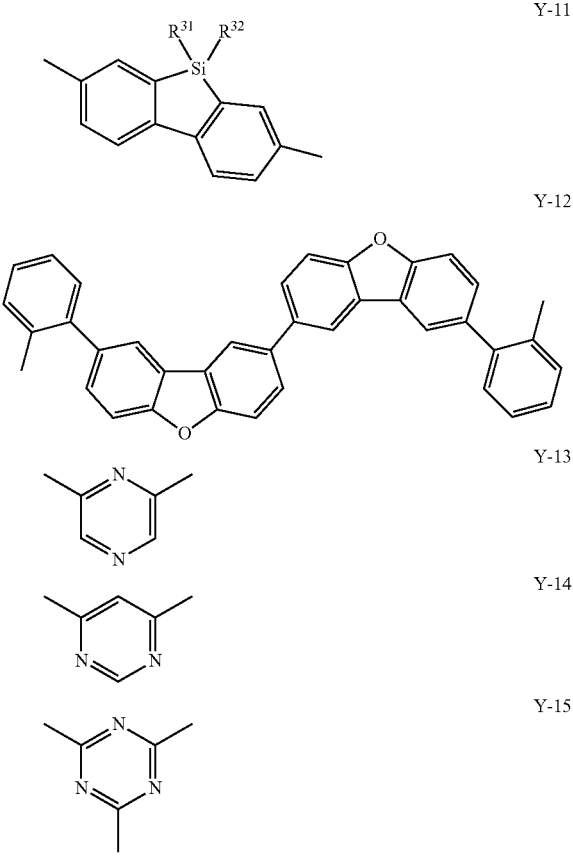

Y-11

Y-12

Y-13

Y-14

Y-15

In the Y-5 and Y-11, $R^{31}$ and $R^{32}$ are each independently a hydrogen atom, or a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 1 to 30 carbon atoms, or a substituted or unsubstituted alkyloxy group having 1 to 20 carbon atoms. These groups are defined respectively in the same manner as (A') to (E') of the general formulas (4).

$Y^1$ preferably has, among the structures mentioned above, a condensed ring structure such as Y-4 to Y-12, or a condensed ring structure such as subsequently shown Y-16 to Y-17 and Y-21 to Y-22. This condensed ring structure has high carrier transport performance, and thus, even when the nitrogen-containing layer 3 is brought into contact with the photoelectric conversion layer 17, the buffer layer 19, or the semi-insulating layer 21, carriers can be sufficiently transported, and the decrease in power generation efficiency can be reduced.

In addition, preferred $Y^1$ contains a group derived from a structure represented by the general formula (4). This condensed ring structure has high carrier transport performance, and thus, the decrease in power generation efficiency can be reduced in the same way as described above.

Furthermore, particularly preferred $Y^1$ contains a highly electron-transporting carbazole mother nucleus (the formula N-12 to N-15, N-37, or N-38), azacarbazole mother nucleus (the formulas N-16 to N-34), or a fluorene mother nucleus (Y-4 or Y-5).

<$Y^2$ in General Formula (2)>

As $Y^2$ in the general formula (2), a divalent organic group is applied without any particular limitation, but a substituted or unsubstituted divalent aromatic residue is preferred. Examples of $Y^2$ include, for example, substituted or unsubstituted arylene groups having 6 to 30 carbon atoms, and substituted or unsubstituted heteroarylene groups having 1 to 30 carbon atoms. These groups may be bonded through the divalent linking groups (A) to (E) constituting $A^1$ or $A^3$.

Specific examples of the arylene groups, heteroarylene groups, and substituents in the case of the groups having the substituents, including their substituents, are defined in the same manner as (C) and (D) in the divalent linking group constituting $A^1$ or $A^3$.

Preferred examples of $Y^2$ just described above are substituted or unsubstituted arylene groups having 6 to 12 carbon atoms, and substituted or unsubstituted heteroarylene groups having 1 to 12 carbon atoms, and more preferably, phenylene groups from the perspective of achieving appropriate solubility, or substituted or unsubstituted divalent groups derived from structures represented by the general formula (4), specifically, divalent groups represented by the Y-1 to Y-14 or the formulas N-12 to N-36.

In the present invention, $Y^2$ contains a structure represented by the general formula (4). This condensed ring structure has high carrier transport performance, and thus, even when the nitrogen-containing layer 3 is brought into contact with the photoelectric conversion layer 17, the buffer layer 19, or the semi-insulating layer 21, carriers can be sufficiently transported, and the decrease in power generation efficiency can be reduced. Particularly preferred are divalent groups represented by the Y-6 or the formula N-9, from the perspective of achieving appropriate solubility.

<$Y^3$ in General Formula (3)>

For $Y^3$ in the general formula (3), an (n2+2)-valent organic group is applied without any particular limitation. Examples of such $Y^3$ include, for example, (n2+2)-valent groups represented by the following general formula (3A). It is to be noted that in the general formula (3A), the groups in parentheses represent $Y^3$, and n2 (three in the figure) lines linked to X' in the parentheses represent linking sites to $A^3$.

[Chemical Formula 20]

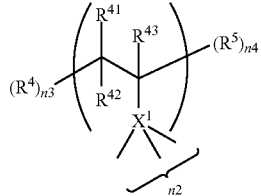

General Formula (3A)

In the general formula (3A), $R^{41}$ to $R^{43}$ are a hydrogen atom or a methyl group. The respective $R^{41}$ to $R^{43}$ may be identical to, or different from each other.

When n2 is 1, X' in the general formula (3A) represents a single bond (—), an alkylene group, a cycloalkylene group, an arylene group, a heteroarylene group, or an alkyleneoxycarbonyl group.

The alkylene group, cycloalkylene group, arylene group, and heteroarylene group mentioned above, including their substituents, are defined in the same manner as (A) to (D) in the divalent linking group constituting $A^1$ or $A^3$.

On the other hand, the alkyleneoxycarbonyl group is a substituted or unsubstituted alkyleneoxycarbonyl group that has an alkylene group having 1 to 20 carbon atoms. Such an alkyleneoxycarbonyl group means "—CO—O-alkylene-" or "-alkylene-O—CO—", and the [-alkylene-] refers to an alkylene group having 1 to 20 carbon atoms.

A preferred form of such an alkyleneoxycarbonyl group is a form in which the carbon atom of a carbonyl group (—CO—) is bonded to a carbon atom of a main chain, and in this case, an acrylic polymer is provided.

The alkylene group having 1 to 20 carbon atoms in the alkyleneoxycarbonyl group is not particularly limited, but examples of the alkylene group, including its substituent, include the same alkylene group as (A) in the divalent linking group constituting the $A^1$ or $A^3$. Above all, straight-chain or branched-chain alkylene groups having 1 to 15 carbon atoms are preferred, and straight-chain or branched-chain alkylene groups having 1 to 12 carbon atoms are more preferred.

When n2 is 1, in particular, X' in the general formula (3A) is, from the perspective of achieving appropriate solubility, preferably a single bond (—), an arylene group, or an alkyleneoxycarbonyl group, and from the perspective of the density of a substituent that interacts with a metal of the Group 11, preferably a single bond (—), a substituted or unsubstituted arylene group having 6 to 12 carbon atoms or a substituted or unsubstituted alkyleneoxycarbonyl group having 1 to 8 carbon atoms.

When n2 is 2 or more, X' in the general formula (3A) represents a substituted or unsubstituted (n2+1)-valent aromatic residue, or a substituted or unsubstituted (n2+1)-valent aliphatic hydrocarbon residue. Specifically, examples of X' include groups obtained by further removing (n2−1) hydrogen atoms from the respective alkylene group, cycloalkylene group, arylene group, and heteroarylane group for (A) to (D) in the divalent linking group constituting the $A^1$ or $A^3$.

Besides the foregoing, another example of $Y^3$ in the general formula (3) represents an (n2+2)-valent aromatic residue or an (n2+2)-valent aliphatic hydrocarbon residue. Specifically, examples of the residue, including their substituents, groups obtained by further removing n2 hydrogen atoms from the alkylene group, cycloalkylene group, arylene group, or heteroarylene group defined for (A) to (D) in the divalent linking group constituting the $A^1$ or $A^3$. Above all, preferred as $Y^3$ are groups obtained by further removing n2 hydrogen atoms from each of substituted or unsubstituted arylene groups having 6 to 30 carbon atoms, or of substituted or unsubstituted heteroarylene groups having 1 to 30 carbon atoms.

$Y^3$ in this case contains a structure represented by the general formula (4). This condensed ring structure has high carrier transport performance, and thus, even when the nitrogen-containing layer 3 is brought into contact with the photoelectric conversion layer 17, the buffer layer 19, or the semi-insulating layer 21, carriers can be sufficiently transported, and the decrease in power generation efficiency can be reduced.

Preferred structures of $Y^3$ include Y-16 to Y-22 below.

[Chemical Formula 21]

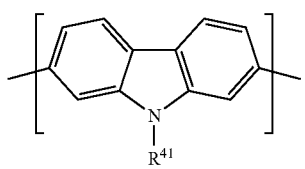

Y-16

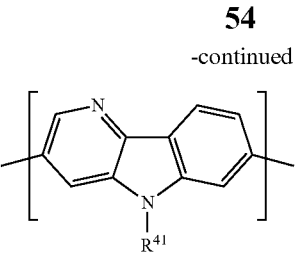

Y-17

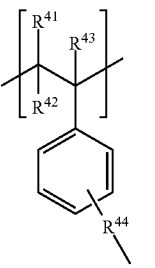

Y-18

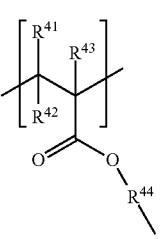

Y-19

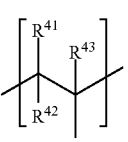

Y-20

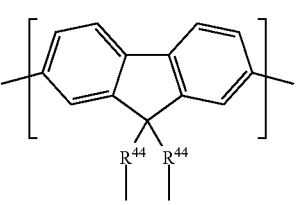

Y-21

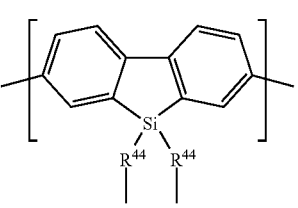

Y-22

In the formulas, $R^{41}$ to $R^{43}$ are each independently a hydrogen atom or a methyl group. In the formulas, $R^{44}$ is a single bond (—), a straight-chain or a branched-chain alkylene group having 1 to 12 carbon atoms, or an alkyleneoxycarbonyl group having 1 to 12 carbon atoms. These groups may have substituents, and the substituents in this case are the same as the substituents in the nitrogen-containing aromatic rings constituting the $A^1$ and $A^3$ mentioned above. Above all, preferred as $R^{44}$ is a single bond (—) or a straight-chain alkylene group having 1 to 6 carbon atoms (for example, a methylene group, an ethylene group, a pentaethylene group).

Further preferred as $Y^3$ is a group that has a condensed ring structure such as the Y-21 or the Y-22, from the perspective of improving carrier transport performance to suppress the decreased in power generation efficiency, and particularly preferred is, from the perspective of improving the solubility of the nitrogen-containing compound in the case of forming the nitrogen-containing layer 3 by a coating method, a group having a fluorene mother nucleus with an alkyl chain at the ninth position of the fluorene (the Y-21 mentioned above).

The nitrogen-containing compound composed as described above may be a low molecular weight compound (not a polymer type) represented by the general formula (1), or a high molecular weight compound having a structural unit represented by the general formula (2) or the general formula (3), but is preferably the high molecular weight compound. In the case of the high molecular weight compound, the nitrogen-containing layer 3 composed with the use of the nitrogen-containing compound has an improvement in homogeneity of film quality, and the decrease in shunt resistance (Rsh) is eliminated which is caused by pinholes, etc., even with a film thickness that is extremely small such as 5 nm. As a result, the solar cell 10a is achieved which has a high fill factor (FF), and is excellent in photoelectric conversion efficiency and durability.

8. Molecular Weight of Nitrogen-Containing Compound

When the nitrogen-containing compound is a polymer, there is no particular limit on the molecular weight of the polymer, but the compound is preferably a high molecular weight compound that has a weight average molecular weight of 3000 or more in terms of homogeneity of film quality, photoelectric conversion efficiency, and durability. The weight average molecular weight is more preferably 4000 or more, further preferably 5000 or more. In this case, the upper limit of the weight average molecular weight of the nitrogen-containing compound is not particularly limited, but preferably 50000 or less, more preferably 30000 or less. The weight average molecular weight can be measured by gel permeation chromatography (GPC) (standard substance).

Specifically, the weight average molecular weight (Mw) of the nitrogen-containing compound according to the invention of the present application can be measured by the use of GPC (gel permeation chromatography) that uses THF (tetrahydrofuran) as a column solvent. However, because some compounds are not dissolved in THF, as for the molecular weight of the main chain, the precursor (the compound with a ω-bromoalkyl group as a substituent) in the previous step in the production process of the nitrogen-containing compound according to the present invention may be subjected to the measurement to confirm the molecular weight. It is to be noted that it is by polymeric reaction that the nitrogen-containing compound according to the invention of the present application is obtained from the precursor, the length of the main chain will not vary significantly, the weight average molecular weight of the nitrogen-containing compound can be thus easily estimated from the weight average molecular weight of the precursor.

Specifically, a sample solution is prepared by adding 1 ml of THF (subjected to degassing and used) to 1 mg of a measurement sample, and the sample solution is stirred with the use of a magnetic stirrer under room temperature to dissolve the measurement sample in the THF. Then, the sample solution is treated through a membrane filter of 0.45 to 0.50 μm in pore size, and then injected into a GPC (gel permeation chromatograph) system.

The GPC measurement condition is as follows. More specifically, the column is stabilized at 40° C., THF (tetrahydrofuran) is fed at a flow rate of 1 ml per minute, about 100 μl of the sample solution with a concentration of 1 mg/ml is injected for the measurement.

As the column, it is preferable to use commercially available polystyrene gel columns in combination. For example, combinations of Shodex GPC KF-801, 802, 803, 804, 805, 806, and 807 from Showa Denko K. K., combinations of TSKgelG1000H, G2000H, G3000H, G4000H, G5000H, G6000H, G7000H, TSK guard column, etc. from Tosoh Corporation are preferred.

As the detector, a refractive index detector (RI detector) or an UV detector is preferably used. In the molecular weight measurement of the sample, the molecular weight distribution of the sample is calculated with the use of a standard curve created through the use of monodisperse polystyrene standard particles. It is preferable to use on the order of 10 points as the polystyrene for the creation of the standard curve.

As a more preferable form of the nitrogen compound constituting the nitrogen-containing layer 3, a compound is preferably used in which the ratio between [effective unshared electron pair] and [molecular weight] falls within a predetermined range, provided that among the nitrogen atoms contained in the compound, the unshared electron pair of a nitrogen atom, in particular, stably bonded to silver as a main material constituting the electrode layer 5 is referred to as the [effective unshared electron pair].

The [effective unshared electron pair] herein is regarded as an unshared electron pair that is not involved in aromaticity, or not coordinated to the metal, among the unshared electron pairs of the nitrogen atoms contained in the compound. The aromaticity herein refers to an unsaturated ring structure of atoms with n electrons arranged in the form of a ring, and aromaticity in accordance with the so-called "Huckel's rule", provided that the number of electrons included in the π electron system on the ring is "4n+2" (n=0, or a natural number).

The [effective unshared electron pair] just described above is selected depending on whether or not the unshared electron pair of the nitrogen atom is involved in aromaticity, regardless of whether or not the nitrogen atom itself including the unshared electron pair is a hetero atom constituting the aromatic ring. For example, even when a nitrogen atom is a hetero atom constituting the aromatic ring, as long as the nitrogen atom has an unshared electron pair that is not involved in aromaticity, the unshared electron pair is counted as one [effective unshared electron pair]. In contrast, even when a nitrogen atom is not a hetero atom constituting the aromatic ring, as long as the unshared electron pair of the nitrogen atom is all involved in aromaticity, the unshared electron pair of the nitrogen atom will not be counted as an [effective unshared electron pair]. It is to be noted that the number n of the above-mentioned [effective unshared electron pairs] corresponds to the number of nitrogen atoms with the [effective unshared electron pairs] in each compound.

In particular, in the present invention, the number n of [effective unshared electron pairs] to the molecular weight M of such a compound is defined as, for example, an effective unshared electron pair content ratio [n/M]. Further, the nitrogen-containing layer 3 is preferably composed with the use of a compound selected so that the [n/M] meets $4.0 \times 10^{-3} \leq [n/M]$.

In addition, it is only necessary for the nitrogen-containing layer 3 to be composed with the use of a compound with the effective unshared electron pair content ratio [n/M] in the predetermined range mentioned above, and the layer may be composed of only such a compound, or composed with the use of a mixture of such a compound and other compound. The other compound may contain nitrogen atoms, or contain no nitrogen atoms, and moreover, the effective unshared electron pair content ratio [n/M] may fail to fall within the predetermined range mentioned above.

When the nitrogen-containing layer 3 is composed with the use of more than one compound, for example, on the basis of the mixture ratio of the compounds, the molecular weight M of the mixed compound obtained by mixing the compounds is figured out, the total number n of [effective unshared electron pairs] to the molecular weight M is figured out as an average value for the effective unshared electron pair content ratio [n/M], and this value preferably falls within the predetermined range mentioned above. More specifically, the effective unshared electron pair content ratio [n/M] of the nitrogen-containing layer 3 itself preferably falls within the predetermined range.

It is to be noted that when the nitrogen-containing layer 3 is composed with the use of more than one compound such that the mixture ratio (content ratio) of the compounds varies in the film thickness direction, the effective unshared electron pair content ratio [n/M] in a surface layer of the nitrogen-containing layer 3 on the side in contact with the electrode layer 5 preferably falls within the predetermined range.

Specific examples of the compound in which the effective unshared electron pair content ratio [n/M] meets $4.0 \times 10^{-3} \leq$ [n/M] as just described include the above-mentioned exemplary compounds 10, 13, 20, 37 to 48, 50, 52 to 58, 60, 62, 201, and 202, etc. It is to be noted that among unshared electron pairs of nitrogen atoms, unshared electron pairs that are not coordinated to copper are counted as the [effective unshared electron pair] in the copper phthalocyanine of the exemplary compound 58.

The nitrogen-containing layer 3 composed with the use of the compound in which the value of the effective unshared electron pair content ratio [n/M] meets $4.0 \times 10^{-3} \leq$ [n/M] as just described ensures the achievement of the effect of "suppressing agglomeration of a metal of the Group 11 of the periodic table, such as silver", constituting the electrode layer 5 at the interface of the nitrogen-containing layer 3. This has been also confirmed from the fact that the electrode layer 5 that has a measurable sheet resistance while being an ultrathin film of 6 nm is formed on the foregoing nitrogen-containing layer 3, as will be described in detail in subsequent examples. It is to be noted that while no particular limit is set on the upper limit of [n/M], the upper limit is supposed to be approximately $4.0 \times 10^{-2}$ as an organic substance that can exist stably, and preferably less than $4.0 \times 10^{-2}$. More preferred are compounds in the range of $1.0 \times 10^{-2}$ to $2.0 \times 10^{-2}$.

9. Specific Example of Nitrogen-Containing Compound

Next, exemplary compounds 1 to 181 and exemplary compounds 201 to 235 as polymers will be shown as specific examples of the nitrogen-containing compound described above. It is to be noted that the nitrogen-containing compound for use in the present invention is not to be considered limited to the following exemplary structures. It is to be noted that the nitrogen-containing compounds used in the examples below will be specified by the following exemplary compound numbers.

[Chemical Formula 22]

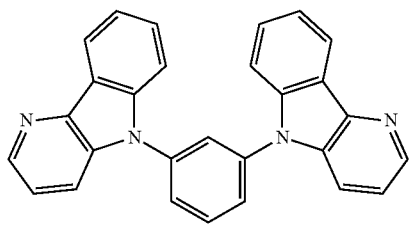

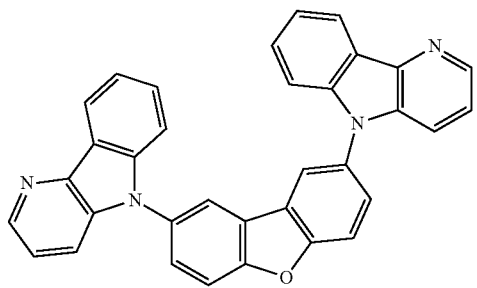

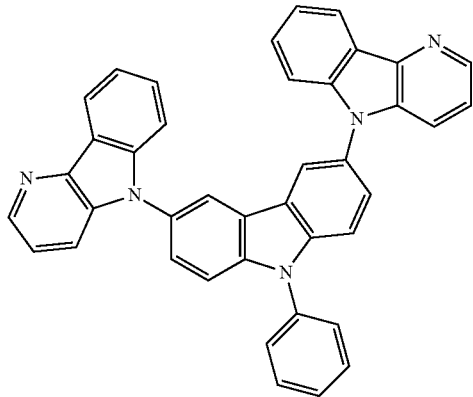

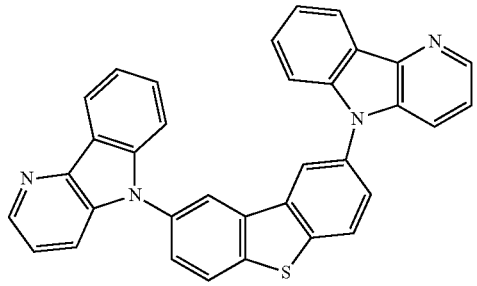

-continued
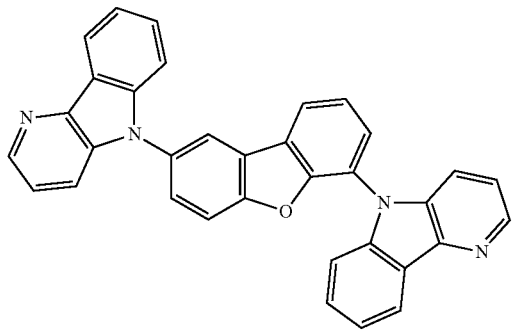
5
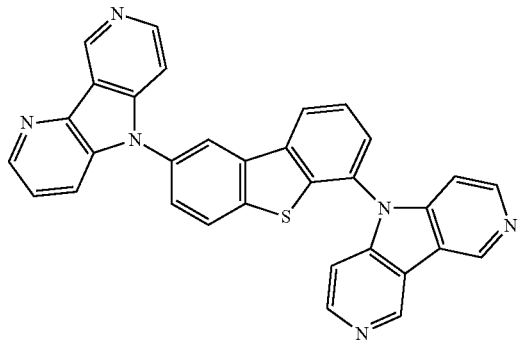
6
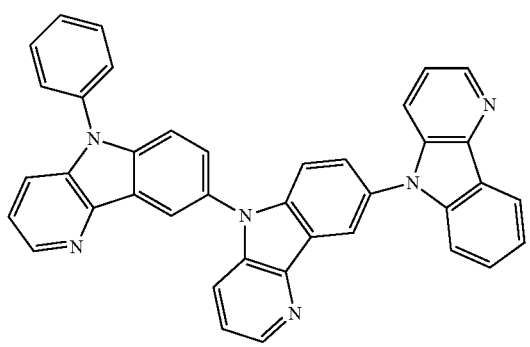
7
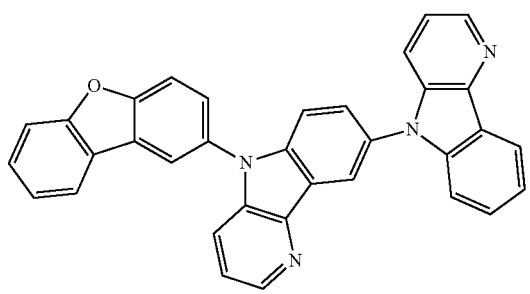
8
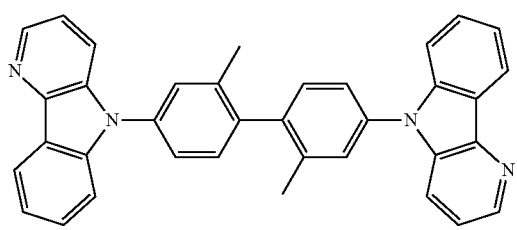
9
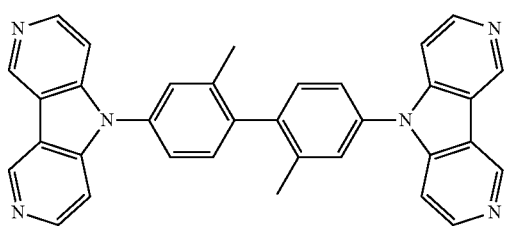
10
[Chemical Formula 23]
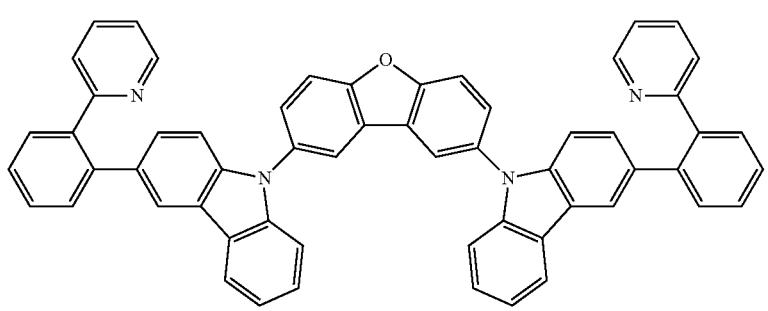
11

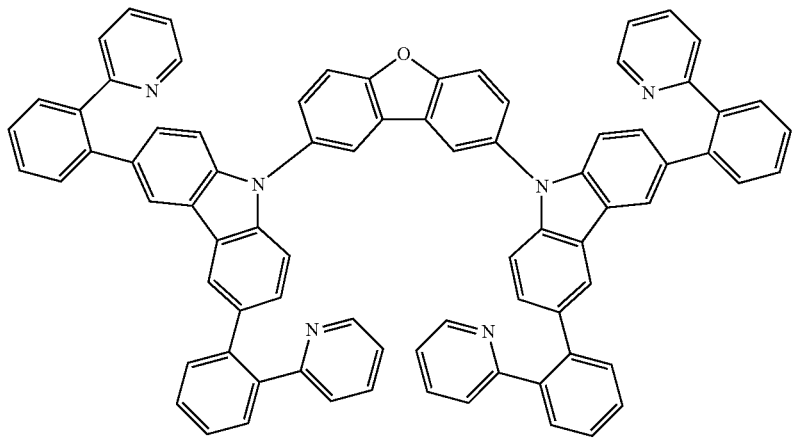
12
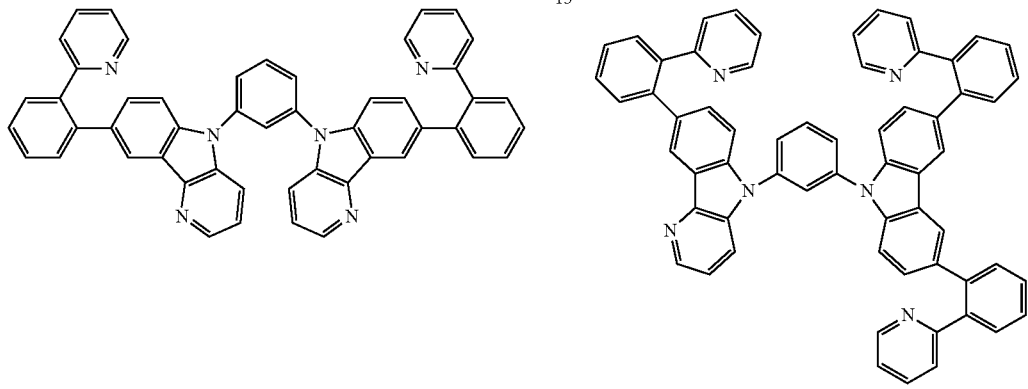
13
14
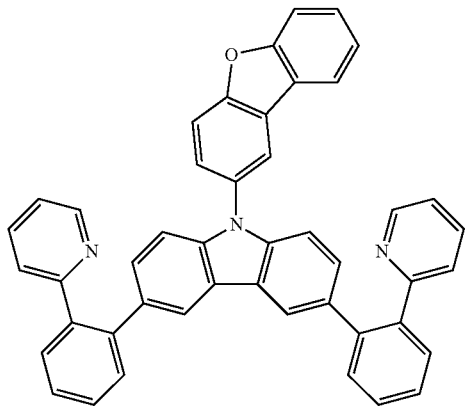
15

[Chemical Formula 24]
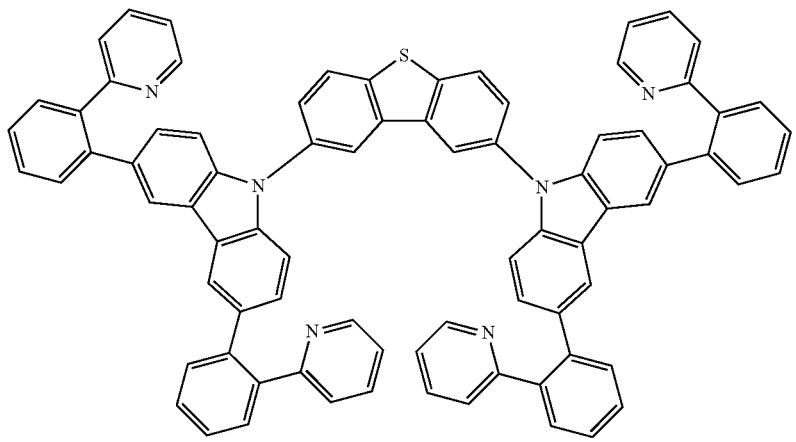
16
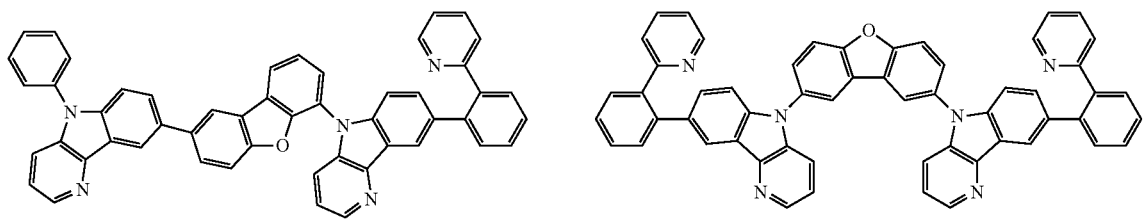
17    18
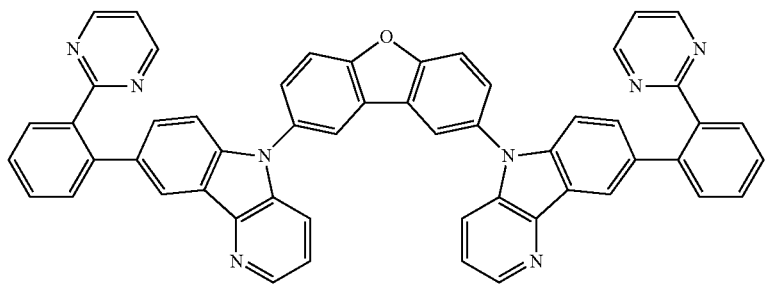
19
[Chemical Formula 25]
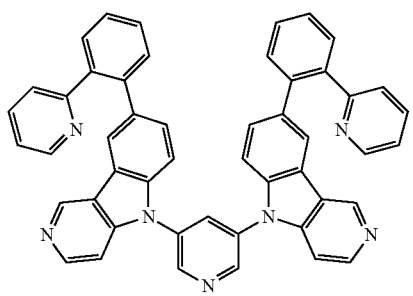
20    21

-continued
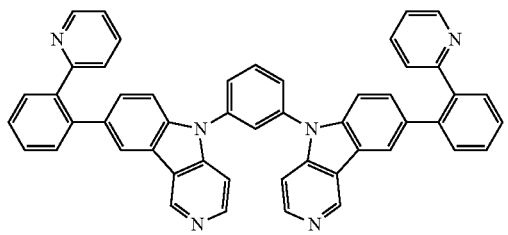
22
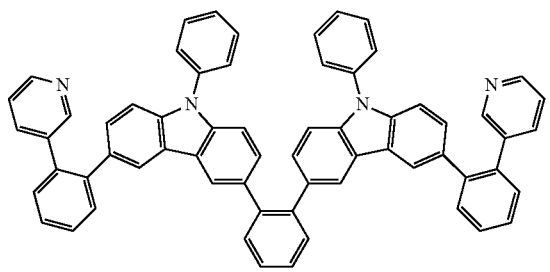
23
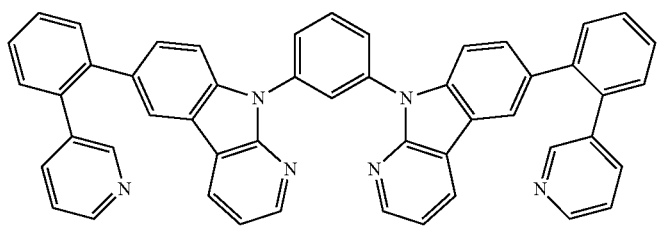
24
[Chemical Formula 26]
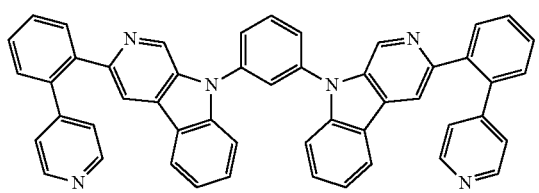
25
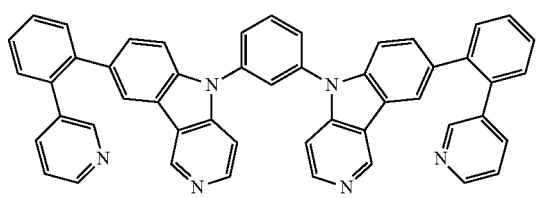
26
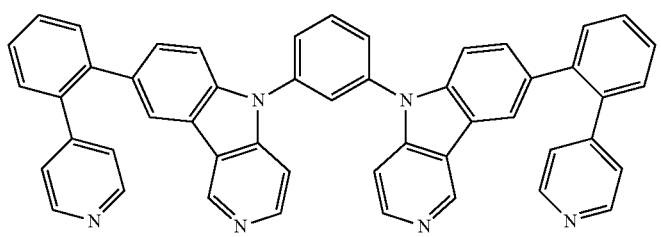
27
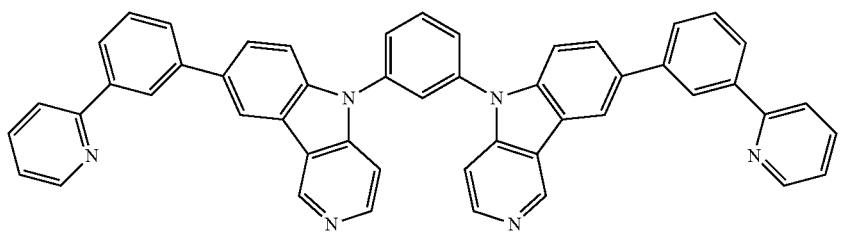
28
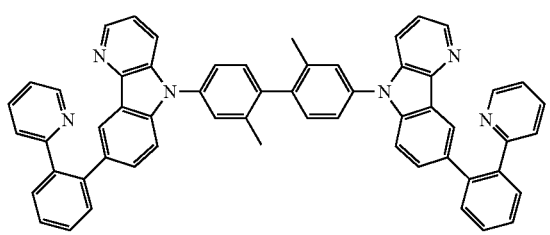
29
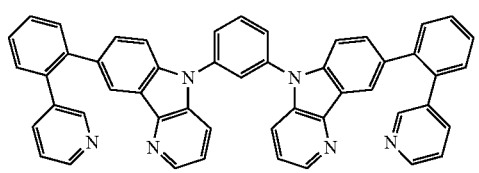
30

[Chemical Formula 27]
31
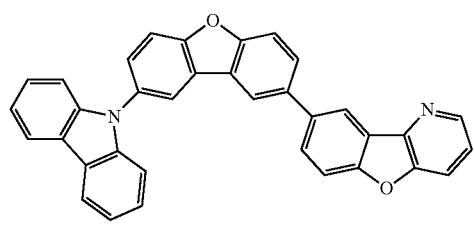
32
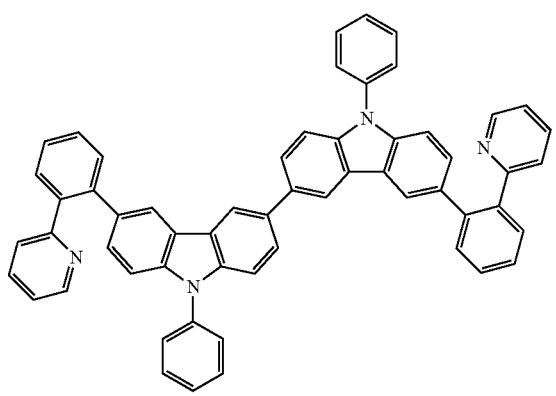
33
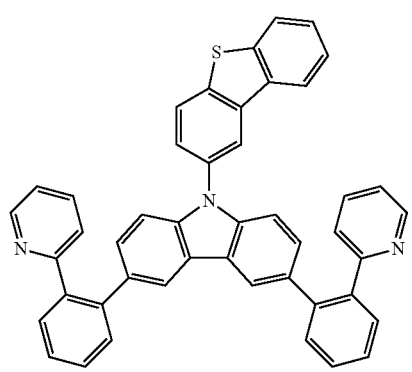
34
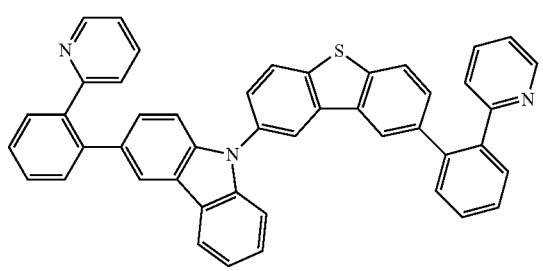
35
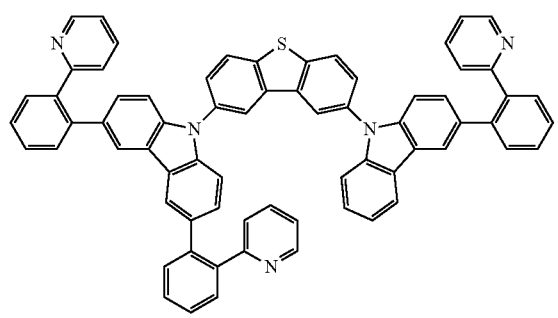
36
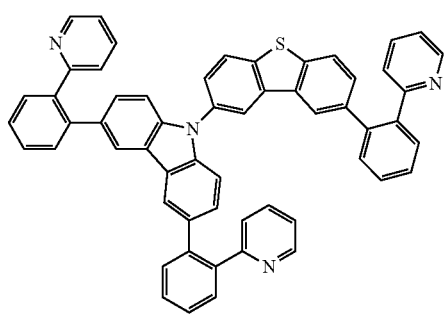

-continued
[Chemical Formula 28]
37
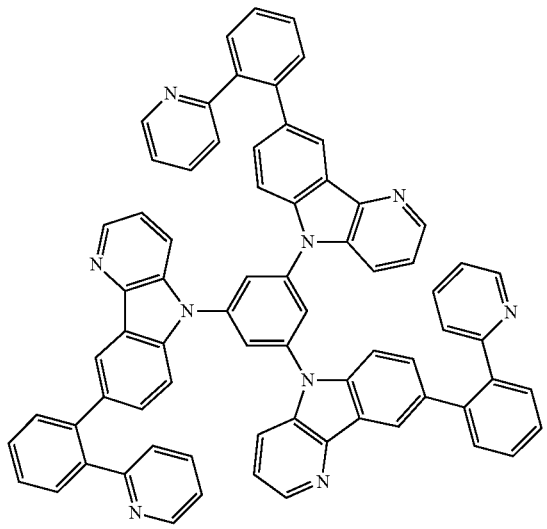
38
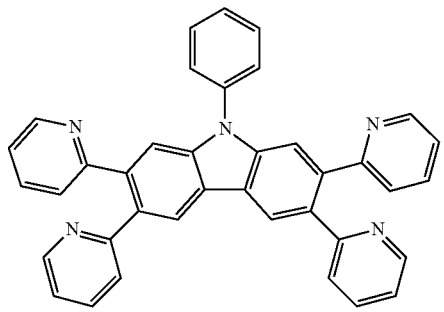
39
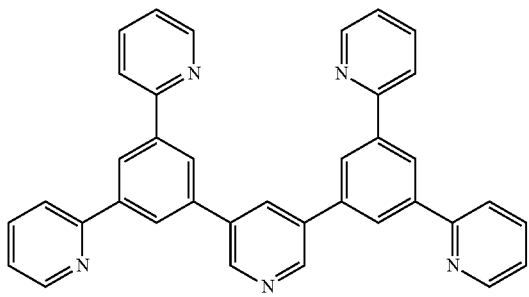
40
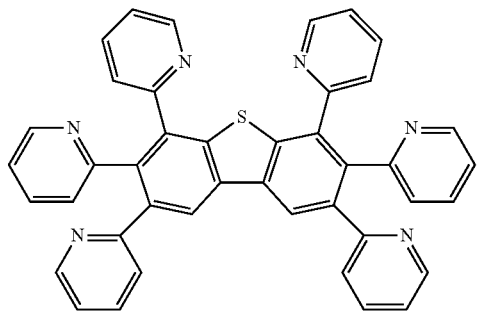
41
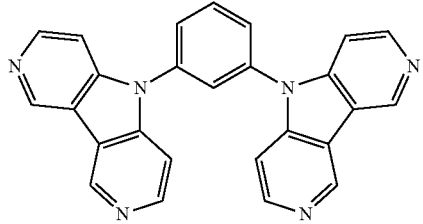
42
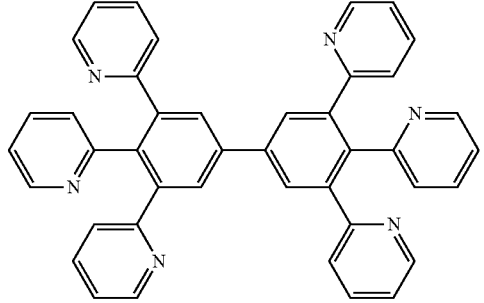
43
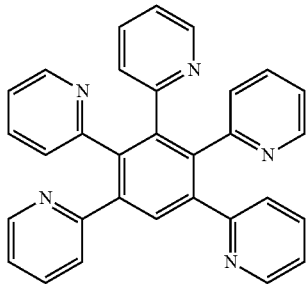
44
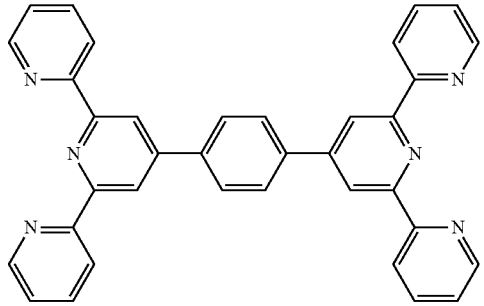

[Chemical Formula 29]
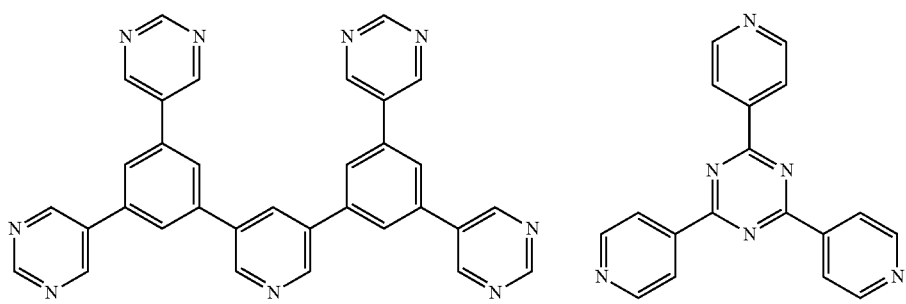
45    46
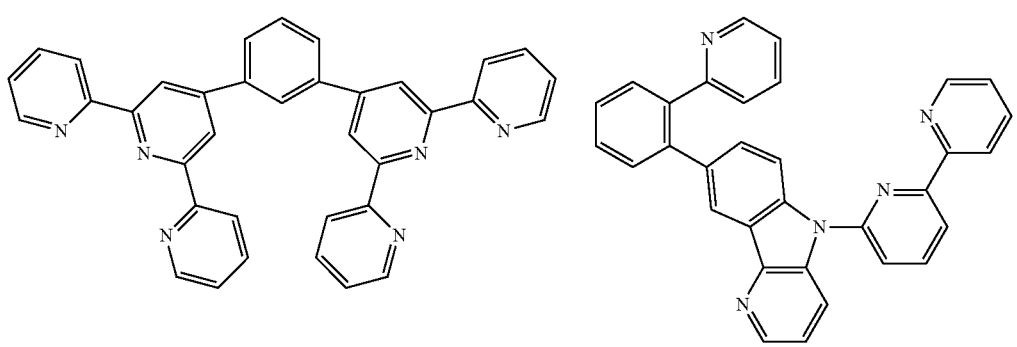
47    48
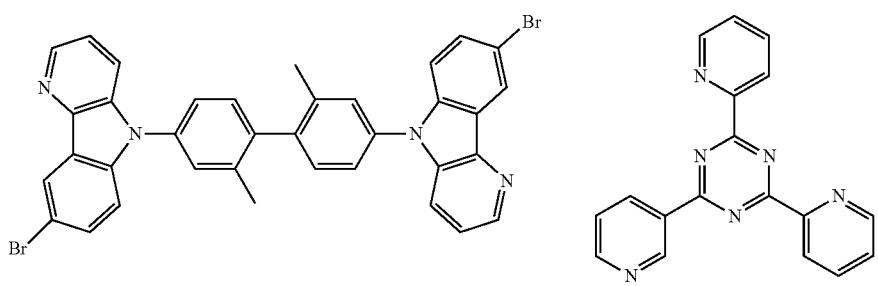
49    50
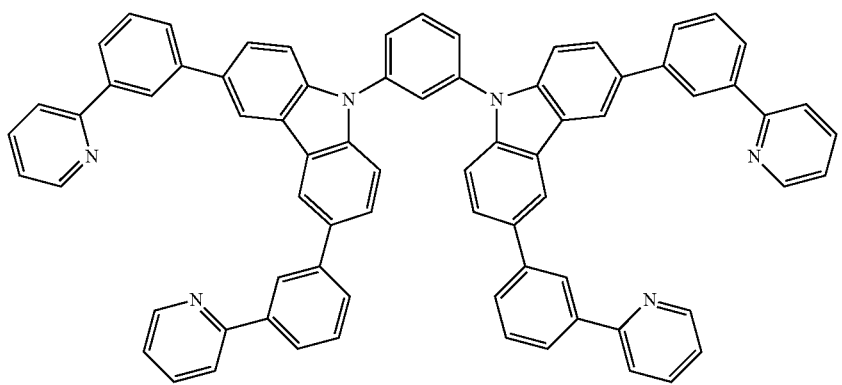
51

[Chemical Formula 30]
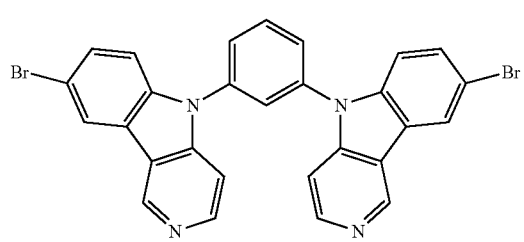
52
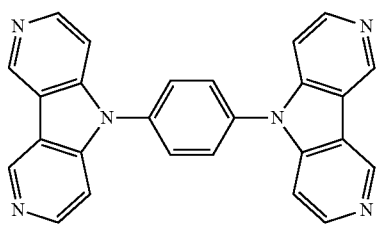
53
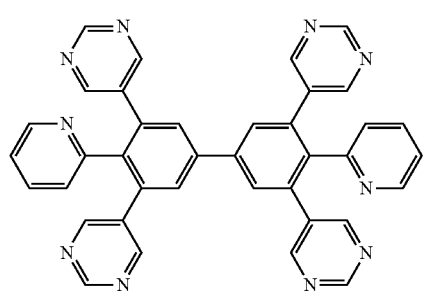
54
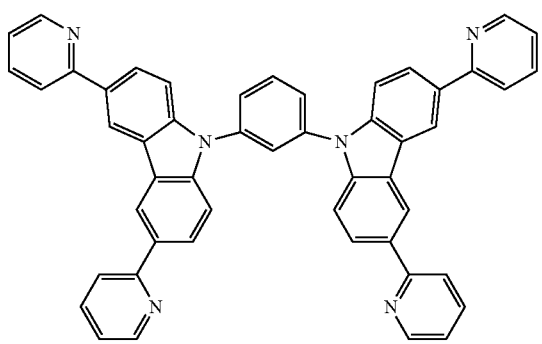
55
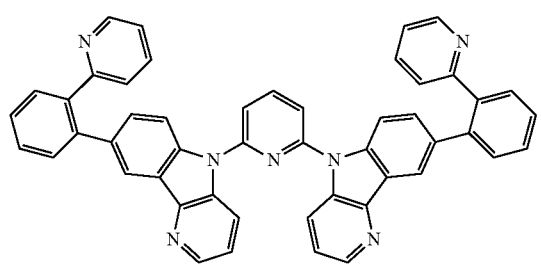
56
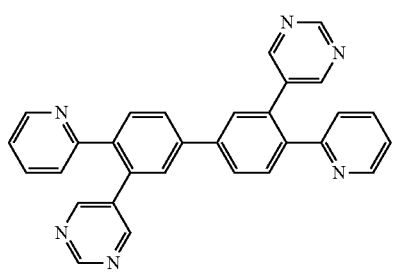
57
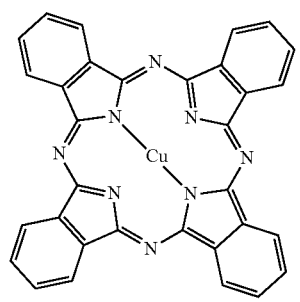
58
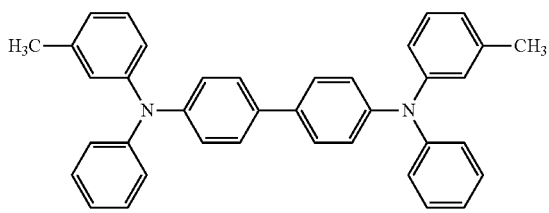
59
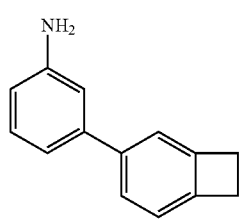
60

[Chemical Formula 31]
61
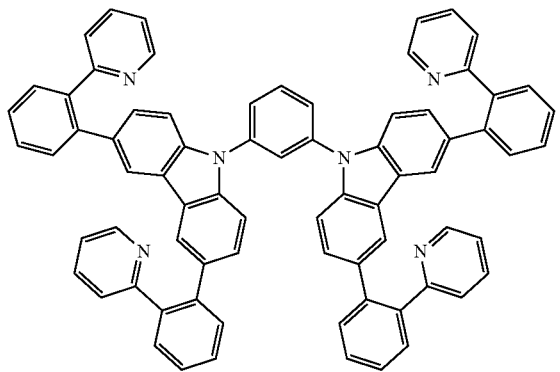
62
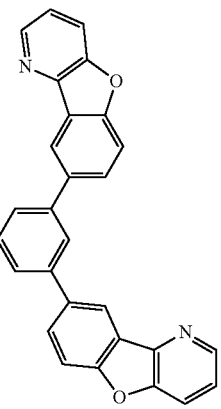
[Chemical Formula 32]
63
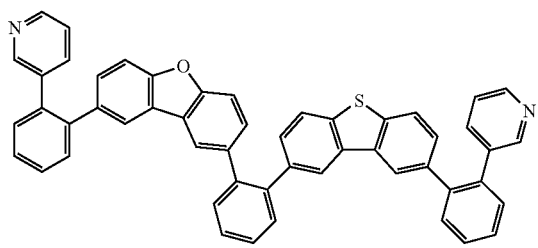
64
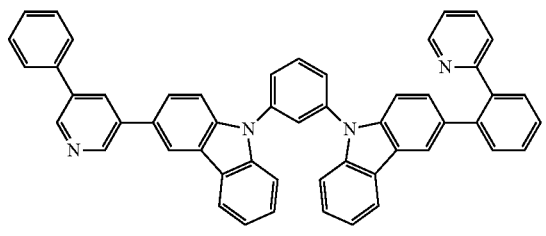
65
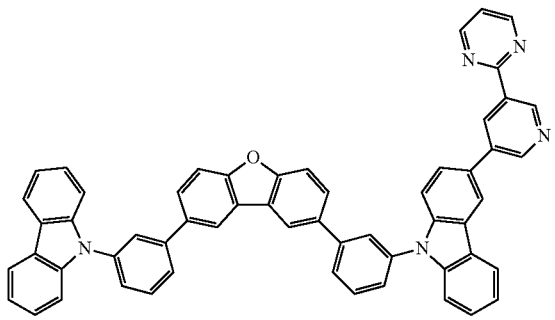
66
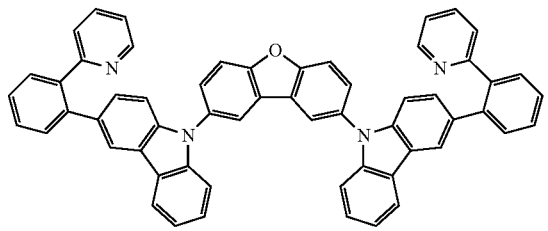
67
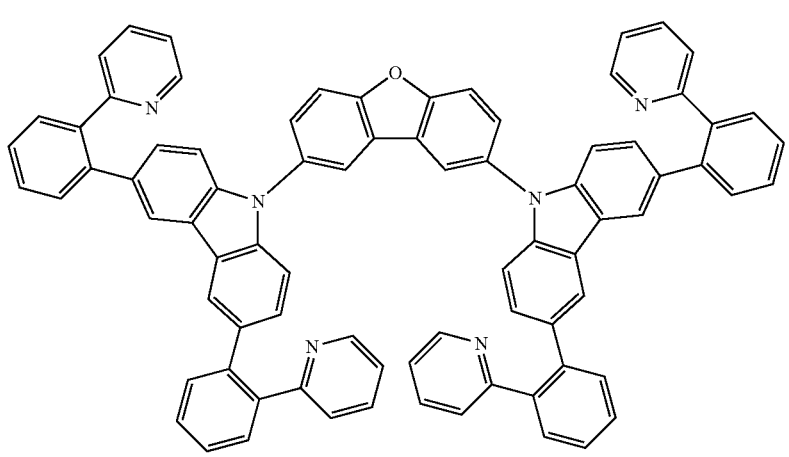

[Chemical Formula 33]
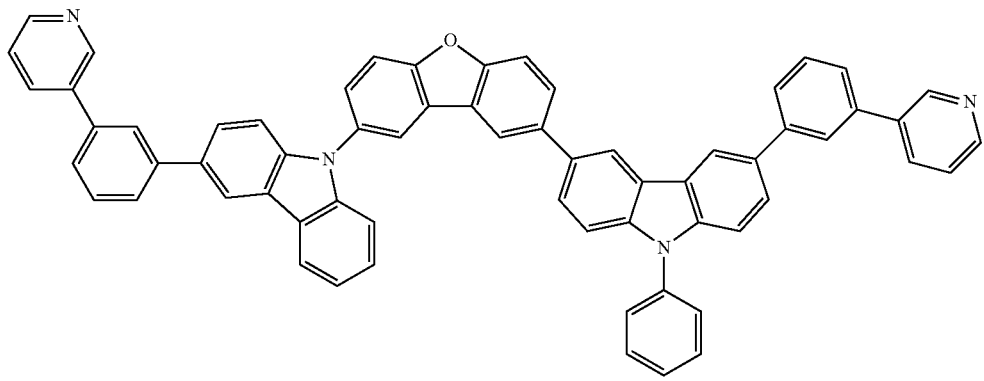
68
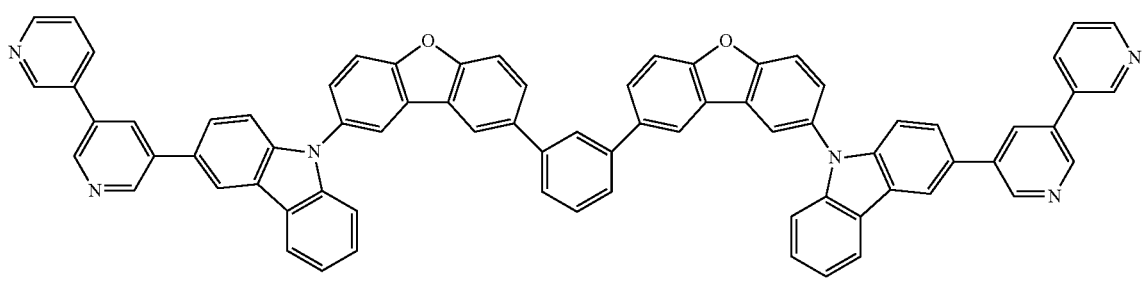
69
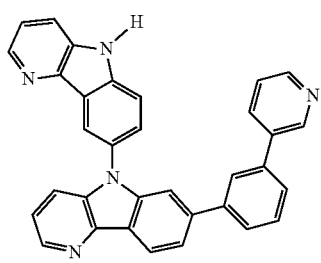
70
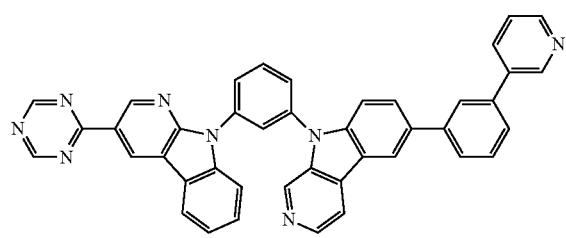
71
[Chemical Formula 34]
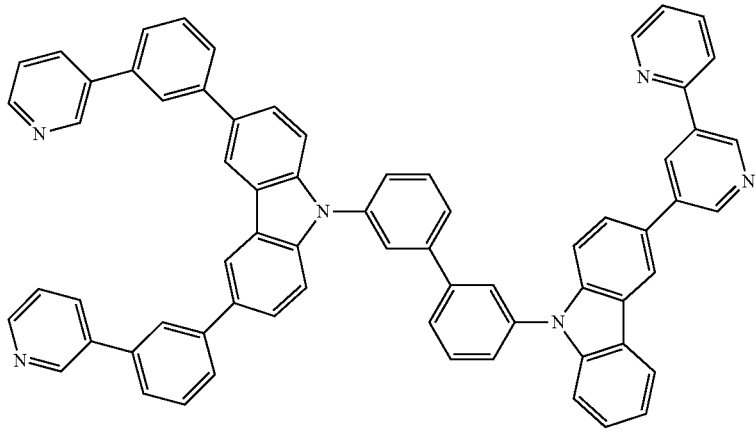
72

-continued
73
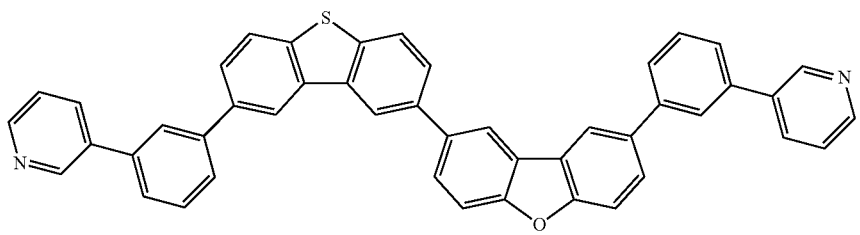
74
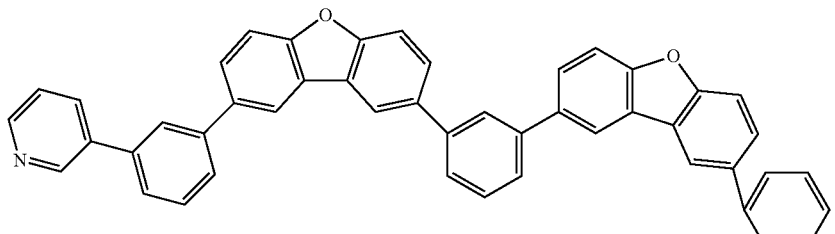
75
76
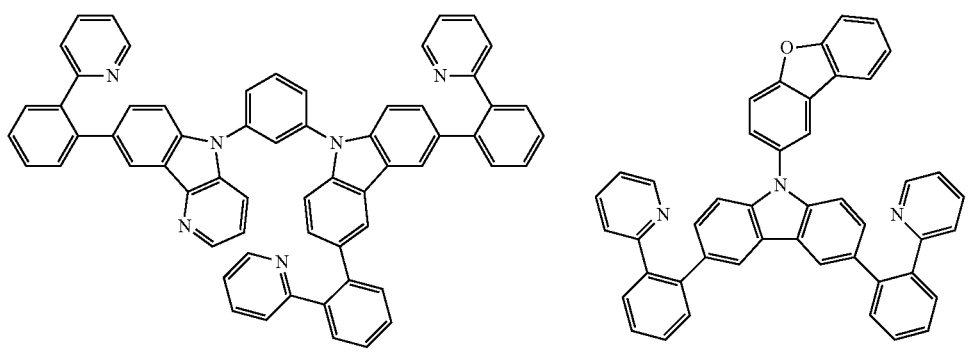
[Chemical Formula 35]
77
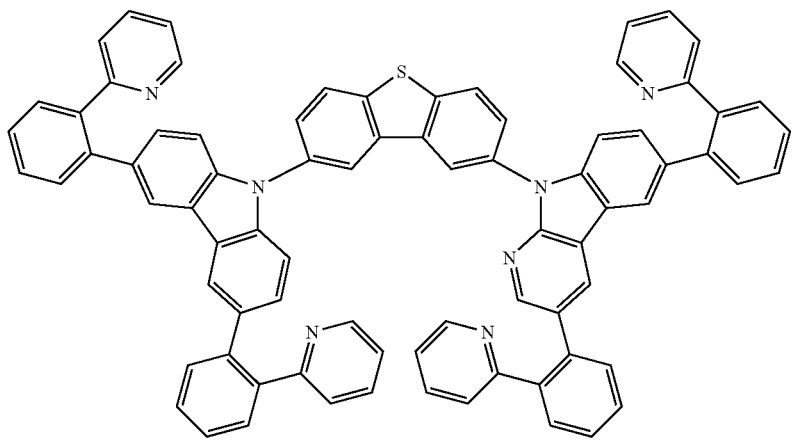
78
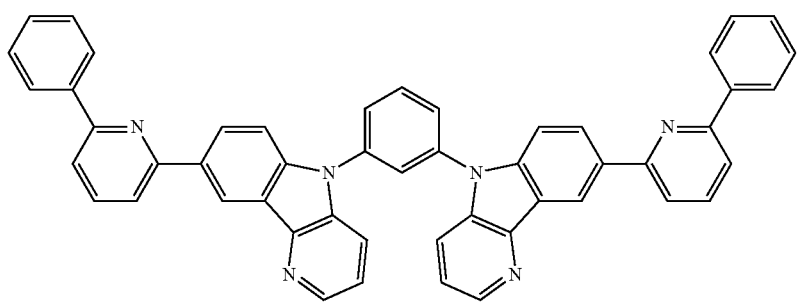

-continued
79
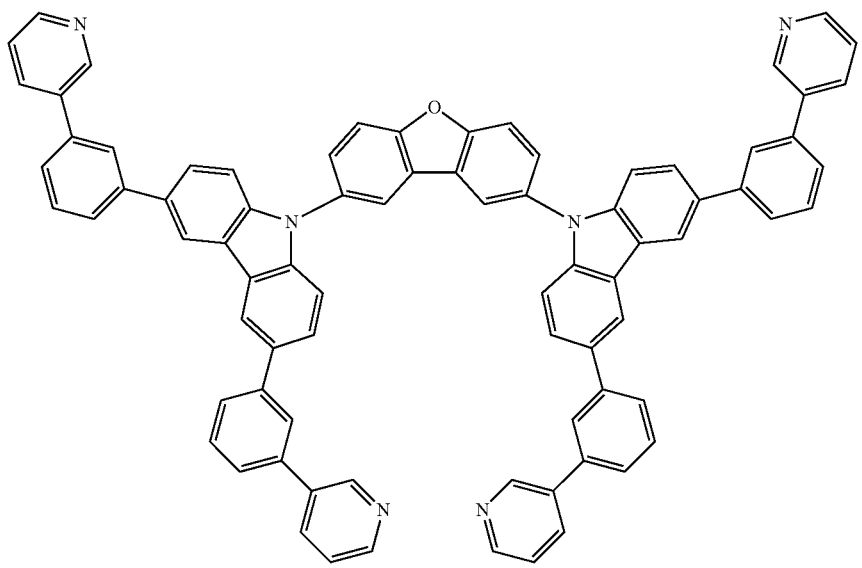
80
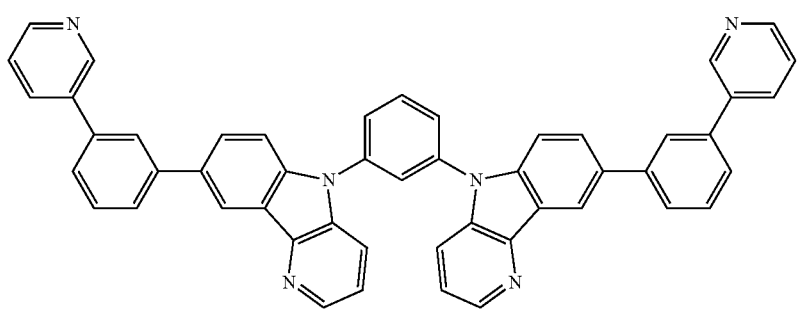
[Chemical Formula 36]
81
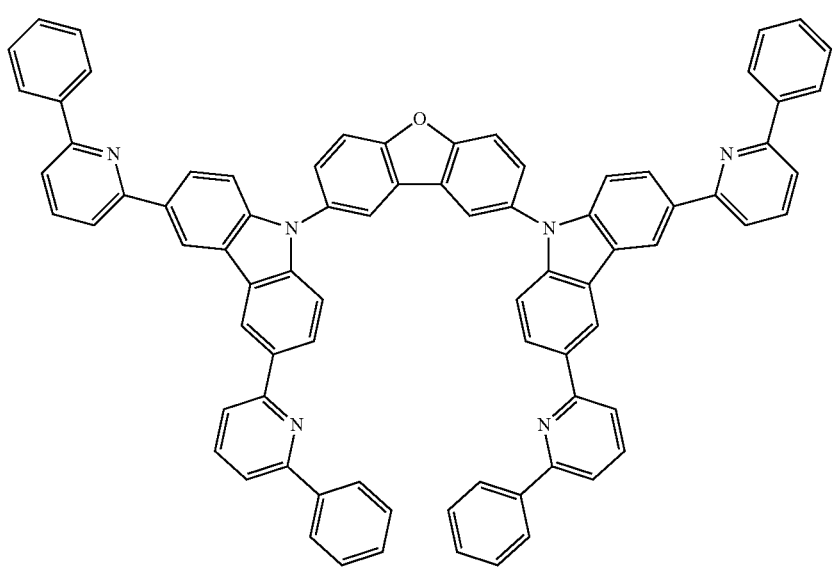

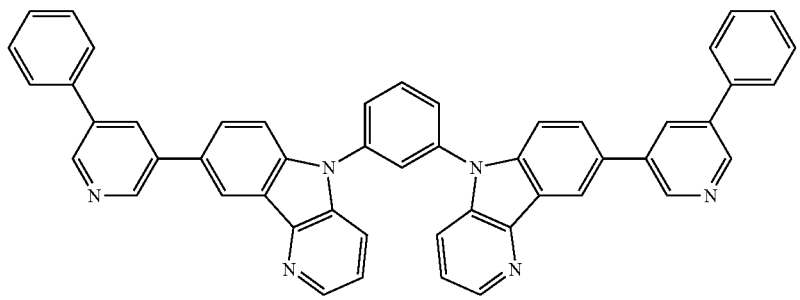
82
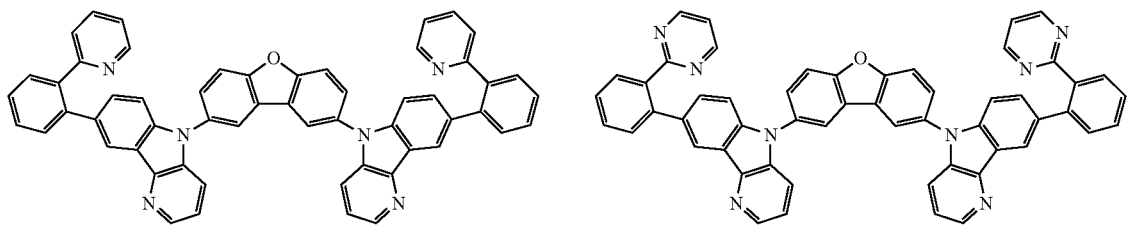
83  84
[Chemical Formula 37]
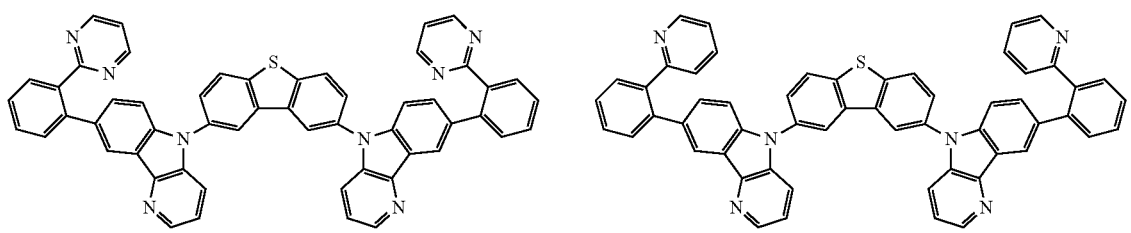
85  86
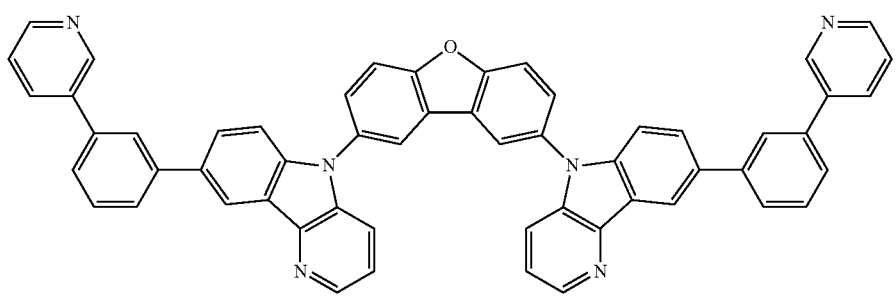
87
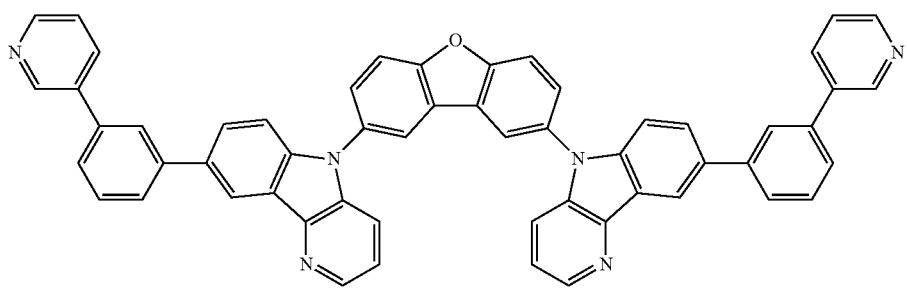
88

-continued
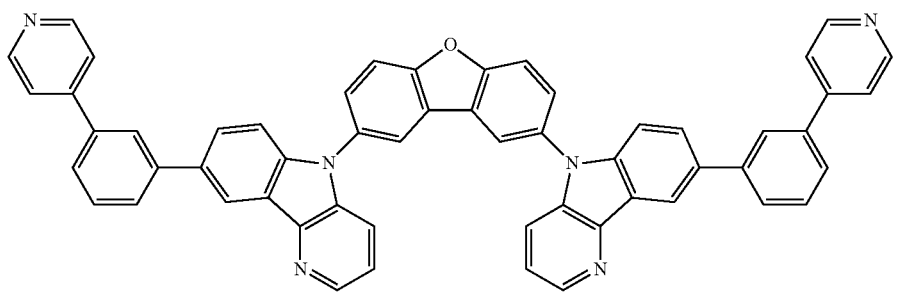
89
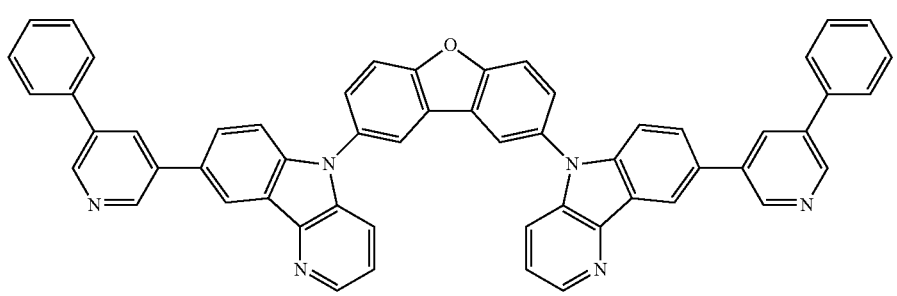
90
[Chemical Formula 38]
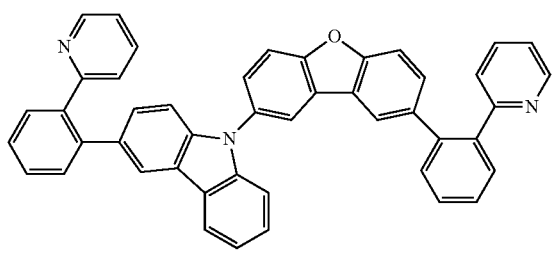
91
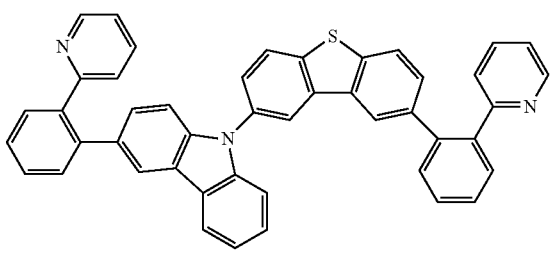
92
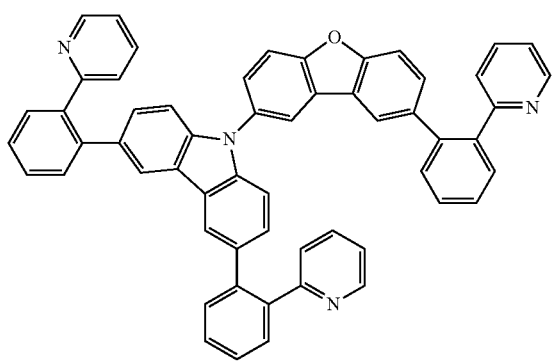
93
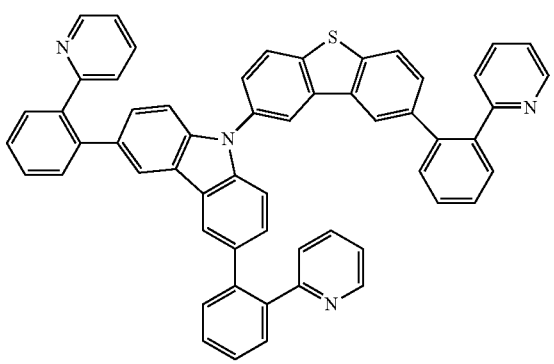
94
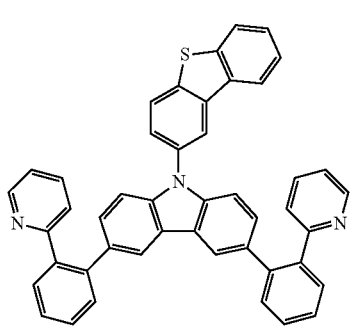
95
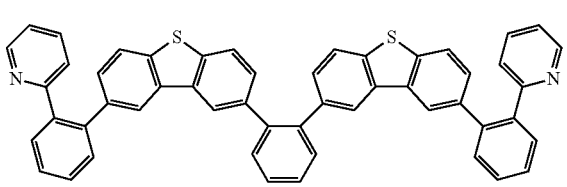
96

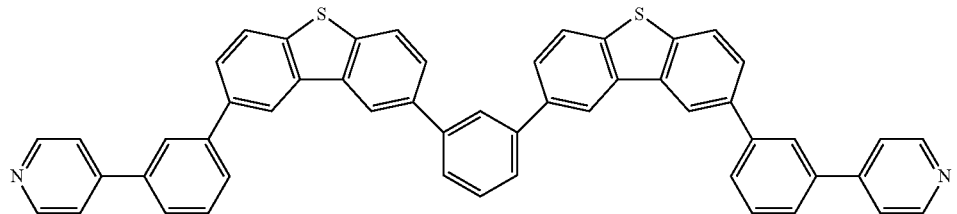
97
[Chemical Formula 39]
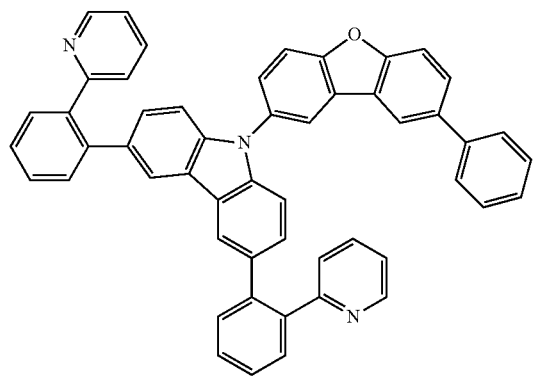
98
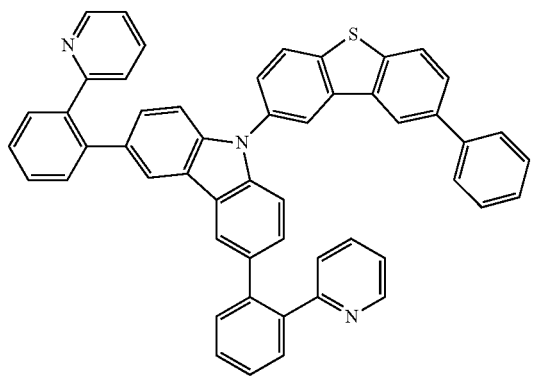
99
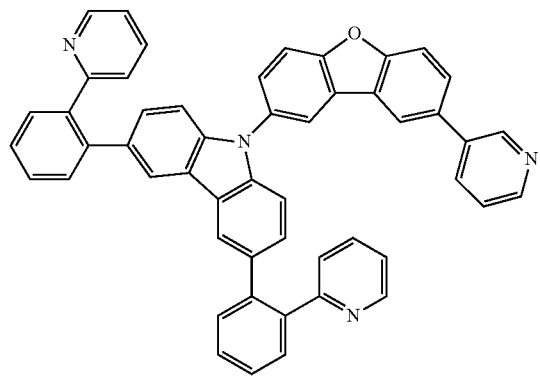
100
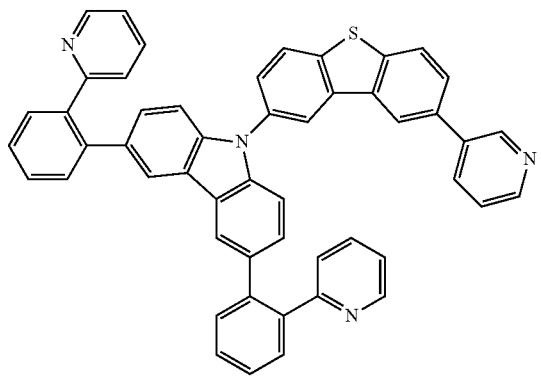
101
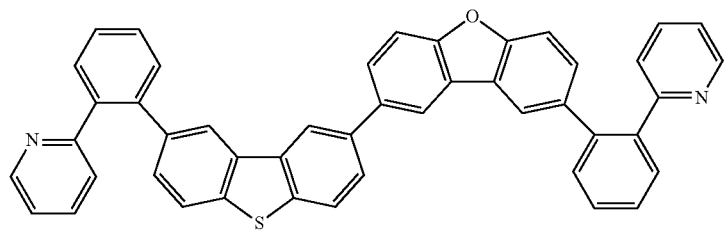
102

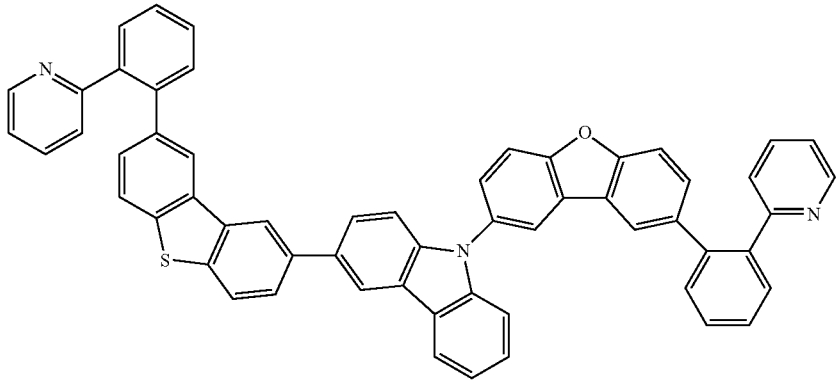
103
[Chemical Formula 40]
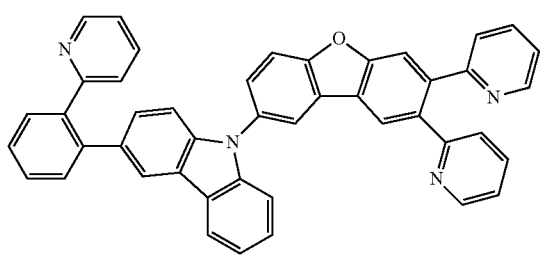
104
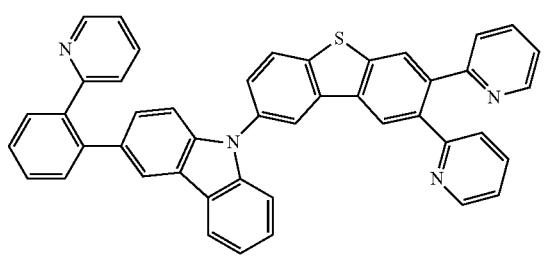
105
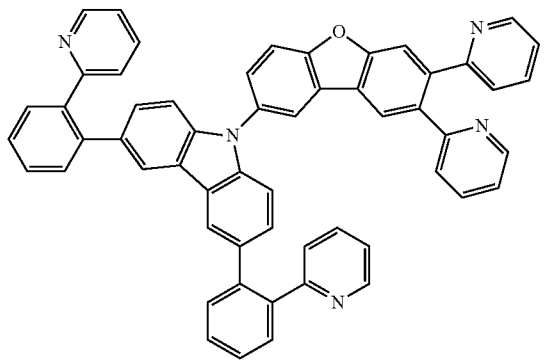
106
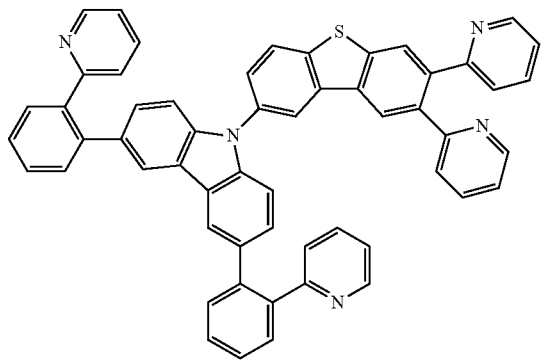
107
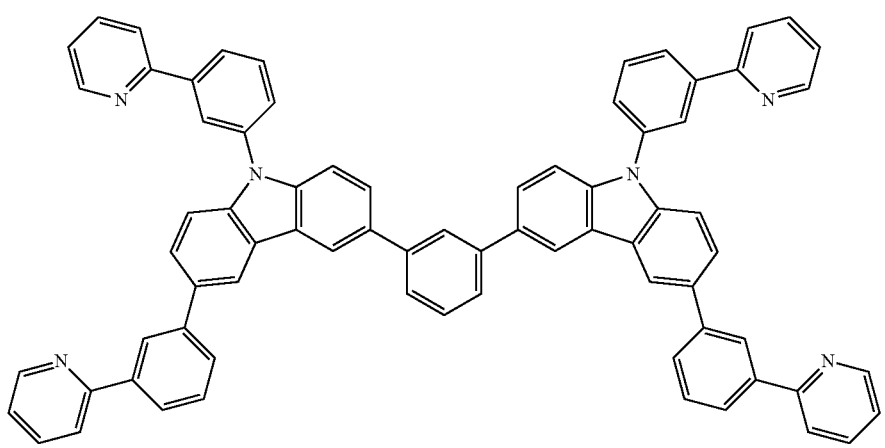
108

[Chemical Formula 41]
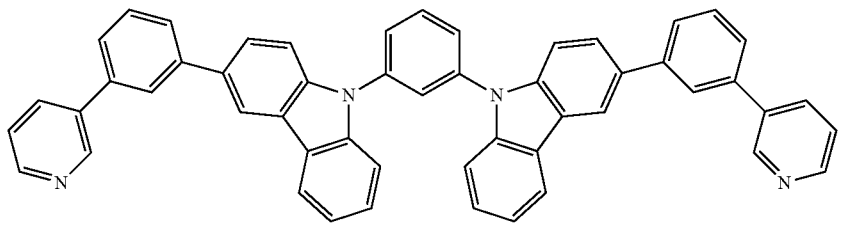
109
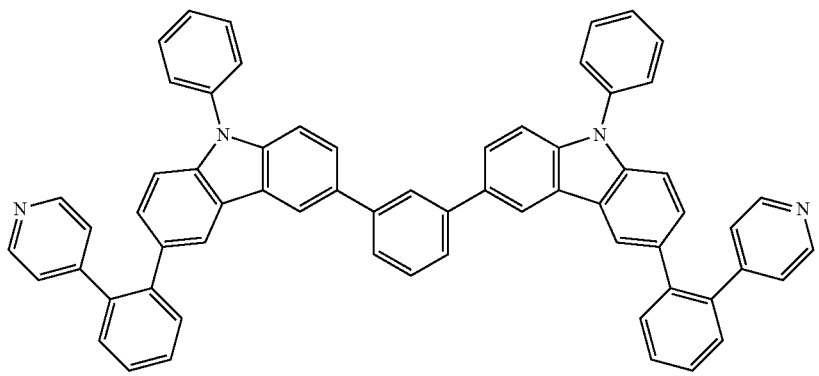
110
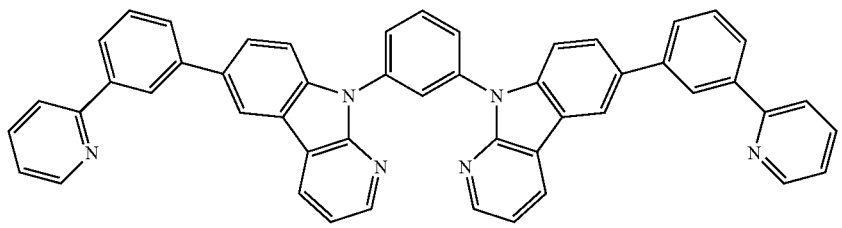
111
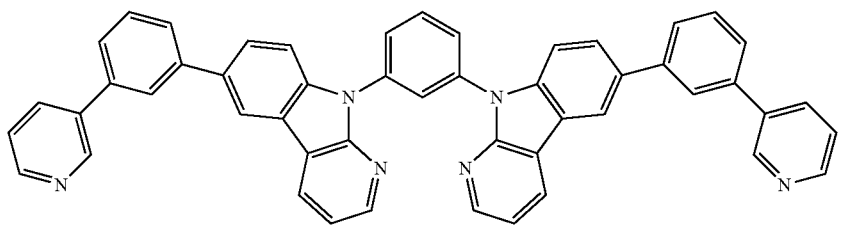
112
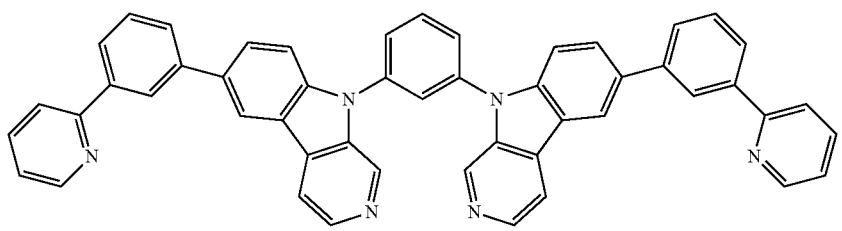
113
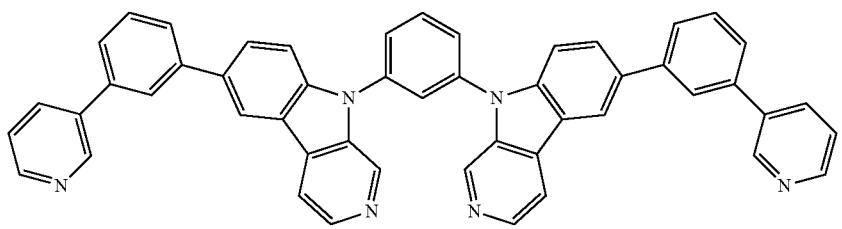
114

[Chemical Formula 42]
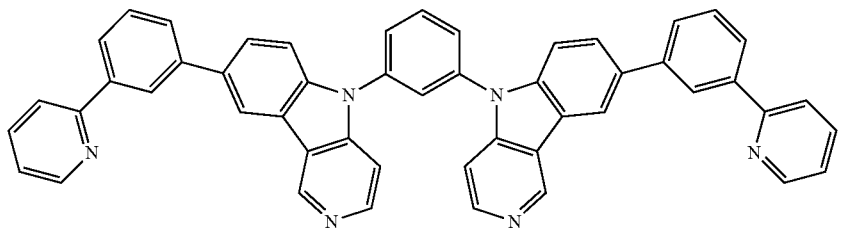
115
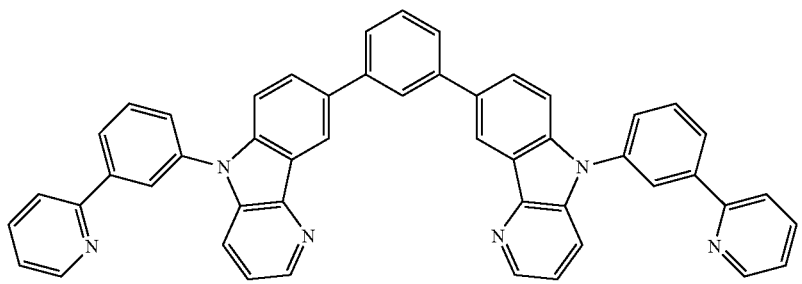
116
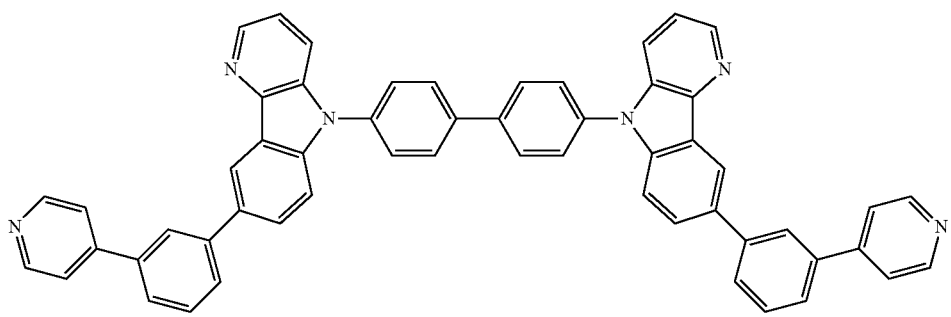
117
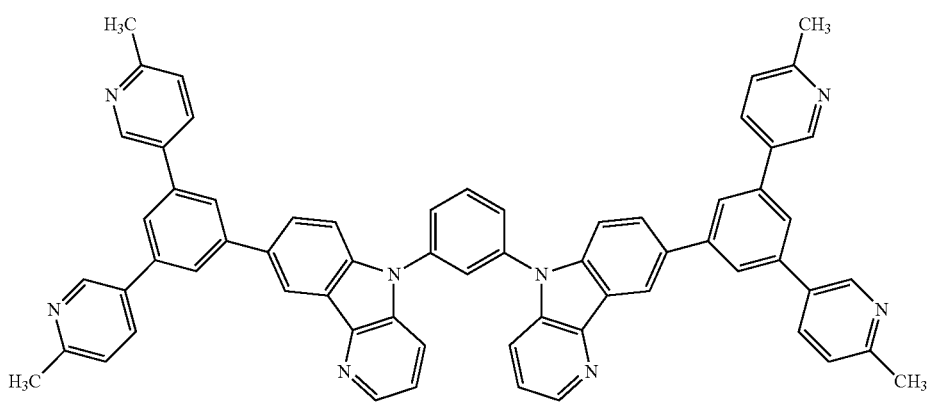
118

119
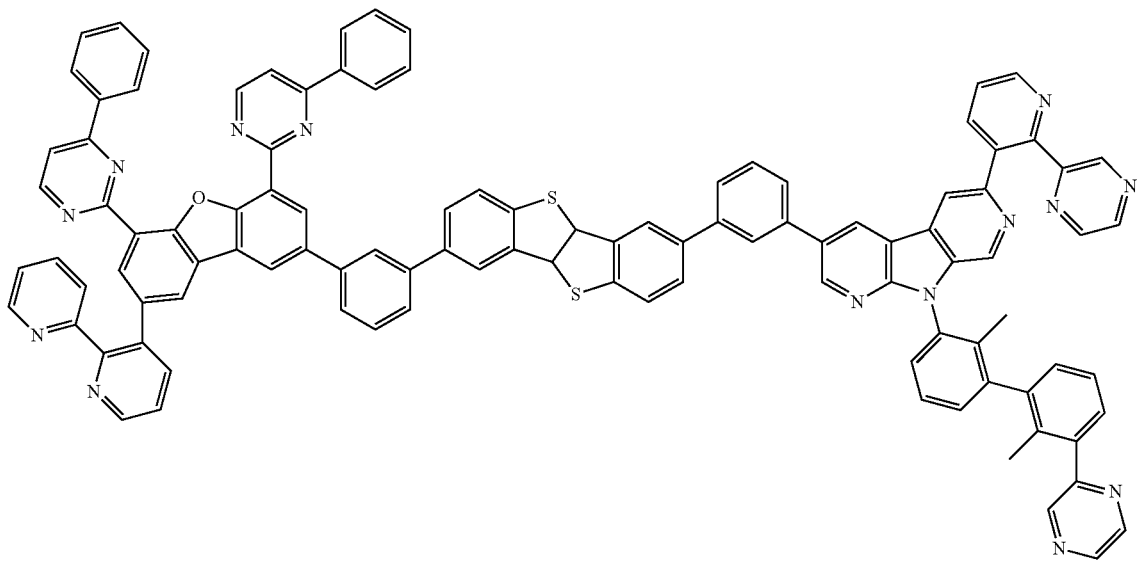
[Chemical Formula 43]
120
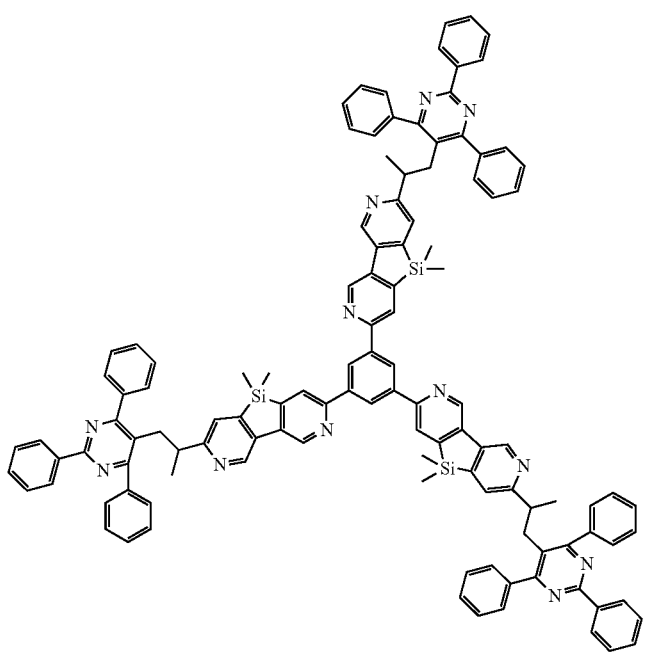

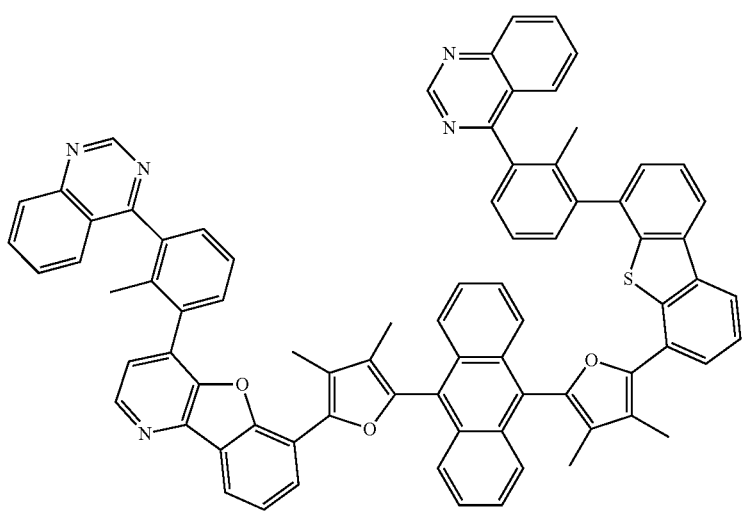
121
[Chemical Formula 44]
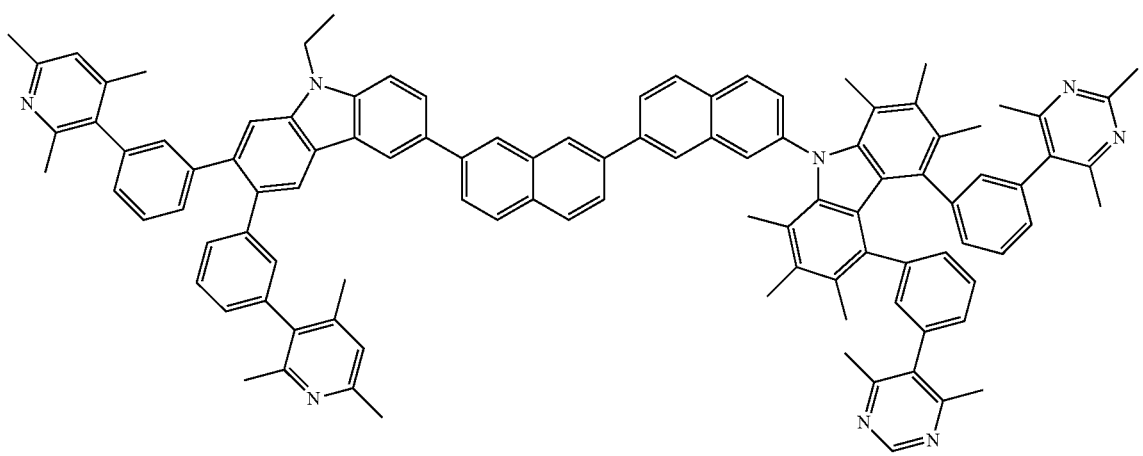
122
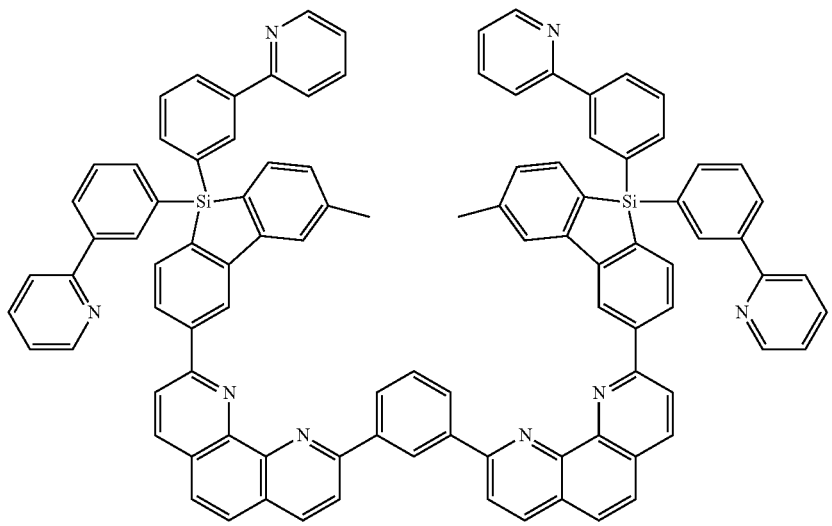
123

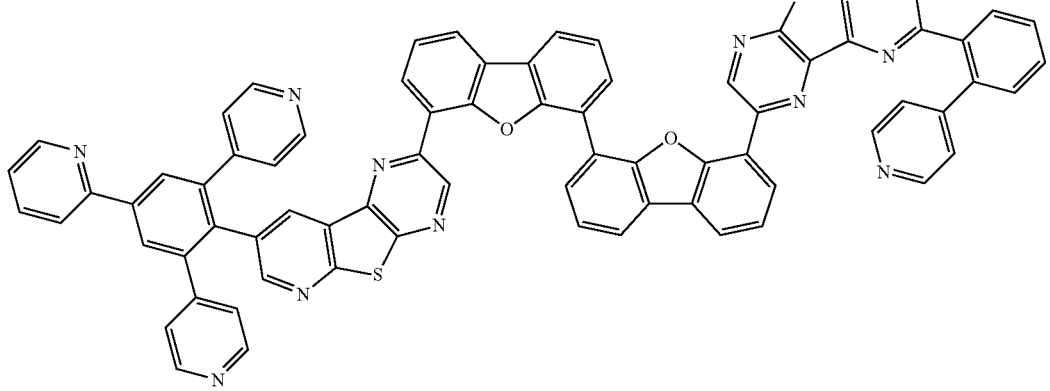
124
[Chemical Formula 45]
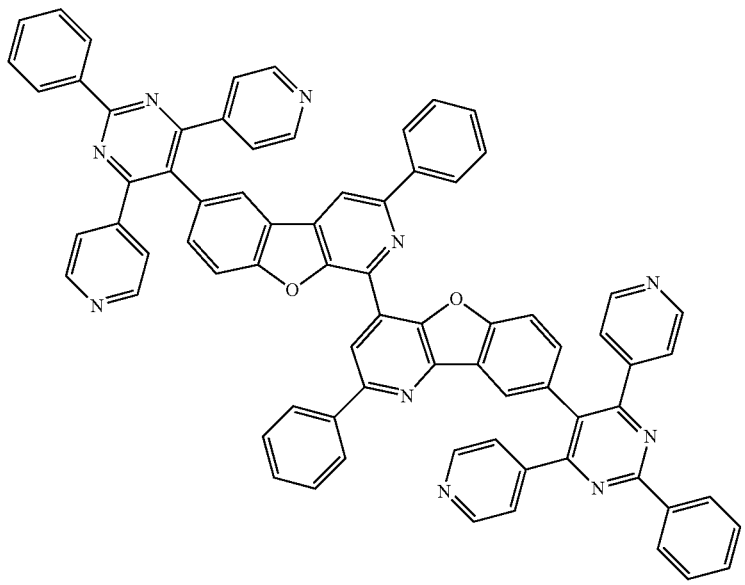
125
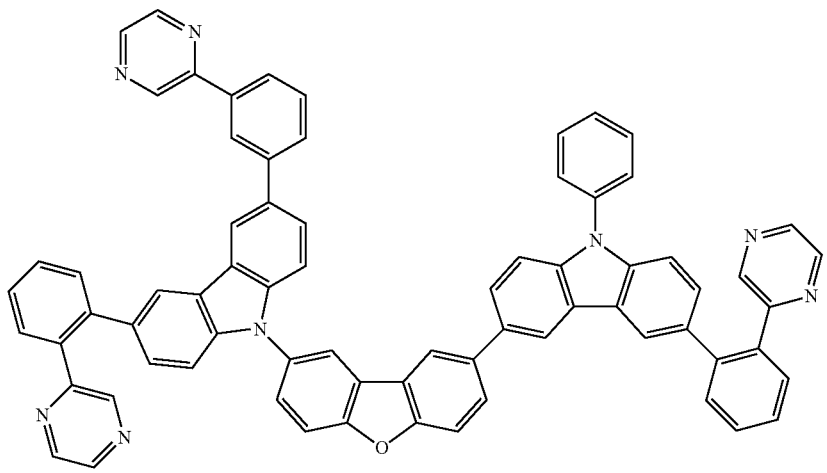
126

127
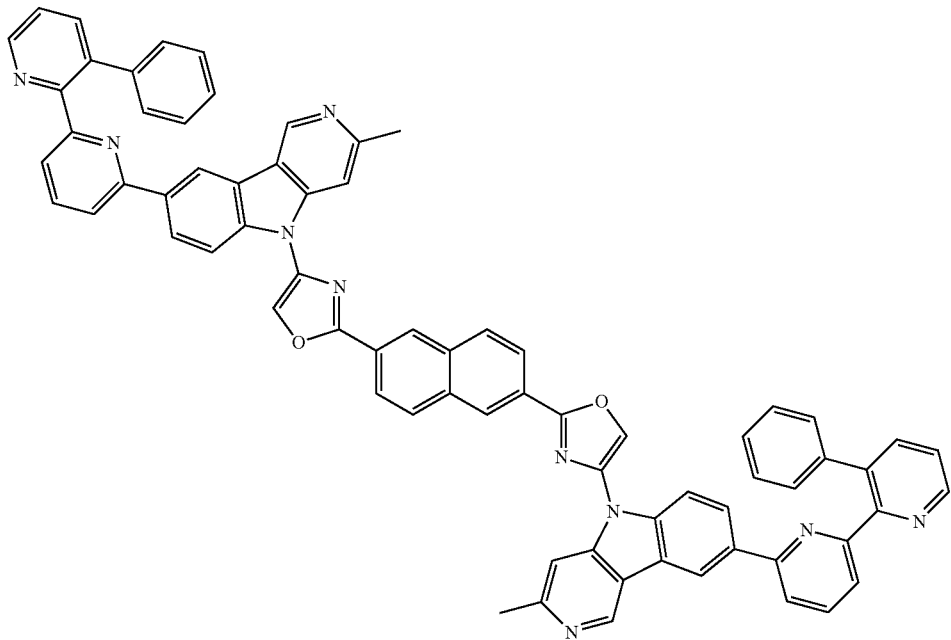
[Chemical Formula 46]
128
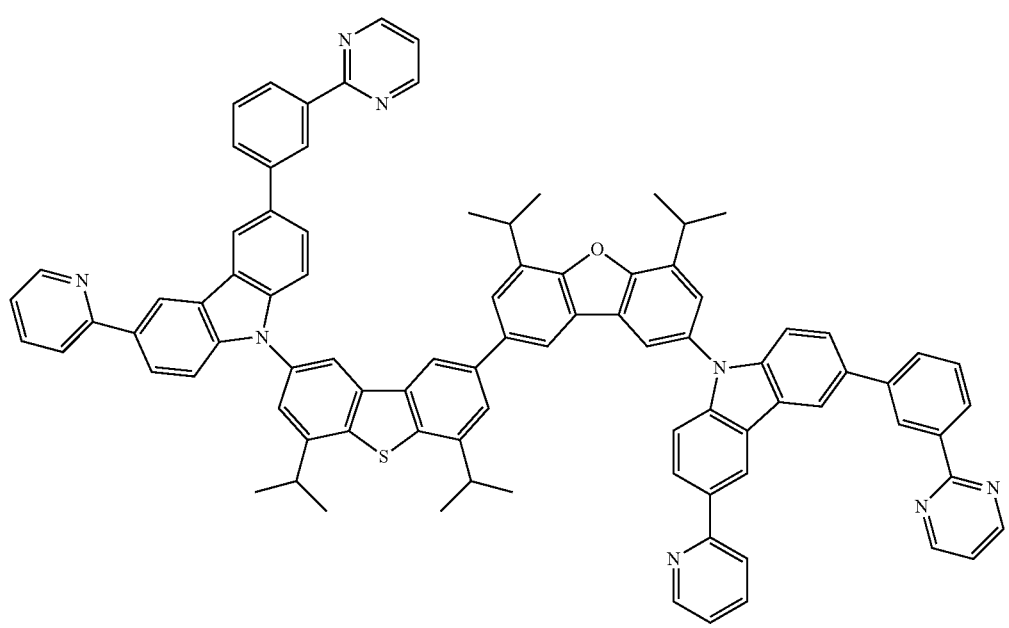

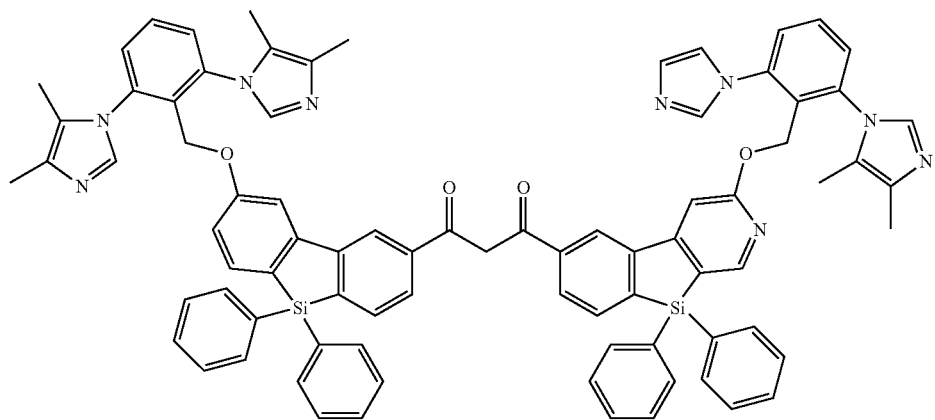

[Chemical Formula 47]
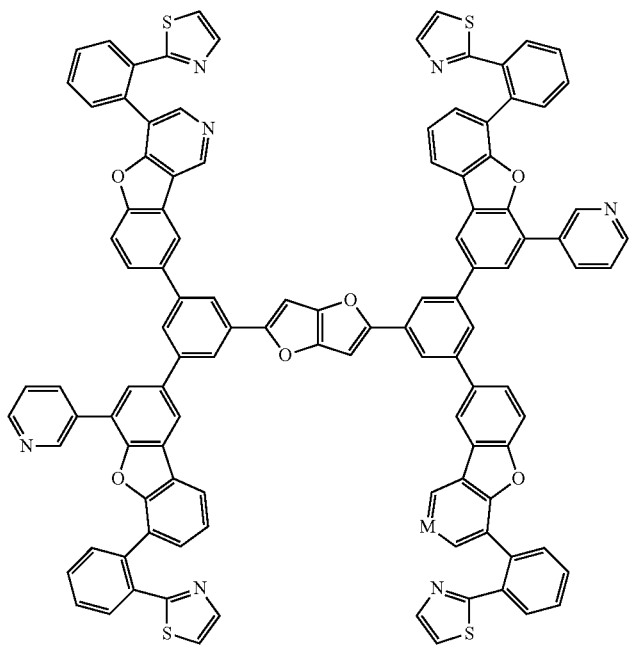
131
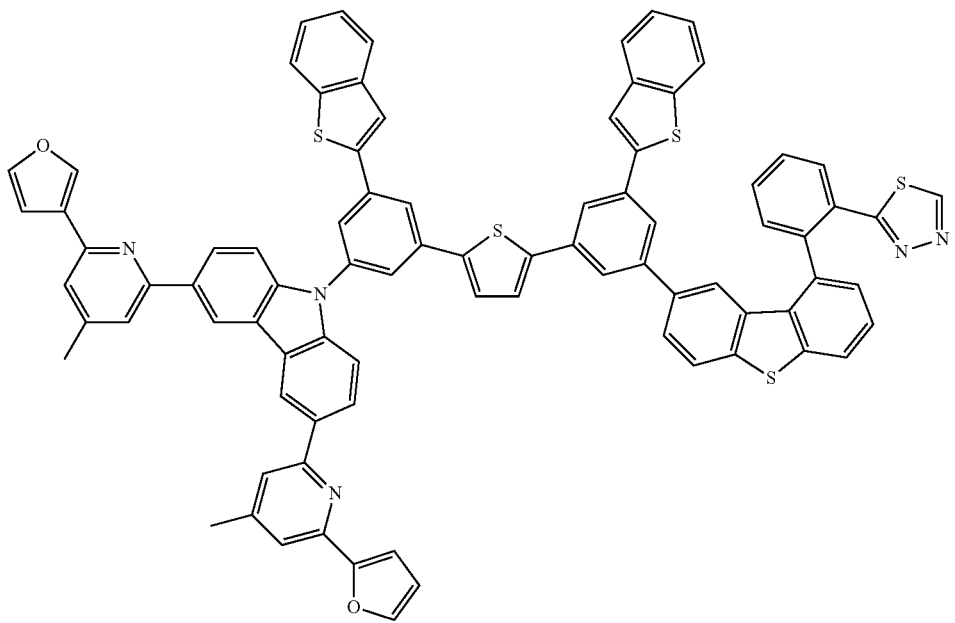
132

[Chemical Formula 48]
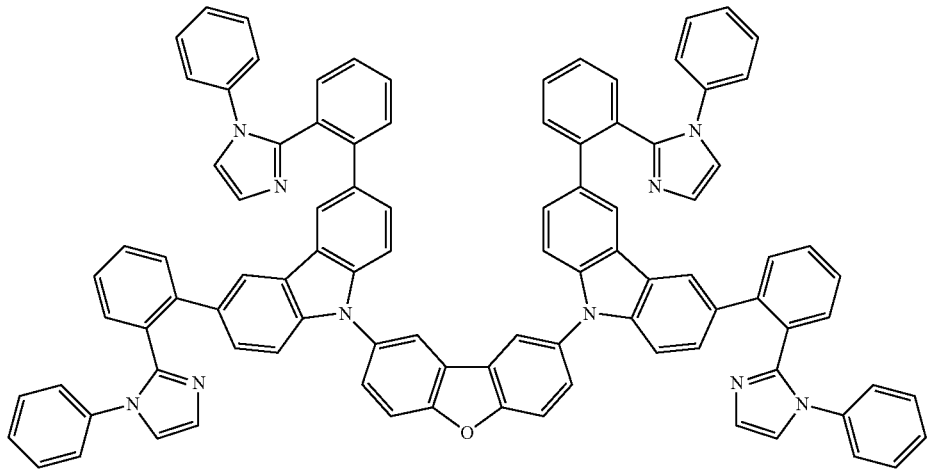
133
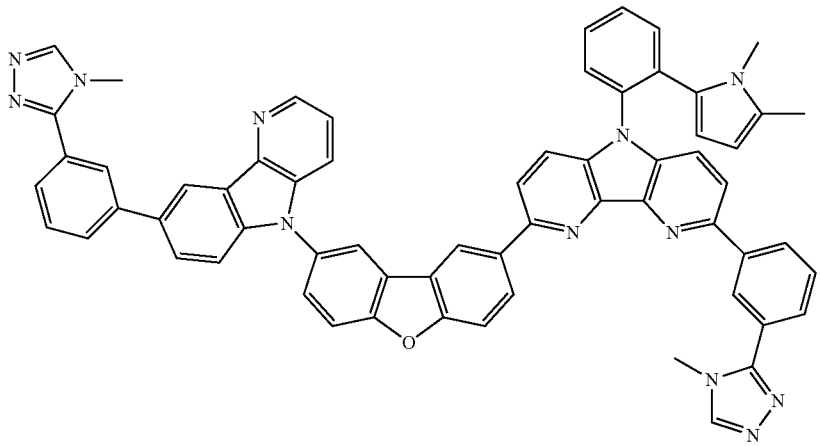
134
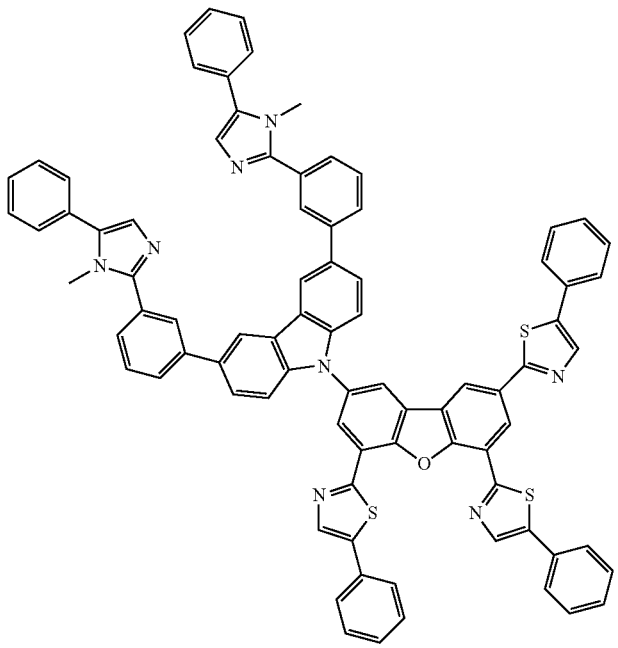
135

[Chemical Formula 49]
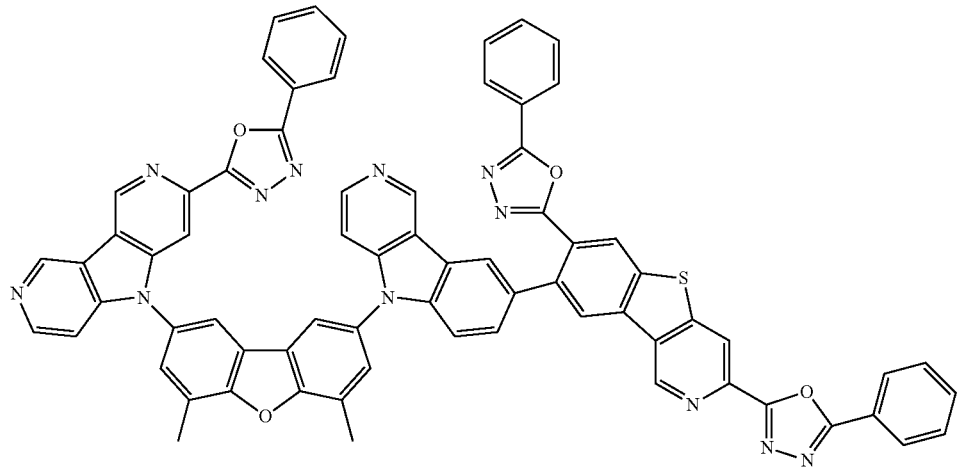
136
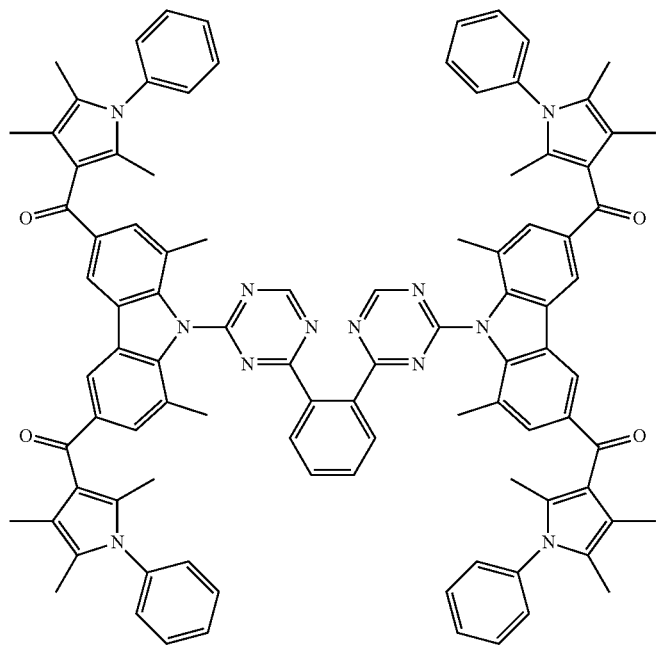
137

[Chemical Formula 50]
138
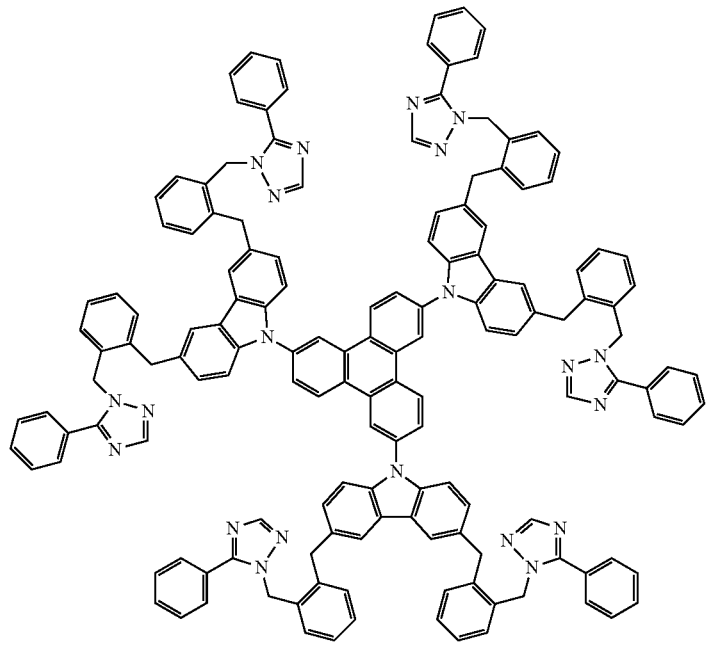
139
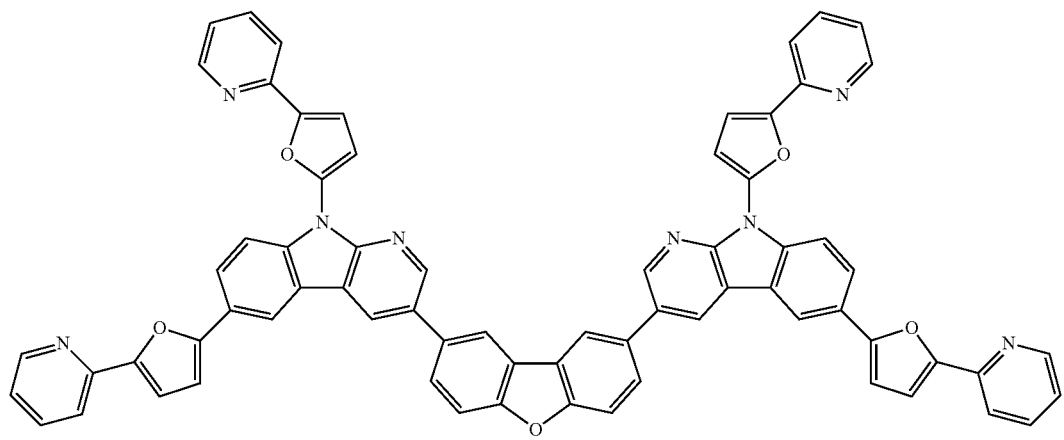
140
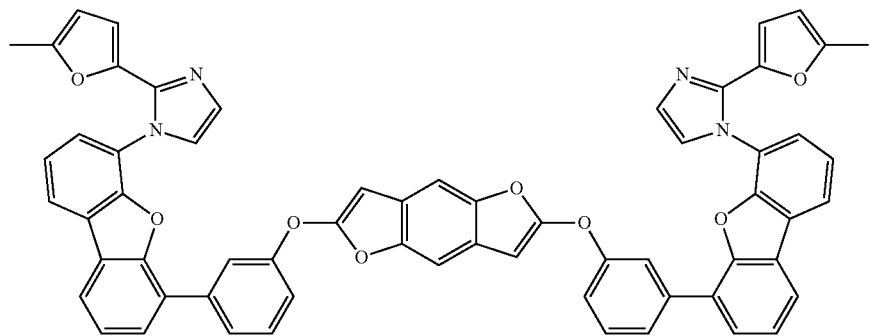

[Chemical Formula 51]
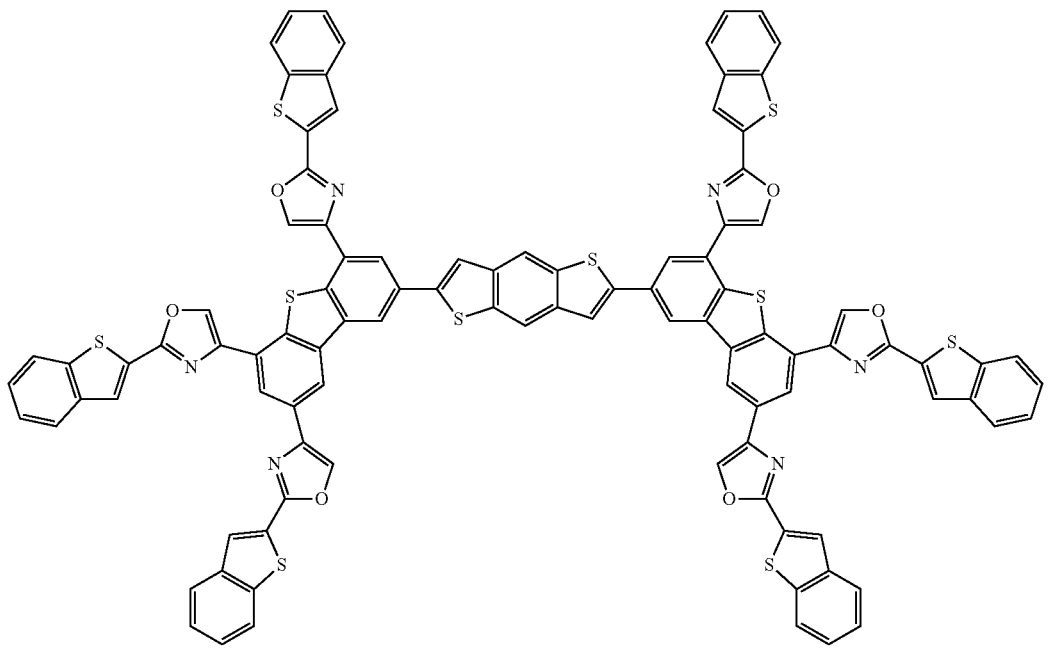
141
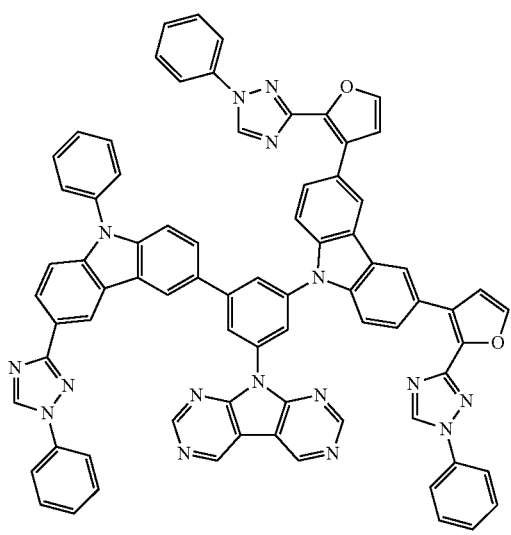
142
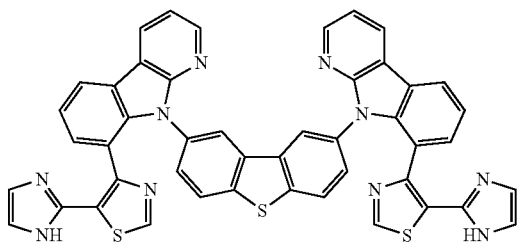
143
[Chemical Formula 52]
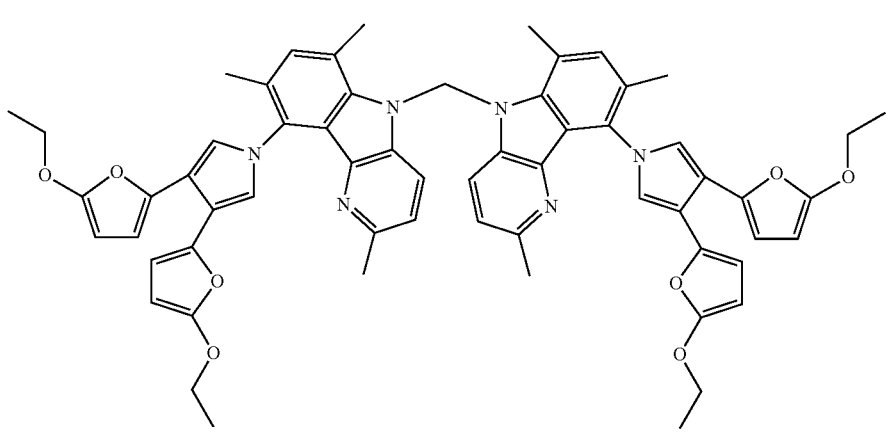
144

145
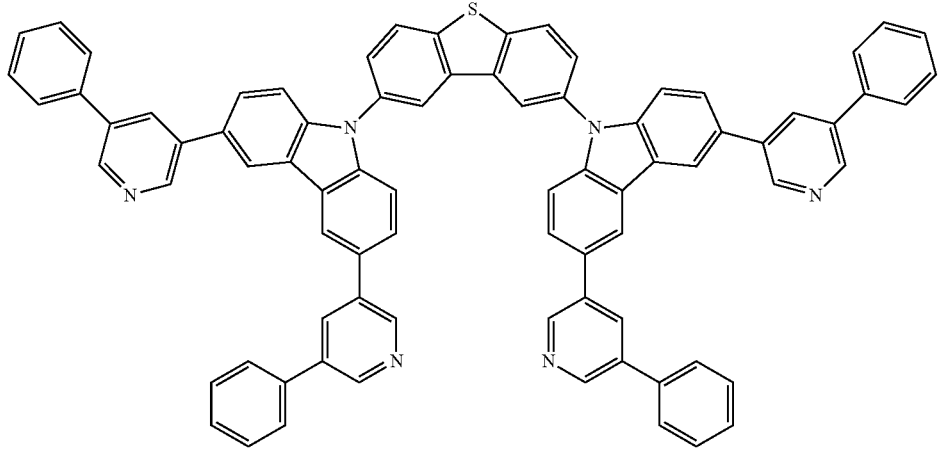
146
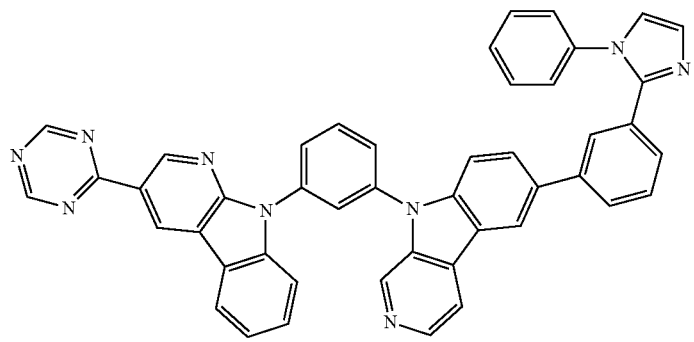
147
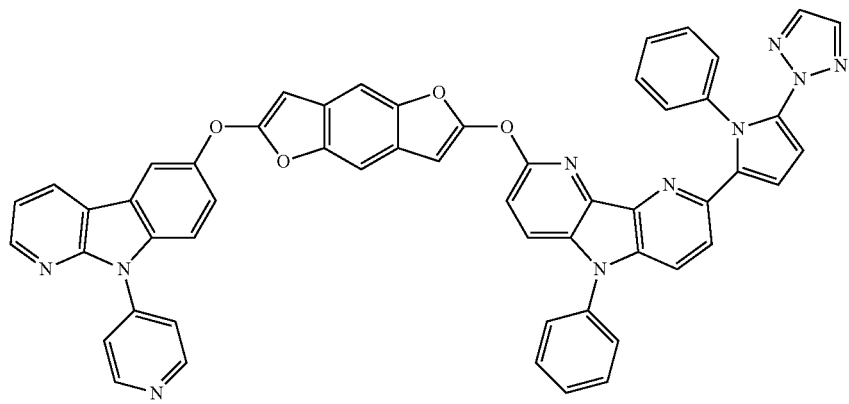

[Chemical Formula 53]
148
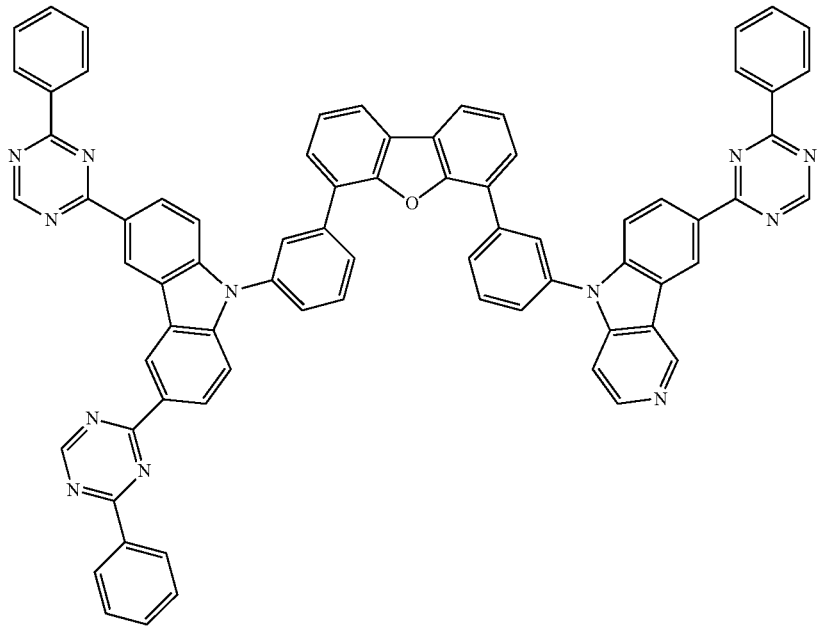
149
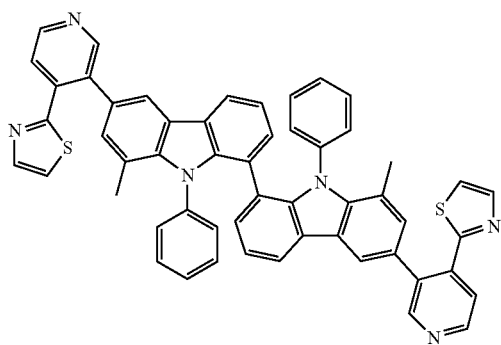
150
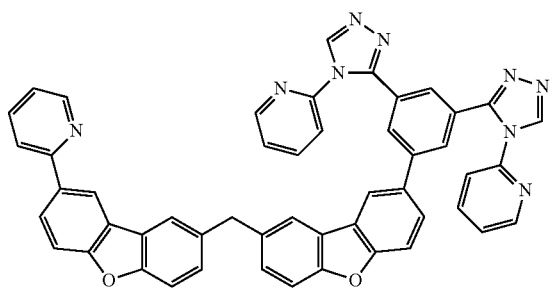
151
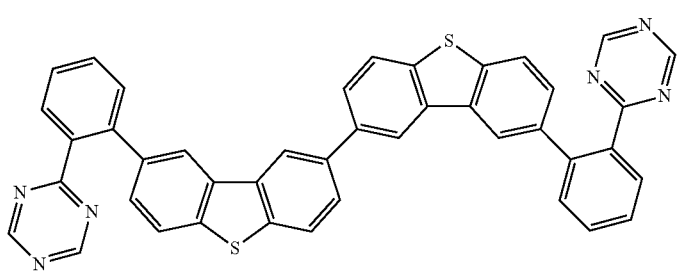

[Chemical Formula 54]
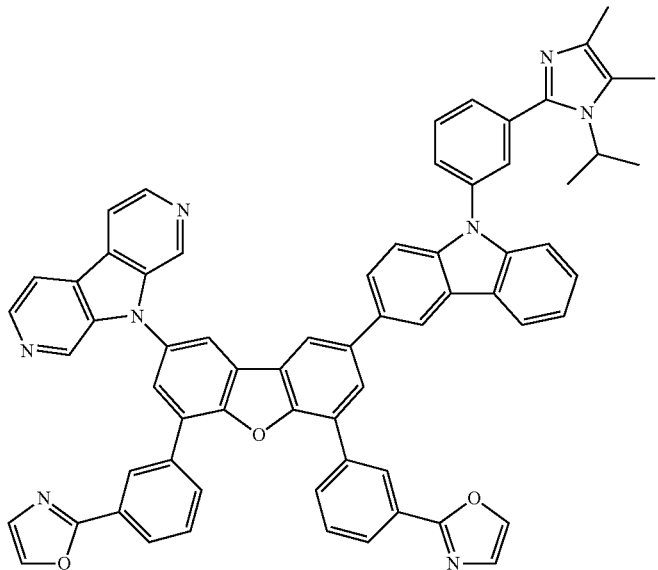
152
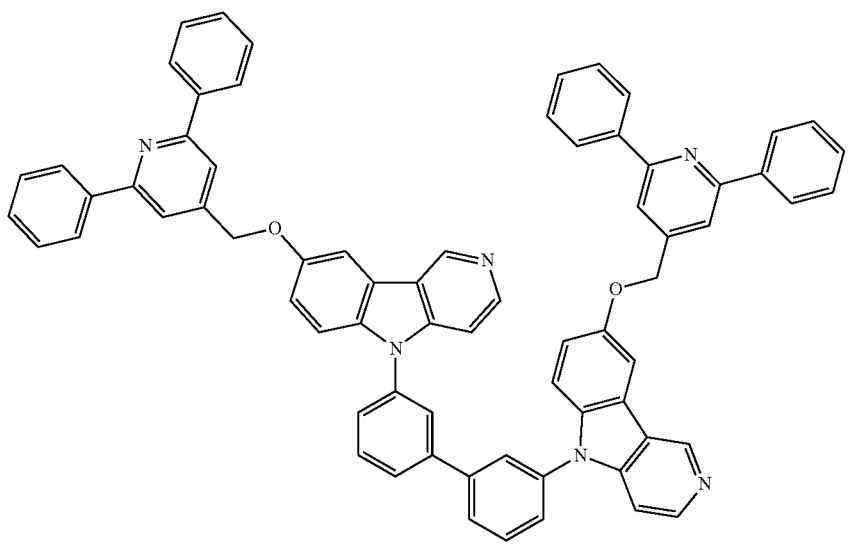
153

-continued
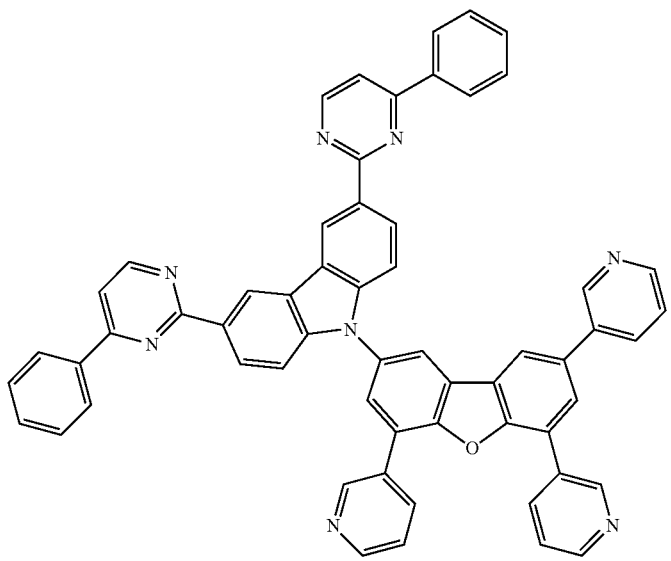
154
[Chemical Formula 55]
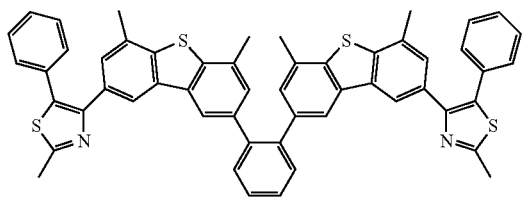
155
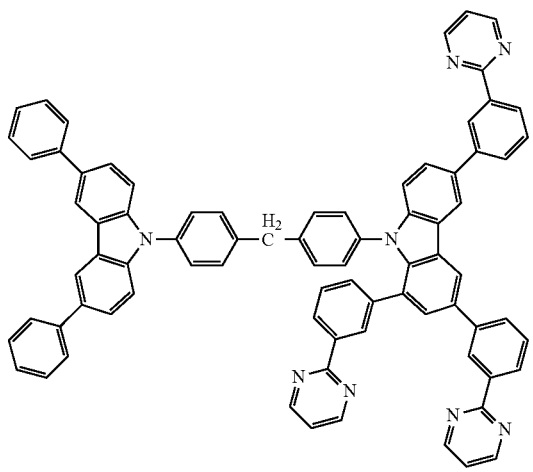
156
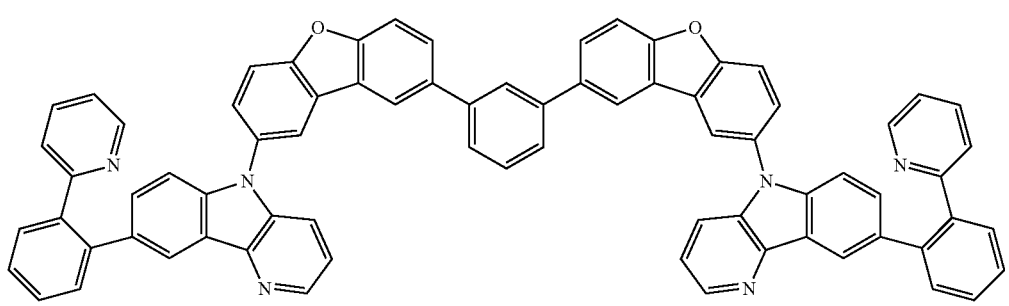
157

158
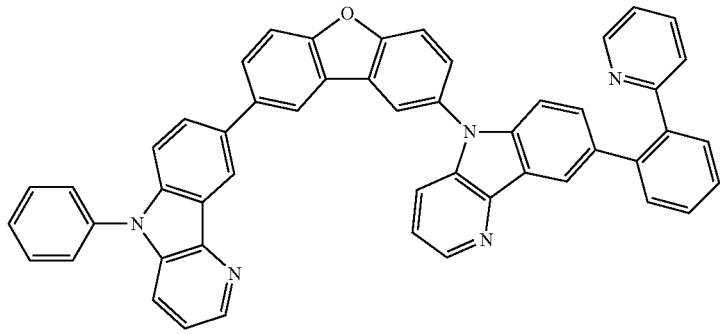
[Chemical Formula 56]
159
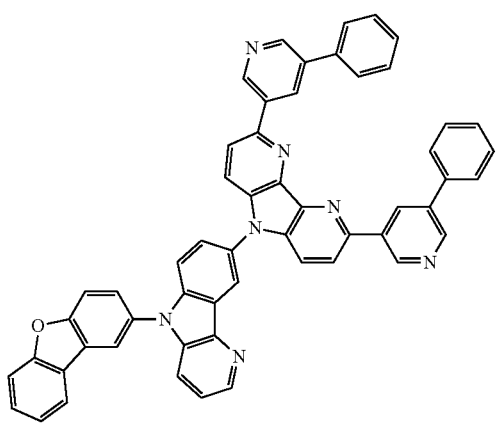
160
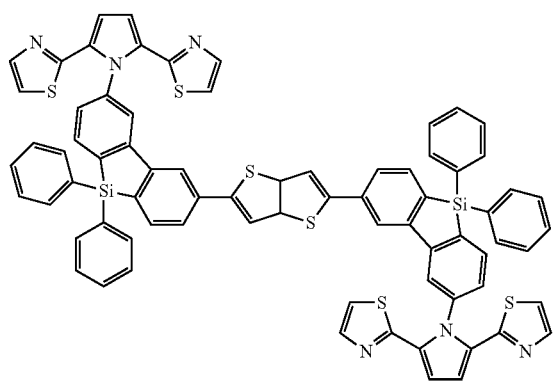
161
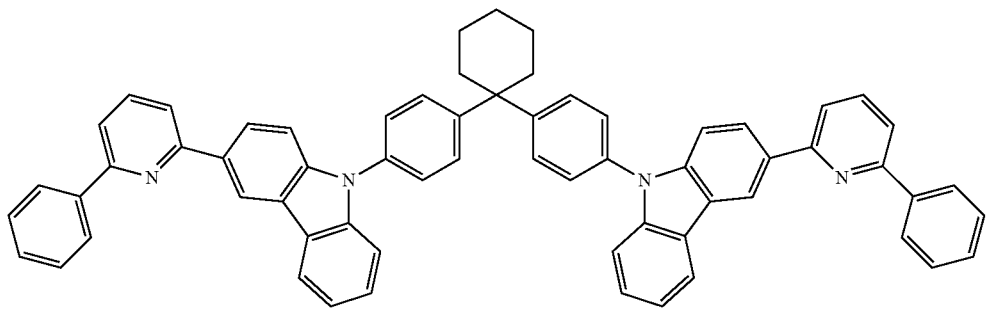
162
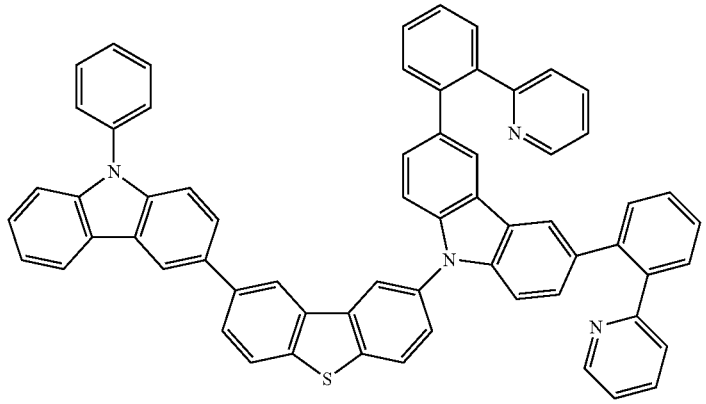

[Chemical Formula 57]
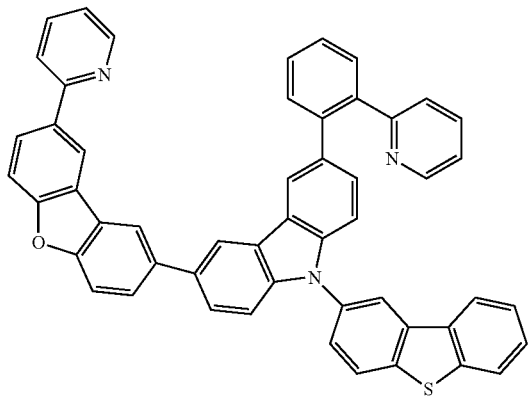 163
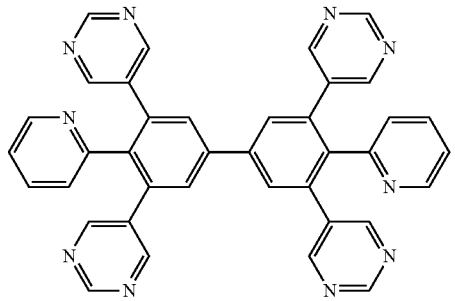 164
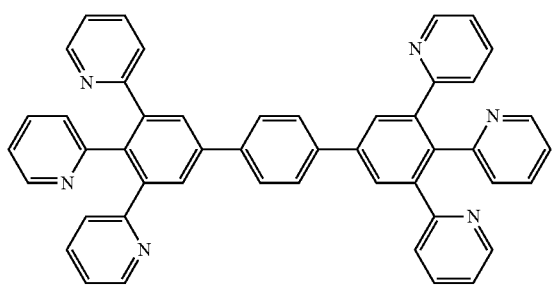 165
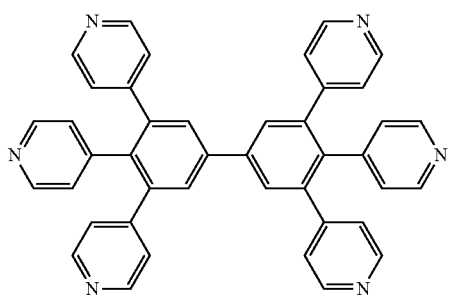 166
[Chemical Formula 58]
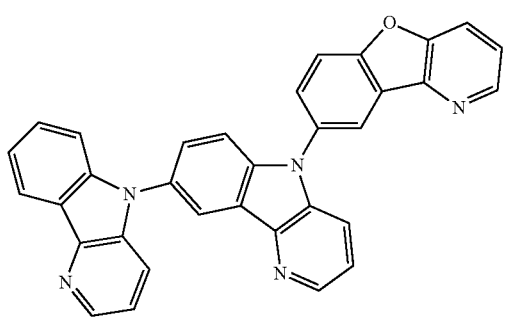 167
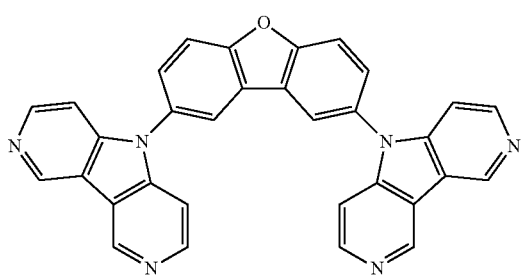 168
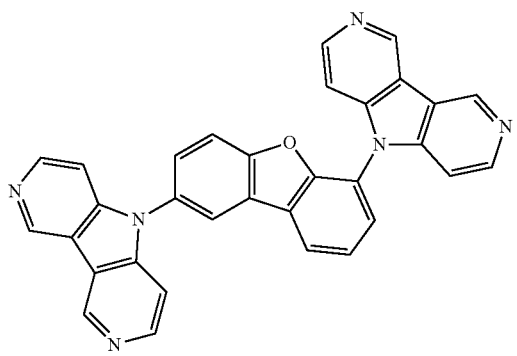 169
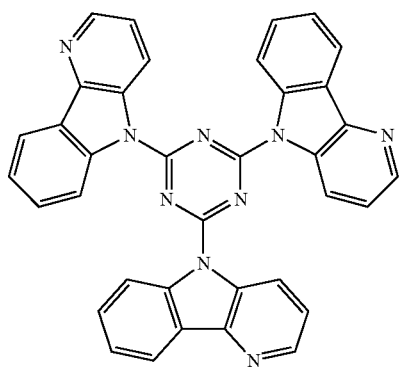 170

171 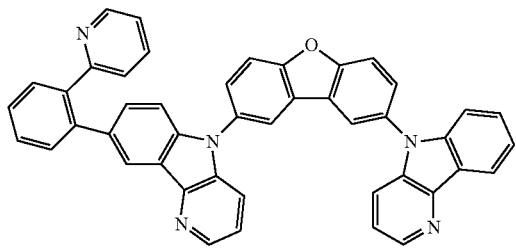
172 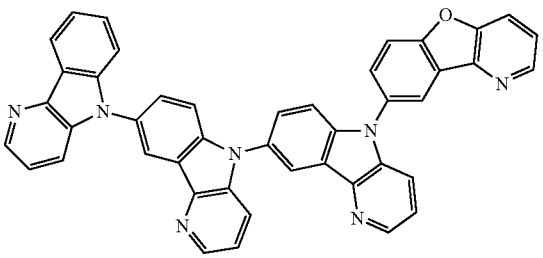
173 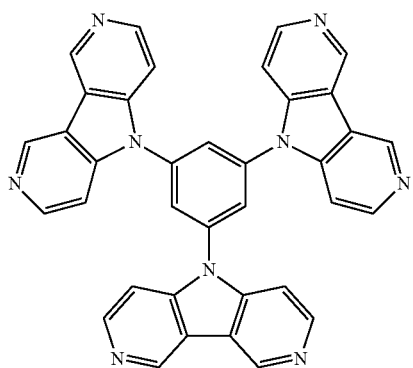
174 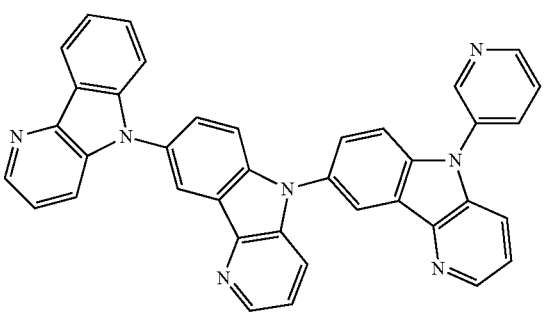
[Chemical Formula 59]
175 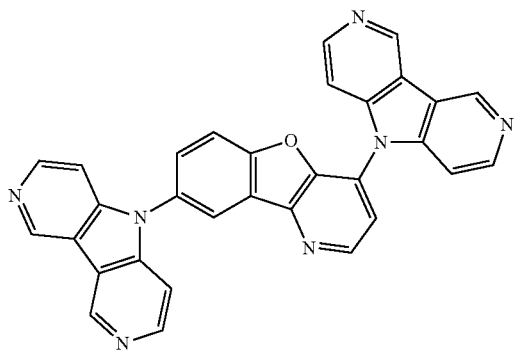
176 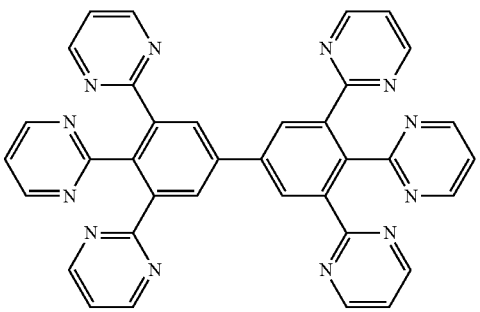
177 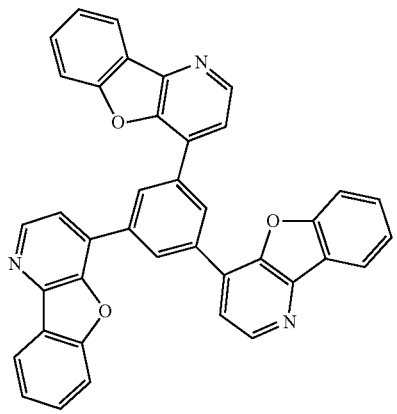
178 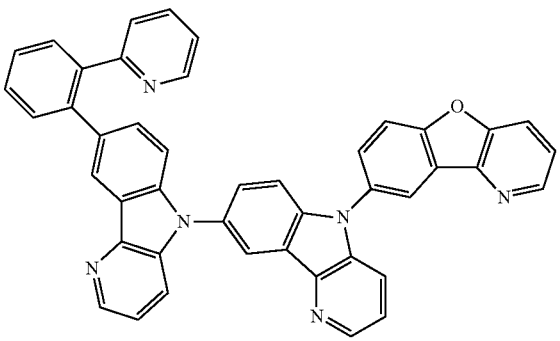

-continued
179 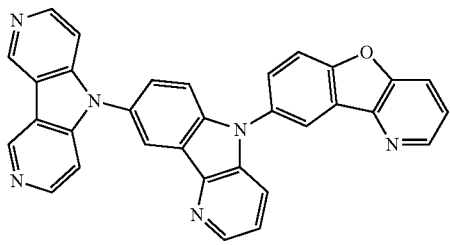
180 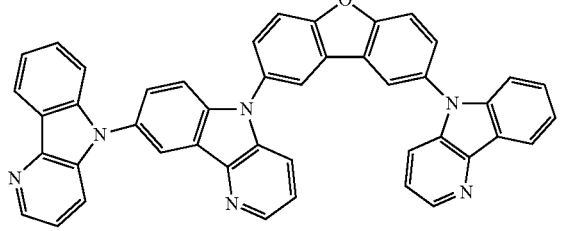
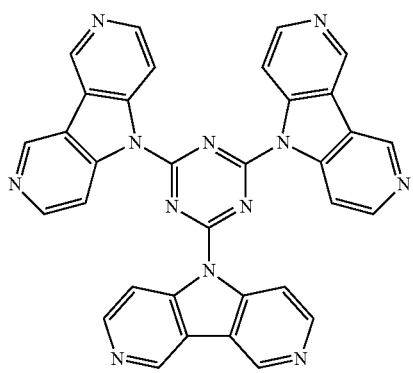
[Chemical Formula 60]
201 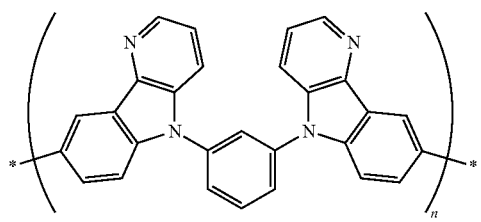
202 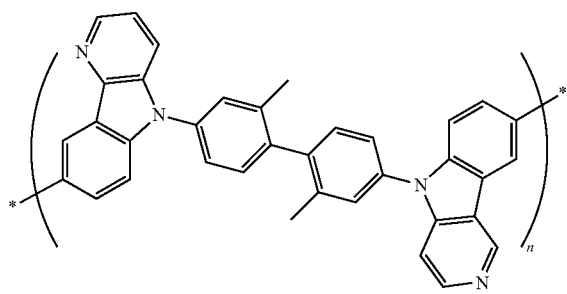
203 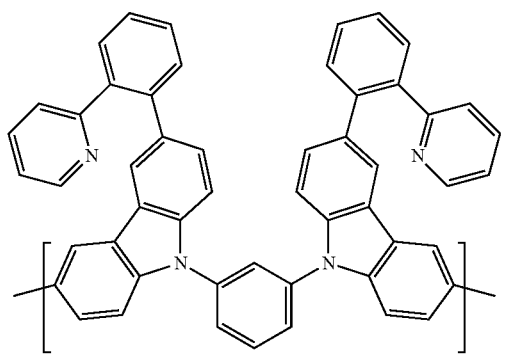
204 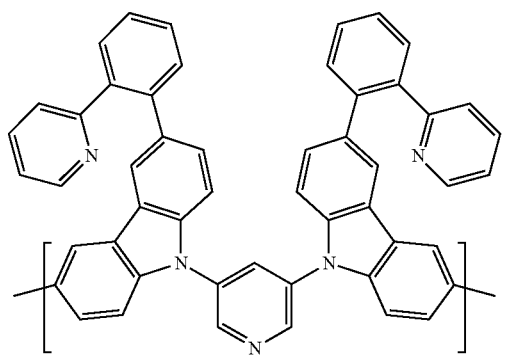
205 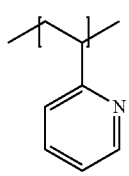
206 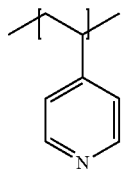

-continued
131     132
207 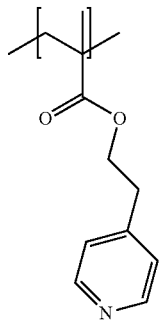
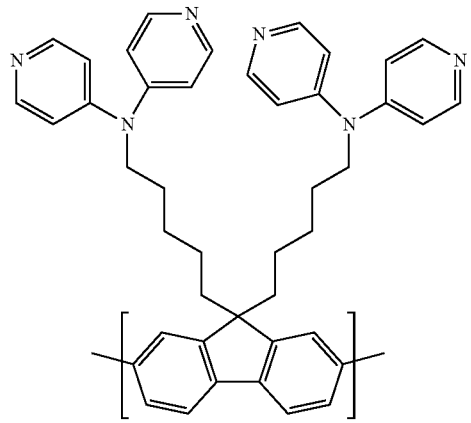
208
209 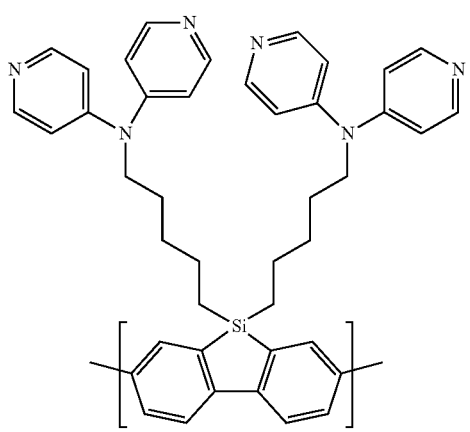 210
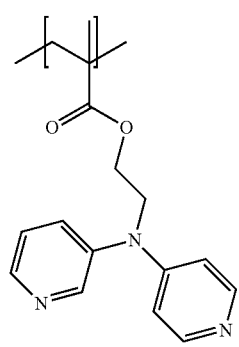
[Chemical Formula 61]
211 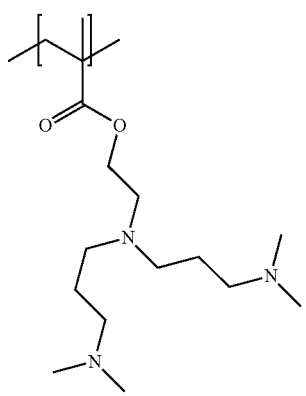 212
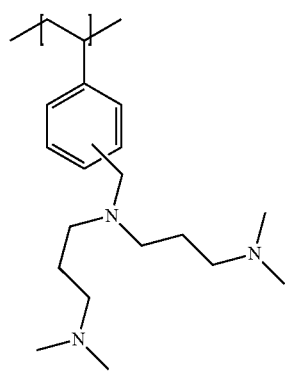

-continued
213
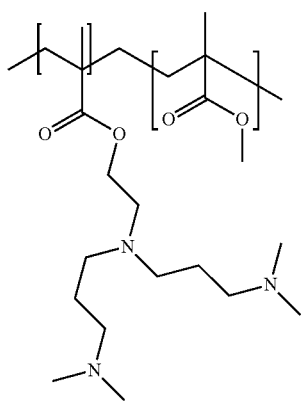
241
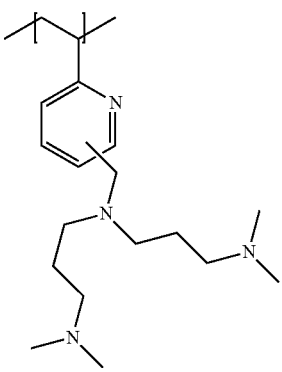
215
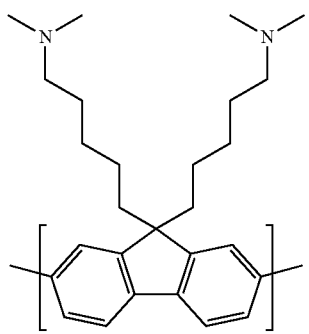
216
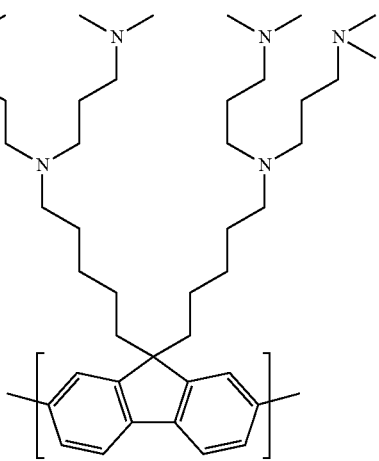
217
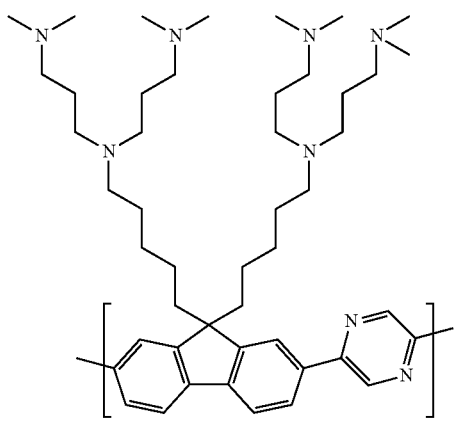
218
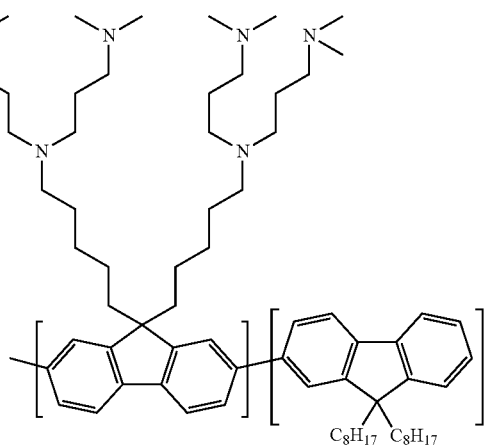

-continued
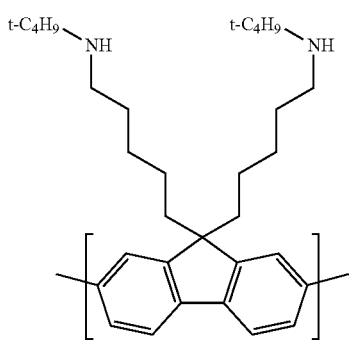
219
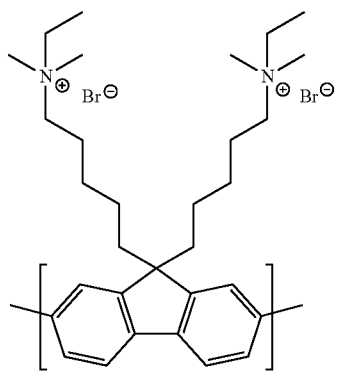
220
[Chemical Formula 62]
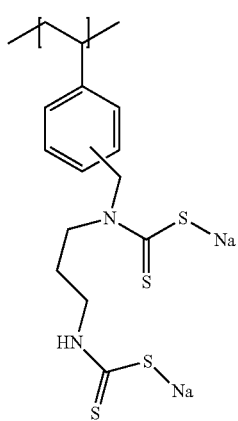
221
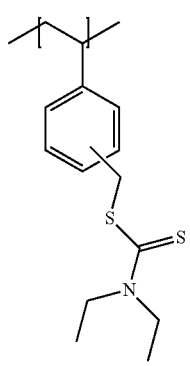
222
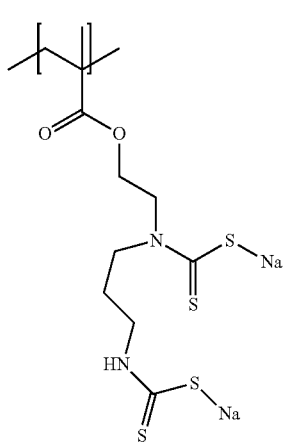
223
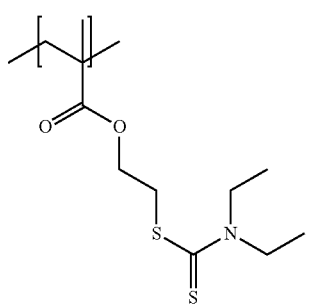
224

-continued
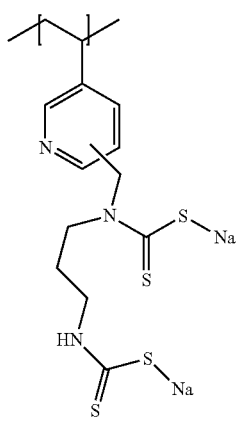
225
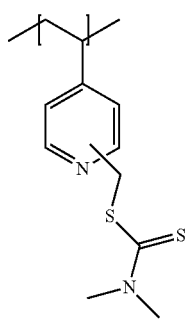
226
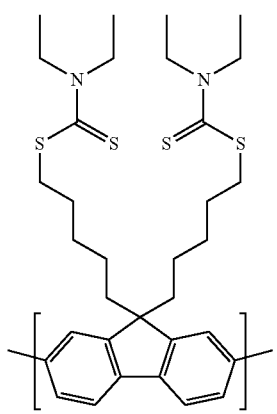
227
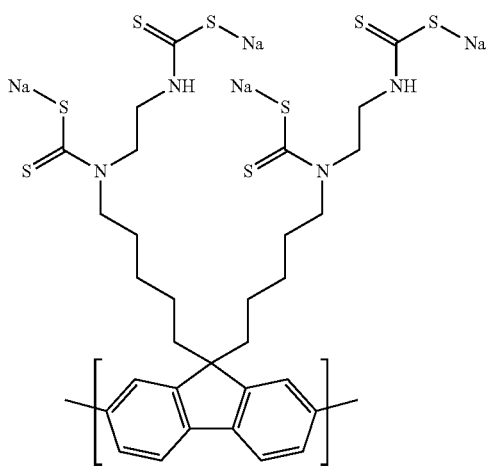
228
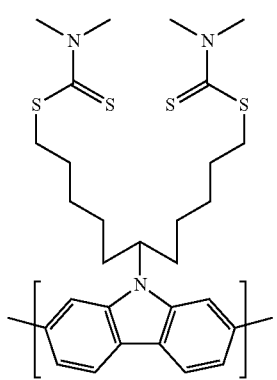
229
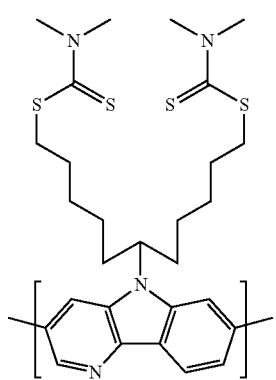
230

[Chemical Formula 63]

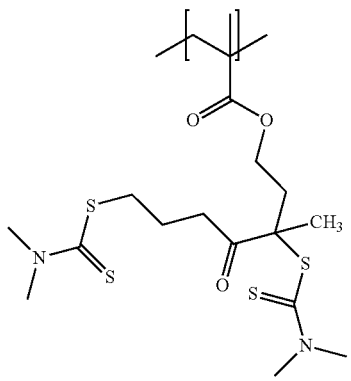

231

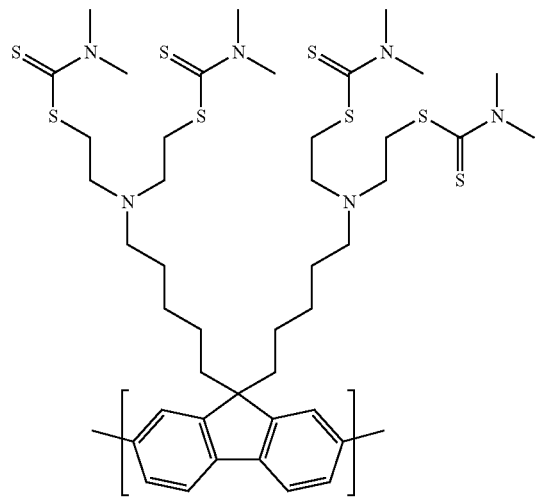

232

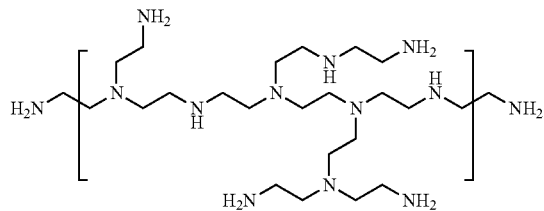

233

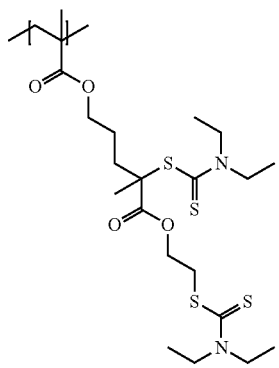

234

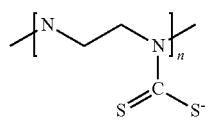

235

Example 1

The present invention will be specifically described below with reference to examples, but the present invention is not to be considered limited to these examples. It is to be noted that the indication of "part" or "%" is used in the examples, which represents "parts by mass" or "mass %" unless otherwise noted.

<<Synthesis of Exemplary Compound>>

First, for some of the exemplary compounds mentioned above, synthesis examples will be demonstrated.

[Synthesis of Exemplary Compound 1]

With reference to JP 2010-235575 A, the exemplary compound 1 was synthesized in accordance with the following synthesis formula.

[Chemical Formula 64]

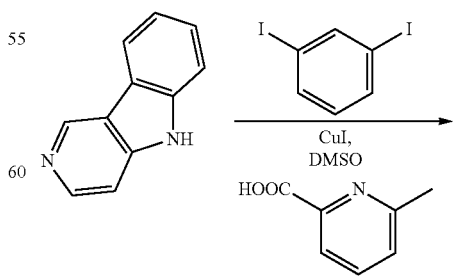

Compound 1-1

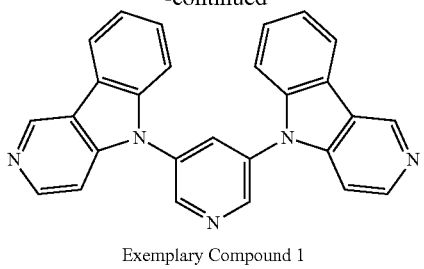

Exemplary Compound 1

First, under a nitrogen stream, a solution was prepared with the addition of 1,3-diiodobenzene from Aldrich: 460 mg (1.4 mmol), the compound 1-1: 470 mg (2.8 mmol), DMSO: 15 ml, and potassium phosphate: 0.89 g (4.2 mmol), and this solution was stirred for 10 minutes. It is to be noted that the compound 1-1 was used which was synthesized with reference to JP 2010-235575 A.

Next, the stirred solution was, with the addition of CuI: 53 mg (0.28 mmol) and 6-methyl picolinic acid (0.56 mmol) thereto, heated at 125° C. for 7 hours. Thereafter, the solution was cooled with water, and stirred for 1 hour with the addition of 5 ml of water under the water cooling. Then, a crude product precipitated in the solution was filtered, further subjected to column purification with an eluent of heptane:toluene=9:1 to 3:1, and thereafter recrystallized with o-dichlorobenzene/acetonitrile to obtain 470 mg of the exemplary compound 1 (yield: 82%).

[Synthesis of Exemplary Compound 10]

With reference to JP 2008-69122 A, the following exemplary example 10 was synthesized.

[Chemical Formula 65]

Exemplary Compound 10

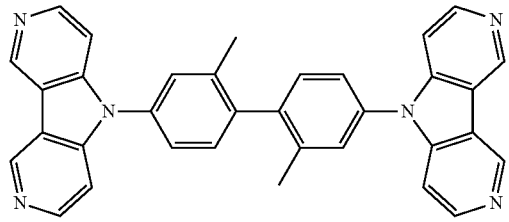

[Synthesis of Exemplary Compound 13]

With reference to paragraphs [0038] to [0040] of JP 2010-235575, the following exemplary compound 13 was synthesized.

[Chemical Formula 66]

Exemplary Compound 13

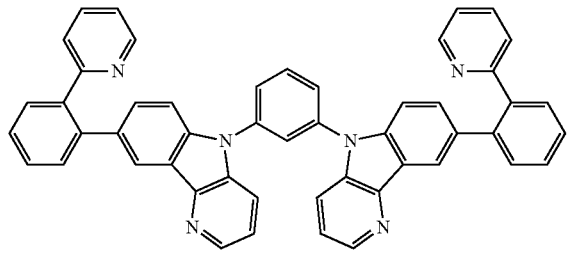

[Synthesis of Exemplary Compound 18]

The exemplary compound 18 was synthesized in accordance with the following synthesis formula.

[Chemical Formula 67]

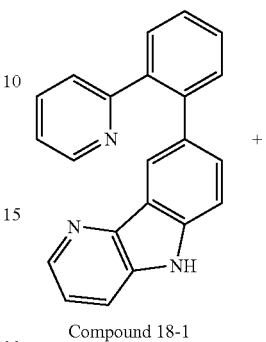

Compound 18-1

+

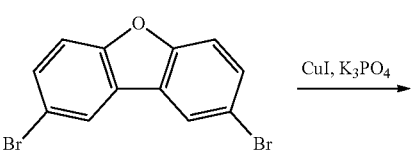

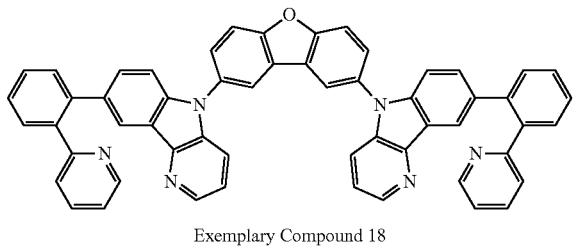

Exemplary Compound 18

First, under a nitrogen stream, a solution was prepared with the addition of 2,8-dibromo-benzofran from Aldrich: 0.46 g (1.4 mmol), the compound 18-1: 0.90 g (2.8 mmol), DMSO: 15 ml, and potassium phosphate: 0.89 g (4.2 mmol), and this solution was stirred for 10 minutes. It is to be noted that the compound 18-1 was used which was synthesized with reference to JP 2010-235575 A.

Next, the stirred solution was, with the addition of CuI: 53 mg (0.28 mmol) and 6-methyl picolinic acid (0.56 mmol) thereto, heated at 125° C. for 7 hours. Thereafter, the solution was cooled with water, and stirred for 1 hour with the addition of 5 ml of water under the water cooling. Then, a crude product precipitated in the solution was filtered, further subjected to column purification with an eluent of heptane:toluene=4:1 to 1:1, and recrystallized with o-dichlorobenzene/acetonitrile to obtain 0.80 g of the exemplary compound 18 (yield: 71%).

[Synthesis of Exemplary Compound 20]

With reference to JP 2010-235575 A, the exemplary compound 20 was synthesized in accordance with the following synthesis formula.

[Chemical Formula 68]

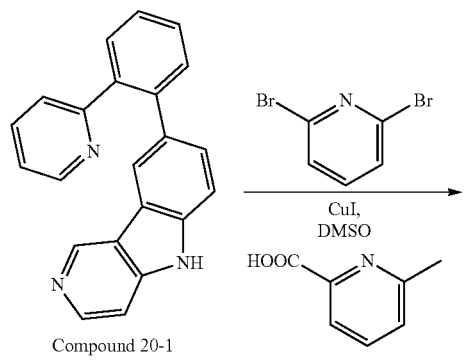

Compound 20-1

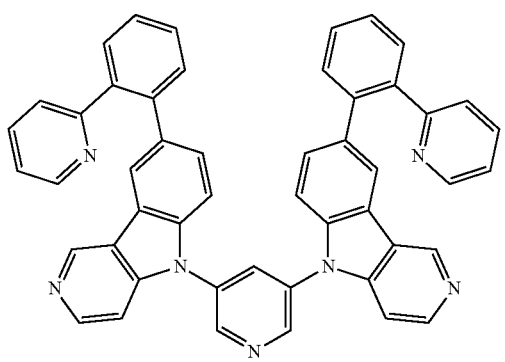

Exemplary Compound 20

Synthesis of Exemplary Compound 170

[Chemical Formula 69]

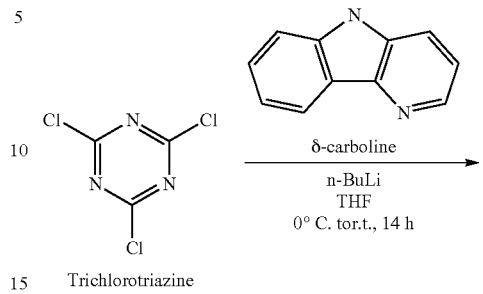

Trichlorotriazine

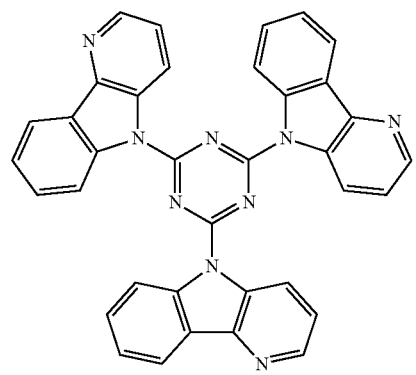

Exemplary Compound 170

First, under a nitrogen stream, a solution was prepared with the addition of 2,6-dibromopyridine from Aldrich: 0.33 g (1.4 mmol), the compound 20-1: 0.90 g (2.8 mmol), DMSO: 15 ml, and potassium phosphate: 0.89 g (4.2 mmol), and this solution was stirred for 10 minutes. It is to be noted that the compound 20-1 was used which was synthesized with reference to JP 2010-235575 A.

Next, the stirred solution was, with the addition of CuI: 53 mg (0.28 mmol) and 6-methyl picolinic acid (0.56 mmol) thereto, heated around 125° C. for 7 hours. Thereafter, the solution was cooled with water, and stirred for 1 hour with the addition of 5 ml of water under the water cooling. Then, a crude product precipitated in the solution was filtered, further subjected to column purification with an eluent of heptane:toluene=9:1 to 3:1, and recrystallized with o-dichlorobenzene/acetonitrile to obtain 0.75 g of the exemplary compound 20 (yield: 750).

[Synthesis of Exemplary Compound 170]

The exemplary compound 170 was synthesized in accordance with the following synthesis formula.

In a 100 ml recovery flask, a THF (50 ml) solution of δ-carboline (5.5 g, 33 mmol) was stirred at 0° C. for 1 hour under a nitrogen atmosphere. Thereafter, 1.6M of n-BuLi hexane solution (25 ml, 1.2 eq.) was gradually added while being delivered by drops, and stirring was carried out until reaching the room temperature.

In a 200 ml recovery flask, a THF (100 ml) solution of trichlorotriazine (1.0 g, 4.5 mmol) was stirred at room temperature under a nitrogen atmosphere, and stirred for 14 hours at room temperature while from the previous 100 ml recovery flask to this solution, the n-BuLi solution of δ-carboline was gradually added while being delivered by drops.

Thereafter, the solution was moved to a separatory funnel to carry out an extraction. After the separation into an organic phase and a water phase with the addition of an ethyl acetate a saturated saline, the organic phase was extracted and distilled away under reduced pressure. The obtained solid was purified by silica gel column chromatography to obtain a white solid (1.86 g, yield: 71%) of the exemplary compound 170.

[Synthesis of Exemplary Compound 176]

The exemplary compound 176 was synthesized in accordance with the following synthesis formula.

Synthesis of Exemplary Compound 176

[Chemical Formula 70]

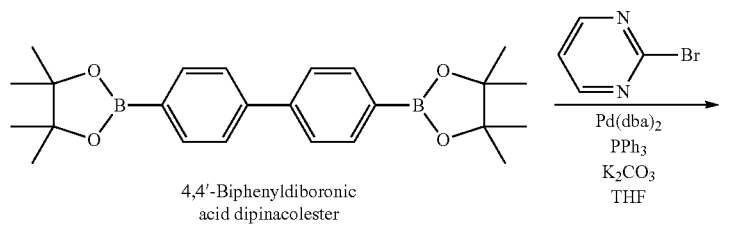

4,4'-Biphenyldiboronic acid dipinacolester

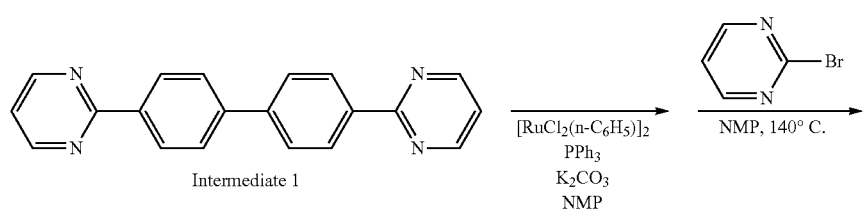

Intermediate 1

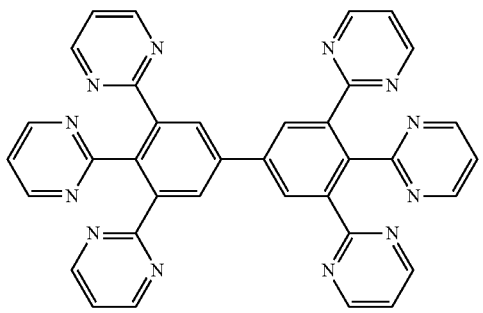

Exemplary Compound 176

Into a 300 ml recovery flask, a THF (200 ml) solution containing 4,4'-Biphenyldiboronic acid dipinacolester (10 g, 0.025 mol), 2-bromopyridine (2.5 eq.), Pd(dba)$_2$ (0.2 eq.), PPh$_3$ (0.4 eq.), and K$_2$CO$_3$ (2 eq.) was added, and refluxed for 10 hours at 80° C. under a nitrogen atmosphere.

Thereafter, after returning to room temperature, the solution was moved to a separatory funnel to carry out an extraction. After the separation into an organic phase and a water phase with the addition of an ethyl acetate a saturated saline, the organic phase was extracted and distilled away under reduced pressure. The obtained solid was purified by silica gel column chromatography to obtain a white solid (9.3 g, yield: 82%) of the exemplary compound 176-1.

Then, the 300 ml recovery flask was subjected to nitrogen substitution five times under reduced pressure. To this flask, a dehydrated and degassed NMP (1-methyl-2-pyrrolidone) (150 ml) solution of the compound 74-1 (7.5 g, 0.024 mol), K$_2$CO$_3$ (12 eq.), PPh$_3$ (0.4 eq.), and [RuCl$_2$(η-C$_6$H$_6$)]$_2$ (0.1 eq.) was added, and stirred at 140° C. under a nitrogen atmosphere.

Subsequently, a dehydrated and degassed NMP (150 ml) solution of 2-bromopyridine (8 eq.) was delivered by drops into the reaction flask over 10 hours, and after the completion of the delivered by drops, stirred at 140° C. for 3 hours.

Thereafter, after returning to room temperature, 600 ml of pure water was added, and the produced precipitation was removed by filtration. The precipitation was dissolved in 350 ml of THF, and then dehydrated with sodium sulfate, and the solution was distilled away under reduced pressure. The obtained solid was purified by silica gel column chromatography to obtain a white solid (3.8 g, yield: 25%) of the exemplary compound 176.

It is to be noted that as for the synthesis method, the compound can be synthesized with reference to the method disclosed in, for example, Oi, S.; Fukita, S.; Hirata, N.; Watanuki, N.; Miyano, S.; Inoue, Y., Org. Lett., 2001, 3, 2579.

[Synthesis of Exemplary Compound 181]

The exemplary compound 181 was synthesized in accordance with the following synthesis formula.

Synthesis of Exemplary Compound 181

[Chemical Formula 71]

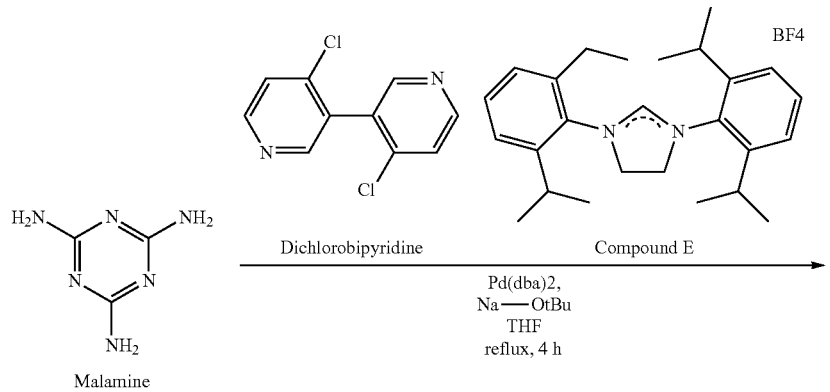

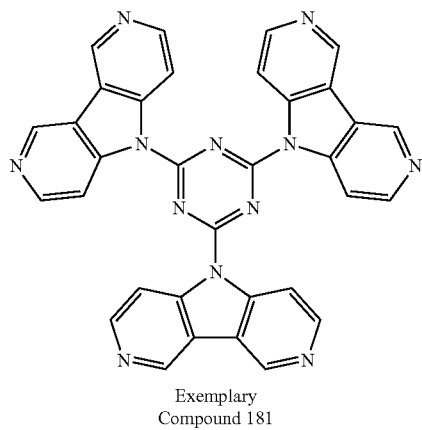

Exemplary Compound 181

Under a nitrogen atmosphere, 2.1 g of Pd(dba)$_2$, 1.7 g of a compound E, and 40 ml of ethylene glycol dimethyl ether were mixed, and stirred at approximately 40° C. for 20 minutes. This mixture was mixed with 27 g (120 mmol) of dichlorobipyridine (synthesized with reference to JP 2008-69123 A), 3.8 g (30 mmol) of melamine, 30 g of disodium-t-butoxide, and 350 ml of ethylene glycol dimethyl ether, and heated and refluxed for 4 hours. After the removal of the insoluble matter, THF extraction and water washing were carried out.

Next, after the solvent was distilled away under reduced pressure, the mixture was dissolved in 60 ml of ethyl acetate, and 130 ml of hexane was gradually added thereto. Precipitated crystals were collected by filtration, then dissolved in a mixture of methanol/THF, and passed through a flash column, and the solvent was removed. After reflux on heating with acetonitrile/methanol, crystals were collected by filtration, and dried to obtain 13 g of the exemplary compound 181 (yield: 74%).

It is to be noted that as for the synthesis method, the compound can be synthesized with reference to the method disclosed in, for example, P 2008-69122 A.

[Synthesis of Exemplary Compound 216]

First, with reference to Adv. Mater., VOL. 19 (2007), p 2010 (published online: Jun. 29, 2007, 2007 WILEY-VCH Verlag GmbH & Co. KGaA, Weinheim), the compound 261-1 was synthesized. The compound 261-1 was 4400 in weight average molecular weight.

Next, the exemplary compound 216 was synthesized in accordance with the following synthesis formula.

[Chemical Formula 72]

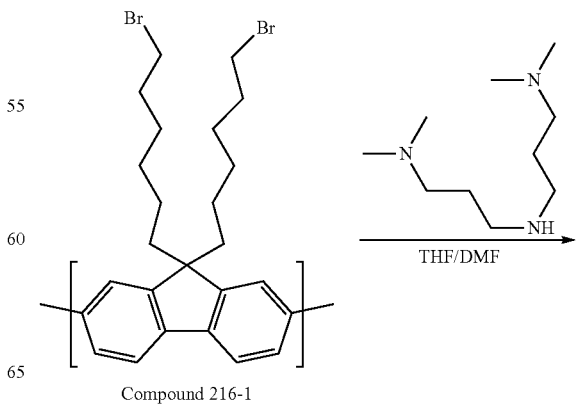

Compound 216-1

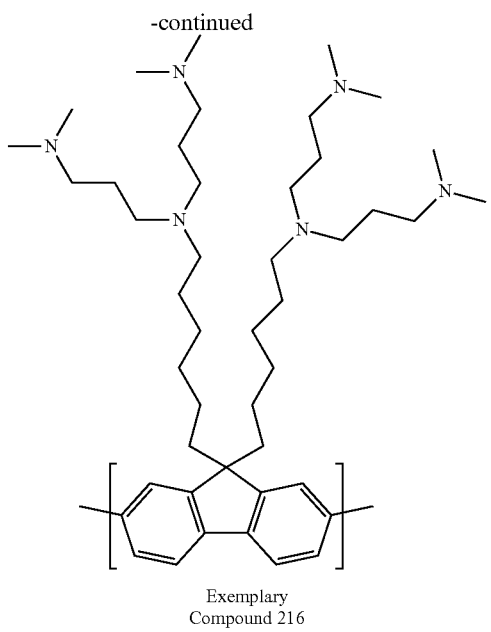

Exemplary
Compound 216

First, a solution was prepared by dissolving the compound 261-1: 1.0 g and 3,3'-iminobis(N,N-dimethylpropylamine) (from Aldrich): 9.0 g in a mixed solvent of 100 ml of tetrahydrofuran and 100 mol of N,N-dimethylformamide. The prepared solution was stirred for 48 hours under room temperature (25° C.) to develop a reaction. After the completion of the reaction, the solvent was distilled away for further reprecipitation in water to obtain 1.3 g (yield: 90%) of the exemplary compound 216.

On the obtained compound, the result of structure identification by H-NMR is shown below: 7.6 to 8.0 ppm (br), 2.88 ppm (br), 2.18 ppm (m), 2.08 ppm (s), 1.50 ppm (m), 1.05 ppm (br). From this result, it has been confirmed that the obtained compound is the exemplary compound 216.

[Synthesis of Exemplary Compound 235]

With reference to Journal of New Materials for Electrochemical Systems, vol. 11, p 213-220 (2008), the following exemplary compound 235 was synthesized.

[Chemical Formula 73]

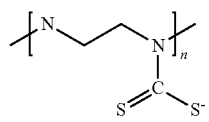

Compound 235

<<Preparation and Evaluation of Transparent Electrode>>

In accordance with the following procedure, transparent electrodes were prepared for each of samples 1 to 35, and evaluations were made on the electrodes. Table 1 below shows layer configurations for each of the samples 1 to 35. With reference to Table 1 below, the preparation and evaluation of the transparent electrodes will be described in order.

<1. Preparation of Substrate>

First, a soda-lime glass substrate was prepared as the substrate. This substrate was subjected to ultrasonic cleaning with CLEANTHROUGH KS3030 from Kao Corporation as a surfactant and ultrapure water, next subjected to ultrasonic cleaning with ultrapure water, then dried by nitrogen blowing, and finally subjected to ultraviolet ozone cleaning.

<2. Formation of Zinc Oxide Layer>

Next, as semi-insulating layer (see FIG. 5) placed in contact with a transparent electrode in a common chalcopyrite-type solar cell, a zinc oxide layer was formed on the substrate. In this example, a zinc oxide layer of 70 nm in film thickness was deposited on the substrate by a sputtering method with the use of a target of zinc oxide (ZnO).

<3. Formation of Transparent Electrode>

Thereafter, for each of the samples 1 to 35, a transparent electrode was formed on the zinc oxide layer in the following way.

[Formation of Transparent Electrode in Sample 1]

The transparent electrode of silver (Ag) and an ITO laminated in this order was formed on the substrate with the zinc oxide layer formed thereon. In this case, the substrate with the zinc oxide layer formed thereon was set in a vacuum treatment chamber, the pressure in the vacuum treatment chamber was reduced down to $10^{-3}$ Pa or less, a silver (Ag) layer of 5 nm in film thickness was then deposited by a vapor deposition method at a deposition rate of 2 nm/sec, and thereafter, an ITO layer of 150 nm in film thickness was deposited by a sputtering method at a deposition rate of 2 nm/sec.

[Formation of Transparent Electrode in Sample 2]

On the substrate with the zinc oxide formed thereon, a transparent electrode of aluminum-added zinc oxide (AZO) and of 500 nm in film thickness was formed by the same sputtering method as for the sample 1.

[Formation of Transparent Electrode in Sample 3]

On the substrate with the zinc oxide layer formed thereon, a transparent electrode of silver (Ag) was formed. In this case, the substrate with the zinc oxide formed thereon was set in a vacuum treatment chamber, the pressure in the vacuum treatment chamber was reduced down to $10^{-3}$ Pa or less, and an Ag layer of 8 nm in film thickness was then formed at a vapor deposition rate of 2 nm/sec.

[Formation of Transparent Electrodes in Sample 4 to 27 and 31 to 53]

For each of the samples 4 to 27 and 31 to 53, on the substrate with the zinc oxide layer formed thereon, a nitrogen-containing layer of each exemplary compound shown in Table 1 below and of 3 nm in film thickness was formed by a vapor deposition method. Then, on each nitrogen-containing layer, an electrode layer of each material shown in Table 1 below with each film thickness was formed by the same vapor deposition method as for the sample 3. It is to be noted that Table 1 below also shows the number of effective unshared electron pairs [n], molecular weight [M], and effective unshared electron pair content ratio [n/M] for the exemplary compounds used in this case.

[Formation of Transparent Electrodes in Sample 28 to 30]

For each of the samples 28 to 30, on the substrate with the zinc oxide formed thereon, a nitrogen-containing layer of each exemplary compound shown in Table 1 below and of 3 nm in film thickness was formed by a coating method. In this regard, a mixed solvent of hexafluoroisopropanol:n-butanol=1: 1 was used for the coating solvent to provide a coating so that the dried film thickness was 3 nm. Then, on each nitrogen-containing layer, an electrode layer of each material shown in Table 1 below with each film thickness was formed by the same vapor deposition method as for the sample 3.

<4. Evaluation on Conductivity of Transparent Electrode>

For each transparent electrode of the samples 1 to 35 prepared above, the sheet resistance value was measured. The sheet resistance value was measured in a constant current application way in a four-terminal four-probe method with the use of a resistivity meter (MCP-T610 from Mitsubishi Chemical Corporation). This result is shown together in Table 1 below.

<5. Formation of High Refractive Index Layer>

[Formation of High Refractive Index Layer in Samples 31 to 35]

After making the evaluations on the conductivity, for the samples 31 to 35, a high refractive index layer of each material shown in Table 1 below was formed on the top of the transparent electrode. In this case, the substrate with the transparent electrode formed was set in a vacuum treatment chamber, the pressure in the vacuum treatment chamber was reduced down to $10^{-3}$ Pa or less, and each high refractive index layer was then deposited by a sputtering method at a deposition rate of 2 nm/sec. It is to be noted that Table 1 below shows together the refractive indexes for each high refractive index layer.

<6. Formation of Antireflective Layer>

[Formation of Antireflective Layer in Samples 34 and 35] For the samples 34 and 35, an antireflective layer of each material shown in Table 1 below was formed on the top of the high refractive index layer. In this case, following the formation of the high refractive index layer, each antireflective layer was deposited by a sputtering method at a deposition rate of 2 nm/sec. It is to be noted that Table 1 below shows together the refractive indexes for each antireflective layer.

<7. Evaluation on Light Transmission of Transparent Electrode>

For each transparent electrode of the samples 1 to 30, and each transparent electrode of the samples 31 to 35 with the high refractive index layer and/or antireflective layer formed, the light transmission was measured for a wavelength of 1100 nm near absorption end of a chalcopyrite-type solar cell. The light transmission was measured with, as a base line, the soda lime glass substrate used for each of the samples 1 to 35, with the use of a spectrophotometer (U-3300 from Hitachi, Ltd.). This result is shown together in Table 1 below.

<<Preparation and Evaluation of Solar Cell>>

In accordance with the following procedure, respective solar cells with the respective transparent electrodes of the samples 1 to 35 were prepared (see FIG. 5), and evaluations of the cells were made.

<1. Preparation of Substrate>

First, a polyimide film (from Du Pont, Kapton PV9202: Trade Name) was prepared as the substrate 11. This substrate 11 was subjected to ultrasonic cleaning with CLEAN-THROUGH KS3030 from Kao Corporation as a surfactant and ultrapure water, next subjected to ultrasonic cleaning with ultrapure water, then dried by nitrogen blowing, and finally subjected to ultraviolet ozone cleaning.

<2. Deposition of Respective Layers for Solar Cell>

The silicate layer 13 was deposited on the cleaned substrate 11. In this regard, the silicate layer 13 of 200 nm in film thickness was deposited by radio-frequency (RF) magnetron sputtering method with the use of a target of soda lime glass.

Then, the rear electrode 15 was deposited on the silicate layer 13. In this regard, the rear electrode 15 of 800 nm in film thickness was deposited on the silicate layer 13 by a sputtering method with the use of a target of molybdenum (Mo).

Then, the photoelectric conversion layer 17 was deposited on the rear electrode 15. In this regard, the chalcopyrite-type (CIS-type) photoelectric conversion layer 17 of 1 μm in film thickness was deposited on the rear electrode 15 by a multi-vapor deposition method through a three-stage approach with Cu, In, Ga, and Se as independent vapor deposition sources.

Then, the buffer layer 19 was formed on the photoelectric conversion layer 17. In this regard, the buffer layer 19 of CdS of 50 nm in film thickness was deposited on the chalcopyrite-type (CIS-type) photoelectric conversion layer 17 by a chemical deposition method (CBD method).

Then, the semi-insulating layer 21 was deposited on the buffer layer 19. In this regard, the semi-insulating layer 21 of zinc oxide (ZnO) of 70 nm in film thickness was deposited on the buffer layer 19 by a sputtering method with the use of a target of zinc oxide (ZnO).

Subsequently, for each of the samples 1 to 32, the transparent electrode 1 was formed in the same way as in the formation of the transparent electrode as described above. Furthermore, for the samples 28 to 32, the high refractive index layer 7 was formed, and for the samples 31 and 32, the antireflective layer 9 was formed. Thus, the solar cell 10a was formed for the samples 1 to 35.

<3. Sealing for Solar Cell>

After forming the solar cell 10a in the way described above, the substrate with the solar cell 10a formed was further transferred into a glove box, the substrate 11 with the solar cell 10a provided was sandwiched between the following two transparent barrier films the glove box, and the space between the transparent barrier films was filled with the following UV curable resin to achieve sealing.

Transparent Barrier Films: from 3M, Ultra Barrier Solar Film UBL-9L (Trade Name)

(Water Vapor Transmission Rate $<5\times10^{-4}$ g/m$^2$/d)

UV Curable Resin: from Nagase ChemteX Corporation, UV RESIN XNR5570-B1 (Trade Name)

Thus, the sealed solar cells were obtained with a light-receiving surface of approximately 5×5 mm.

<4. Evaluation on Photoelectric Conversion Efficiency of Solar Cell>

On the light-receiving surface of the sealed solar cell 10a on the transparent electrode 1 side, a mask was placed which was provided with a light-receiving opening of 4 mm$^2$ in effective area, from above this mask, light irradiation of 100 mW/cm$^2$ in intensity was performed from a solar simulator (AM1.5G filter), the short-circuit current density Jsc [mA/cm$^2$], the open voltage Voc [V], and the fill factor (fill factor) FF were measured in this regard. These measurements were performed at each of four points by shifting the light-receiving opening at the light-receiving surface, and the average value for the four points was obtained for each of the measurements.

From the obtained average values of the short-circuit current density Jsc, open voltage Voc, and fill factor FF, the photoelectric conversion efficiency η (%) was obtained in accordance with the following formula (1). In this regard, the increased figure of the photoelectric conversion efficiency η (%) indicates that the energy conversion efficiency (photoelectric conversion efficiency) is favorable. The obtained results are shown together in Table 1 below.

[Mathematical Formula 1]

Incident Light Intensity                    Formula (1)

<5. Evaluation on Durability of Solar Cell>

The solar cell 10a evaluated for the photoelectric conversion efficiency was repeatedly wound around and rewound 100 times from a glass rod of 1.0 cmΦ in diameter. Thereafter, the photoelectric conversion efficiency η (%) of the solar battery was obtained in the same way as in the evaluation of the photoelectric conversion efficiency. Then, the relative efficiency of the photoelectric conversion efficiency was calculated to obtain the average value in accordance with the following formula (2), and the durability was evaluated on the basis of the following criteria. This result is shown together in Table 1 below.

[Mathematical Formula 2]

$$\text{Relative Efficiency (\%)} = [(\text{Photoelectric Conversion Efficiency after Winding})/(\text{Photoelectric Conversion Efficiency before Winding})] \times 100 \quad \text{Formula (2)}$$

○+: Relative Efficiency of 90% or more
○: Relative Efficiency of 80% or more
Δ: Relative Efficiency of 60% or more
X: Relative Efficiency less than 60%

TABLE 1

| Transparent Conductive Film/Solar Cell (Sample No.) | Transparent Electrode | | | | | | | | | | | Characteristics of Transparent Electrode | | | Characteristics of Solar Cell | | Remarks |
|---|---|---|---|---|---|---|---|---|---|---|---|---|---|---|---|---|---|
| | Nitrogen-Containing Layer (Film Thickness 3 nm) | | | | Electrode Layer (containing Metal) | | High Refractive Index Layer | | Antireflective Layer | | | | | | | | |
| | Material | Number of Effective Unshared Electron Pairs [n] | Molecular Weight [M] | [n/M] | Material | Film Thickness | Material | Refractive Index | Material | Refractive Index | Light Transmission (1000 nm) | Sheet Resistance [Ω/sq.] | | Photoelectric Conversion Efficiency | Bending Resistance | |
| 1 | — | — | — | — | Ag/ITO | 5 nm/150 nm | — | — | — | — | 60% | 8 | | 12.7 % | x | Comparative Example |
| 2 | — | — | — | — | AZO | 500 nm | — | — | — | — | 55% | 5 | | 12.2% | x | Comparative Example |
| 3 | — | — | — | — | Ag | 8 nm | — | — | — | — | 33% | >10000 | | 0.0% | x | Comparative Example |
| 4 | Exemplary Compound 13 | 4 | 717 | 5.6E-03 | Ag | 2 nm | — | — | — | — | 83% | 30 | | 9.8% | Δ | Example |
| 5 | Exemplary Compound 13 | 4 | 717 | 5.6E-03 | | 4 nm | — | — | — | — | 83% | 20 | | 11.2% | ○ | Example |
| 6 | | | | | | 8 nm | — | — | — | — | 80% | 7 | | 12.7% | ○ | Example |
| 7 | | | | | | 15 nm | — | — | — | — | 75% | 5 | | 12.4% | ○ | Example |
| 8 | | | | | | 30 nm | — | — | — | — | 56% | 3 | | 10.2% | ○ | Example |
| 9 | Exemplary Compound 13 | 4 | 717 | 5.6E-03 | Au | 8 nm | — | — | — | — | 74% | 8 | | 12.3% | ○ | Example |
| 10 | | | | | Cu | | — | — | — | — | 70% | 9 | | 12.1% | ○ | Example |
| 11 | Exemplary Compound 1 | 2 | 410 | 4.9E-03 | Ag | 8 nm | — | — | — | — | 70% | 20 | | 12.2% | ○ | Example |
| 12 | Exemplary Compound 10 | 4 | 517 | 7.7E-03 | | | — | — | — | — | 73% | 14 | | 12.1% | ○ | Example |
| 13 | Exemplary Compound 18 | 4 | 807 | 5.0E-03 | | | — | — | — | — | 73% | 18 | | 12.4% | ○ | Example |
| 14 | Exemplary Compound 20 | 5 | 718 | 7.0E-03 | | | — | — | — | — | 78% | 8 | | 12.5% | ○ | Example |
| 15 | Exemplary Compound 37 | 6 | 1036 | 5.8E-03 | | | — | — | — | — | 74% | 16 | | 10.4% | ○ | Example |
| 16 | Exemplary Compound 38 | 4 | 552 | 7.2E-03 | | | — | — | — | — | 73% | 15 | | 10.99% | ○ | Example |
| 17 | Exemplary Compound 39 | 5 | 540 | 9.3E-03 | | | — | — | — | — | 75% | 14 | | 11.1% | ○ | Example |
| 18 | Exemplary Compound 40 | 6 | 647 | 9.3E-03 | | | — | — | — | — | 77% | 13 | | 10.6% | ○ | Example |
| 19 | Exemplary Compound 41 | 4 | 412 | 9.7E-03 | | | — | — | — | — | 75% | 13 | | 11.6% | ○ | Example |
| 20 | Exemplary Compound 42 | 6 | 617 | 9.7E-03 | | | — | — | — | — | 78% | 12 | | 11.8% | ○ | Example |
| 21 | Exemplary Compound 43 | 5 | 464 | 1.1E-02 | | | — | — | — | — | 72% | 11 | | 11.0% | ○ | Example |
| 22 | Exemplary Compound 44 | 6 | 541 | 1.1E-02 | | | — | — | — | — | 77% | 10 | | 11.2% | ○ | Example |
| 23 | Exemplary Compound 45 | 9 | 544 | 1.7E-02 | | | — | — | — | — | 79% | 9 | | 12.2% | ○ | Example |

TABLE 1-continued

| Transparent Conductive Film/Solar Cell (Sample No.) | Transparent Electrode | | | | | | | | | | Characteristics of Transparent Electrode | | Characteristics of Solar Cell | | Remarks |
|---|---|---|---|---|---|---|---|---|---|---|---|---|---|---|---|
| | Nitrogen-Containing Layer (Film Thickness 3 nm) | | | | Electrode Layer (containing Metal) | | High Refractive Index Layer | | Antireflective Layer | | Light Transmission (1000 nm) | Sheet Resistance [Ω/sq.] | Photoelectric Conversion Efficiency | Bending Resistance | |
| | Material | Number of Effective Unshared Electron Pairs [n] | Molecular Weight [M] | [n/M] | Material | Film Thickness | Material | Refractive Index | Material | Refractive Index | | | | | |
| 24 | Exemplary Compound 46 | 6 | 312 | 1.9E−02 | | | — | — | — | — | 78% | 8 | 12.1% | ○ | Example |
| 25 | Exemplary Compound 170 | 6 | 580 | 1.0E−02 | | | — | — | — | — | 74% | 7 | 12.0% | ○ | Example |
| 26 | Exemplary Compound 176 | 12 | 623 | 1.9E−02 | | | — | — | — | — | 80% | 6 | 12.2% | ○ | Example |
| 27 | Exemplary Compound 181 | 9 | 583 | 1.5E−02 | | | — | — | — | — | 76% | 7 | 11.8% | ○ | Example |
| 28 | Exemplary Compound 201 | 2 | (408) n | 4.9E−03 | Ag | 8 nm | — | — | — | — | 70% | 18 | 10.5% | ○ | Example |
| 29 | Exemplary Compound 216 | 6 | (703) n | 8.5E−03 | | | — | — | — | — | 78% | 9 | 12.0% | ○ | Example |
| 30 | Exemplary Compound 235 | 2 | (168) n | 1.2E−02 | | | — | — | — | — | 79% | 10 | 12.1% | ○ | Example |
| 31 | Exemplary Compound 13 | 4 | 717 | 5.6E−03 | Ag | 8 nm | ZnO | 1.9– | — | — | 81% | 7 | 12.6% | ○ | Example |
| 32 | | | | | | | TiO₂ | 2.1 | — | — | 83% | 7 | 12.7% | ○ | Example |
| 33 | | | | | | | ZnS | 2.4 | — | — | 80% | 7 | 12.6% | ○ | Example |
| 34 | Exemplary Compound 13 | 4 | 717 | 5.6E−03 | Ag | 8 nm | TiO₂ | 2.1 | SiO₂ | 1.45 | 86% | 7 | 12.9% | ○ | Example |
| 35 | | | | | | | | | MgF₂ | 1.38 | 88% | 7 | 13.0% | ○ | Example |

<<Evaluation Result>>

As is clear from Table 1, the transparent electrodes of the samples 4 to 35, that is, the transparent electrodes provided by laminating the nitrogen-containing layer and the electrode layer composed with the use of silver as a metal element of the Group 11 of the periodic table have a sheet resistance value of 30Ω/square or less even while the electrode layer in charge of substantial conductivity is an ultrathin film of 2 to 30 nm, as compared with the other transparent electrodes, it has been confirmed that the electrode layer is formed with an almost uniform film thickness by film growth of single-layer growth type (Frank-van der Merwe: FW type). In addition, the transparent electrodes of the samples 4 to 35 also have a light transmission of 50% or more, and it is determined that the transparent electrodes have a combination of excellent light-transmitting property and conductivity as a transparent electrode.

In particular, among the samples 4 to 35, the transparent electrodes of the samples 5 to 35 with the electrode layer of 4 nm or more in film thickness have achieved high conductivity with a sheet resistance of 20Ω/square. Furthermore, among the samples 4 to 32, the transparent electrodes of the samples 4 to 7 and samples 9 to 35 with the electrode layer of 15 nm in film thickness have achieved high light transmissions with a light transmission of 70% or more. From the foregoing, it is determined that the transparent electrodes (samples 5 to 7 and samples 9 to 35) obtained by providing, next to the nitrogen-containing layer, the electrode layer containing a metal element of the Group 11 of the periodic table with a thickness of 4 nm or more and 15 nm or less have a combination of particularly high light transmission and conductivity.

When the transparent electrodes are compared between the sample 6 and the samples 11 to 30 which differ only in the material constituting the nitrogen-containing layer, it is determined that the use of the compound with more nitrogen atoms with respect to the molecular weight as the material constituting the nitrogen-containing layer results in more favorable light-transmission and conductivity. From the foregoing, further improvements in light transmission and conductivity are expected by appropriately selecting the nitrogen-containing compound constituting the nitrogen-containing layer, and it is also expected that the electrode layers will be reduced in film thickness down to 2 nm or less.

Moreover, when the transparent electrodes are compared between the sample 6 and the samples 31 to 33 which differ only in high refractive index layer, the transparent electrodes of the samples 31 to 33 provided with the high refractive index layer have achieved light transmissions equal to or higher than that of the transparent electrode of the sample 6 with no high refractive index layer provided. Thus, the effect of improvement in light transmission has been confirmed by providing the high-refractive index layer to be laminated onto the transparent electrode obtained by providing, next to the nitrogen-containing layer, the electrode layer composed with the use of silver as a metal element of the Group 11 of the periodic table.

Moreover, when the samples 34 and 35 with the antireflective layer further provided are compared with the samples 6 and 32, it has been confirmed that the light transmission is further improved by providing the antireflective layer in addition to the high refractive index layer.

In addition, as is clear from Table 1, it has been confirmed that the solar cells of the samples 5 to 7 and samples 9 to 35, that is, the solar cells using the transparent electrodes obtained by providing, next to the nitrogen-containing layer, the electrode layer containing a metal element of the Group 11 of the periodic table with a film thickness of 4 nm or more and 15 nm or less have a photoelectric conversion efficiency of 10% or more, and moreover, achieve resistance to bending and folding.

From the foregoing, it has been confirmed that the application of the present invention makes it possible to achieve solar cells which have sufficient resistance to bending, and thus have flexible flexibility.

Moreover, the transparent electrodes of the samples 4 to 35, that is, the transparent electrode 1 with the nitrogen-containing layer composed with the use of the exemplary compound with an effective unshared electron pair content [n/M] in the predetermined range of $4.0 \times 10^{-3} \leq [n/M]$ has a small sheet resistance value of 30Ω/square or less, even while the electrode layer using silver in charge of substantial conductivity is an ultrathin film of 2 nm to 30 nm. Thus, it has been confirmed that the electrode layer is formed with an almost uniform film thickness by film growth of single-layer growth type (Frank-van der Merwe: FW type) on the nitrogen-containing layer.

Further, FIG. 7 shows a graph of plotting the effective unshared electron pair content ratio [n/M] of the compound constituting the nitrogen-containing layer vs. the sheet resistance value measured for each transparent electrode, with respect to the transparent electrodes obtained by providing the electrode layer of silver (Ag) of 6 nm in film thickness on the top of the nitrogen-containing layer obtained with the use of the exemplary compound in which the effective unshared electron pair content ratio [n/M] takes each value.

From the graph in FIG. 7, the sheet resistance of the transparent electrode has a tendency to be decreased as the value of the effective unshared electron pair content ratio [n/M] is increased in the range of the effective unshared electron pair content ratio [n/M] which meets $4.0 \times 10^{-3} \leq [n/M]$. Further, it has been confirmed that the effect of dramatically lowering the sheet resistance of the transparent electrode is achieved in the range of the effective unshared electron pair content ratio $[n/M] \geq 4.0 \times 10^{-3}$.

Likewise, the results just described above were also obtained, even then the nitrogen-containing layer is formed by coating deposition.

From the foregoing, it has been confirmed that the selection and use of the compound constituting the nitrogen-containing layer provided next to the electrode layer with the effective unshared electron pair content ratio [n/M] as an index achieves a low-resistance electrode film (that is, a transparent electrode), even while the electrode film is a thin film in order to achieve a light-transmitting property.

Example 2

The bifacial solar cell described with reference to FIG. 6 as prepared in the following way.

First, as the substrate 11, a soda lime glass substrate was prepared, and cleaned. On this substrate, a high refractive index layer of titanium oxide of 30 nm in film thickness was formed. Furthermore, the transparent electrode 1 of the nitrogen-containing layer 3 and electrode layer 5 laminated was formed as the rear electrode 15 for an anode by forming the nitrogen-containing layer 3 of the exemplary compound of 3 nm in film thickness, and on the top thereof, forming the electrode layer 5 of silver (Ag) of 8 nm in film thickness. It is to be noted that the respective layers were formed in the same way as in Example 1.

Then, the photoelectric conversion layer 17 was deposited on the transparent electrode 1 (rear electrode 15). In this regard, the chalcopyrite-type (CIS-type) photoelectric conversion layer 17 of 1 μm in film thickness was deposited by a multi-vapor deposition method through a three-stage approach with Cu, In, Ga, and Se as independent vapor deposition sources. It is to be noted that the composition of the photoelectric conversion layer 17 formed was Ga/(In+Ga)=0.30 to 0.33 and Cu/(In+Ga)=0.90 to 0.95.

Then, the buffer layer 19 was deposited on the photoelectric conversion layer 17. In this regard, the buffer layer 19 of CdS of 50 nm in film thickness was deposited on the chalcopyrite-type (CIS-type) photoelectric conversion layer 17 by a chemical deposition method (CBD method).

Then, the semi-insulating layer 21 was deposited on the buffer layer 19. In this regard, the semi-insulating layer 21 of zinc oxide (ZnO) of 70 nm in film thickness was deposited on the buffer layer 19 by a sputtering method with the use of a target of zinc oxide (ZnO).

Then, the transparent electrode 1 of the nitrogen-containing layer 3 and electrode layer 5 laminated was formed as a cathode by forming the nitrogen-containing layer 3 of the exemplary compound 13 of 3 nm in film thickness, and on the top thereof, forming the electrode layer 5 of silver (Ag) of 8 nm in film thickness. Further, a titanium oxide of 30 nm in film thickness was formed as the high refractive index layer 7. Thus, the bifacial solar cell 10b was formed.

It is to be noted that it has been confirmed that this solar cell 10b is a bifacial solar cell with a high efficiency, which achieves a photoelectric conversion efficiency of 10.3% in the case of light incidence from the high refractive index layer 7, and achieves a photoelectric conversion efficiency of 7.7% in the case of light incidence from the substrate 11. More specifically, it has been successfully confirmed that the transparent electrode according to the present invention can be used even for any of the anode and cathode.

REFERENCE SIGNS LIST 1, 1-1, 1-2, 1-3 . . . transparent electrode, 3 . . . nitrogen-containing layer, 5 . . . electrode layer, 7 . . . high refractive index layer, 9 . . . antireflective layer, 10a, 10b . . . solar cell, 15 . . . rear electrode, 17 . . . photoelectric conversion layer

The invention claimed is:

1. A solar cell comprising:
a pair of electrodes; and
a photoelectric conversion layer of chalcopyrite structure sandwiched between the pair of electrodes, wherein at least one of the pair of electrodes, adapted to serve as a transparent electrode, comprises a nitrogen-containing layer including an organic compound containing a nitrogen atom, and a metal layer containing a metal of Group 11 of the periodic table, the metal layer laminated on the nitrogen-containing layer.

2. The solar cell according to claim 1, wherein the organic compound containing a nitrogen atom is an organic low molecular weight compound represented by the following general formula (1), a high molecular weight compound having a structural unit represented by the following general formula (2), or a high molecular weight compound having a structural unit represented by the following general formula (3):

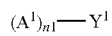
General Formula (1)

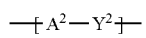
General Formula (2)

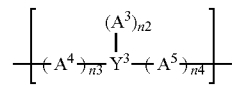
General Formula (3)

wherein, in the general formula (1), $A^1$ represents a monovalent nitrogen atom-containing group, n1 represents an integer of 2 or more, and $Y^1$ represents an n1-valent organic group or single bond (—), in the general formula (2), $A^2$ represents a divalent nitrogen atom-containing group, and $Y^2$ represents a divalent organic group or a single bond, and in the general formula (3), $A^3$ represents a monovalent nitrogen atom-containing group, $A^4$ and $A^5$ each independently represent a divalent nitrogen atom-containing group, n2 represents an integer of 1 or more, n3 and n4 each independently represent an integer of 0 or 1, and $Y^3$ represents an (n2+2)-valent organic group.

3. The solar cell according to claim 2, wherein any of $A^1$ in the general formula (1), $A^2$ in the general formula (2), and $A^3$ to $A^5$ in the general formula (3) contains a pyridine ring-containing group.

4. The solar cell according to claim 2, wherein $Y^1$ in the general formula (1), $Y^2$ in the general formula (2) and $Y^3$ in the general formula (3) contain a group derived from a structure represented by the following general formula (4):

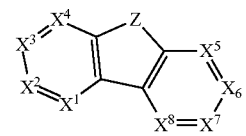
General Formula (4)

wherein, in the general formula (4),
Z represents —$CR^1R^2$—, —$NR^3$—, —O—, —S—, or $SiR^4R^5$,
$X^1$ to $X^8$ each independently represent —$CR^6$= or —N=, and
$R^1$ to $R^6$ each independently represent a single bond (—), a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 1 to 30 carbon atoms, or a substituted or unsubstituted alkyloxy group having 1 to 20 carbon atoms.

5. The solar cell according to claim 4, wherein at least one of $X^1$ to $X^8$ in the general formula (4) contains a group having a nitrogen atom.

6. The solar cell according to claim 5, wherein the metal layer contains silver as its most prevalent constituent.

7. The solar cell according to claim 6, wherein the metal layer is 4 nm or more and 15 nm or less in film thickness.

8. The solar cell according to claim 7, further comprising a high refractive index layer that is higher in refractive index than the nitrogen-containing layer.

9. The solar cell according to claim 8, wherein the high refractive index layer is composed of a titanium oxide.

10. The solar cell according to claim 8, wherein an antireflective layer with a refractive index of 1.5 or less is laminated on the high refractive index layer.

11. The solar cell according to claim 10, wherein the antireflective layer is composed of a magnesium fluoride.

12. The solar cell according to claim 2, wherein $Y^1$ in the general formula (1), $Y^2$ in the general formula (2) and $Y^3$ in the general formula (3) contain a group derived from a structure represented by the following general formula (4):

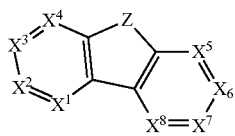

General Formula (4)

wherein, in the general formula (4),

Z represents —$CR^1R^2$—, —$NR^3$—, —O—, —S—, or —$SiR^4R^5$, $X^1$ to $X^8$ each independently represent —$CR^6$= or —N=, and $R^1$ to $R^6$ each independently represent a single bond (—), a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted heteroaryl group having 1 to 30 carbon atoms, or a substituted or unsubstituted alkyloxy group having 1 to 20 carbon atoms.

13. The solar cell according to claim 12, wherein at least one of $X^1$ to $X^8$ in the general formula (4) contains a group having a nitrogen atom.

14. The solar cell according to claim 1, wherein the metal layer contains silver as its most prevalent constituent.

15. The solar cell according to claim 14, wherein the organic compound containing the nitrogen atom is a compound in which an effective unshared electron pair content [n/M] meets $4.0 \times 10^{-3} \leq [n/M] \leq 4.0 \times 10^{-2}$ when n denotes the number of unshared electron pairs that are not involved in aromaticity or not coordinated to the metal among unshared electron pairs of nitrogen atoms, whereas M denotes a molecular weight.

16. The solar cell according to claim 14, further comprising a high refractive index layer that is higher in refractive index than the nitrogen-containing layer.

17. The solar cell according to claim 1, wherein the metal layer is 4 nm or more and 15 nm or less in film thickness.

18. The solar cell according to claim 1, further comprising a high refractive index layer that is higher in refractive index than the nitrogen-containing layer.

19. The solar cell according to claim 1, wherein the organic compound containing the nitrogen atom is a compound in which an effective unshared electron pair content [n/M] meets $4.0 \times 10^{-3} \leq [n/M] \leq 4.0 \times 10^{-2}$ when n denotes the number of unshared electron pairs that are not involved in aromaticity or not coordinated to the metal among unshared electron pairs of nitrogen atoms, whereas M denotes a molecular weight.

* * * * *